US009685442B2

(12) United States Patent
Fujita et al.

(10) Patent No.: US 9,685,442 B2
(45) Date of Patent: Jun. 20, 2017

(54) SEMICONDUCTOR DEVICE AND METHOD OF MANUFACTURING THE SAME

(71) Applicant: FUJITSU SEMICONDUCTOR LIMITED, Yokohama-shi, Kanagawa (JP)

(72) Inventors: Kazushi Fujita, Kuwana (JP); Taiji Ema, Inabe (JP); Makoto Yasuda, Kuwana (JP); Mitsuaki Hori, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/885,308

(22) Filed: Oct. 16, 2015

(65) Prior Publication Data

US 2016/0148932 A1    May 26, 2016

(30) Foreign Application Priority Data

Nov. 21, 2014  (JP) .................... 2014-236883

(51) Int. Cl.
*H01L 27/085* (2006.01)
*H01L 27/092* (2006.01)
(Continued)

(52) U.S. Cl.
CPC .. *H01L 27/0921* (2013.01); *H01L 21/823892* (2013.01); *H01L 27/0928* (2013.01);
(Continued)

(58) Field of Classification Search
CPC ............. H01L 29/872; H01L 27/0629; H01L 27/0921; H01L 21/823892; H01L 27/0928;
(Continued)

(56) References Cited

U.S. PATENT DOCUMENTS 6,175,143 B1    1/2001  Fujihira et al.
6,221,688 B1    4/2001  Fujihira et al.
(Continued)

FOREIGN PATENT DOCUMENTS

| JP | 62-179142 A | 8/1987 |
| JP | 10-335679 A | 12/1998 |
| JP | 2001-168352 A | 6/2001 |
| JP | 2009-64977 A | 3/2009 |
| JP | 2009-238982 A | 10/2009 |

(Continued)

*Primary Examiner* — Trung Q Dang
*Assistant Examiner* — Patricia Reddington
(74) *Attorney, Agent, or Firm* — Westerman, Hattori, Daniels & Adrian, LLP

(57) ABSTRACT

A semiconductor device including an insulating film in a first region of a semiconductor substrate; a first impurity region and a second impurity region of a first conductivity type, each of the regions including a part located deeper than the insulating film in contact with each other, and the insulating film being sandwiched by the first and second impurity regions in planar view in the first region of the semiconductor substrate; a metal silicide film on the first impurity region and in Schottky junction with the first impurity region; a first impurity of the first impurity region having a peak of a concentration profile deeper than a bottom of the insulating film; a second impurity of the second impurity region having a concentration higher than a concentration of the first impurity in a part of the first impurity region shallower than the bottom of the insulating film.

16 Claims, 40 Drawing Sheets

(51) Int. Cl.

| | | |
|---|---|---|
| *H01L 29/66* | (2006.01) | |
| *H01L 29/872* | (2006.01) | |
| *H01L 21/8238* | (2006.01) | |
| *H01L 29/36* | (2006.01) | |
| *H01L 29/78* | (2006.01) | |
| *H01L 29/861* | (2006.01) | |
| *H01L 29/06* | (2006.01) | |

(52) U.S. Cl.
CPC ...... *H01L 29/0619* (2013.01); *H01L 29/0649* (2013.01); *H01L 29/36* (2013.01); *H01L 29/66136* (2013.01); *H01L 29/66143* (2013.01); *H01L 29/78* (2013.01); *H01L 29/8613* (2013.01); *H01L 29/872* (2013.01); *H01L 29/8725* (2013.01)

(58) Field of Classification Search
CPC . H01L 29/0619; H01L 29/0649; H01L 29/36; H01L 29/66136; H01L 29/66143; H01L 29/78; H01L 29/8613; H01L 29/8725
USPC ....................................................... 257/372
See application file for complete search history.

(56) References Cited

U.S. PATENT DOCUMENTS

| | | | |
|---|---|---|---|
| 2001/0017393 A1 | 8/2001 | Fujihira et al. | |
| 2001/0035560 A1 | 11/2001 | Fujihira et al. | |
| 2003/0030120 A1 | 2/2003 | Fujihira et al. | |
| 2005/0151219 A1 | 7/2005 | Fujihira et al. | |
| 2005/0179105 A1 | 8/2005 | Fujihira et al. | |
| 2006/0244006 A1 | 11/2006 | Fujihira et al. | |
| 2009/0065888 A1* | 3/2009 | Kato | ............ H01L 27/0629 257/476 |
| 2009/0243027 A1 | 10/2009 | Kato et al. | |
| 2012/0187520 A1 | 7/2012 | Kato et al. | |
| 2012/0212164 A1 | 8/2012 | Terakawa et al. | |
| 2012/0326262 A1 | 12/2012 | Kato et al. | |
| 2014/0061847 A1 | 3/2014 | Kato et al. | |
| 2015/0021732 A1 | 1/2015 | Kanai et al. | |
| 2016/0079234 A1 | 3/2016 | Kanai et al. | |

FOREIGN PATENT DOCUMENTS

| | | |
|---|---|---|
| JP | 2012-174878 A | 9/2012 |
| JP | 2015-023177 A | 2/2015 |

* cited by examiner

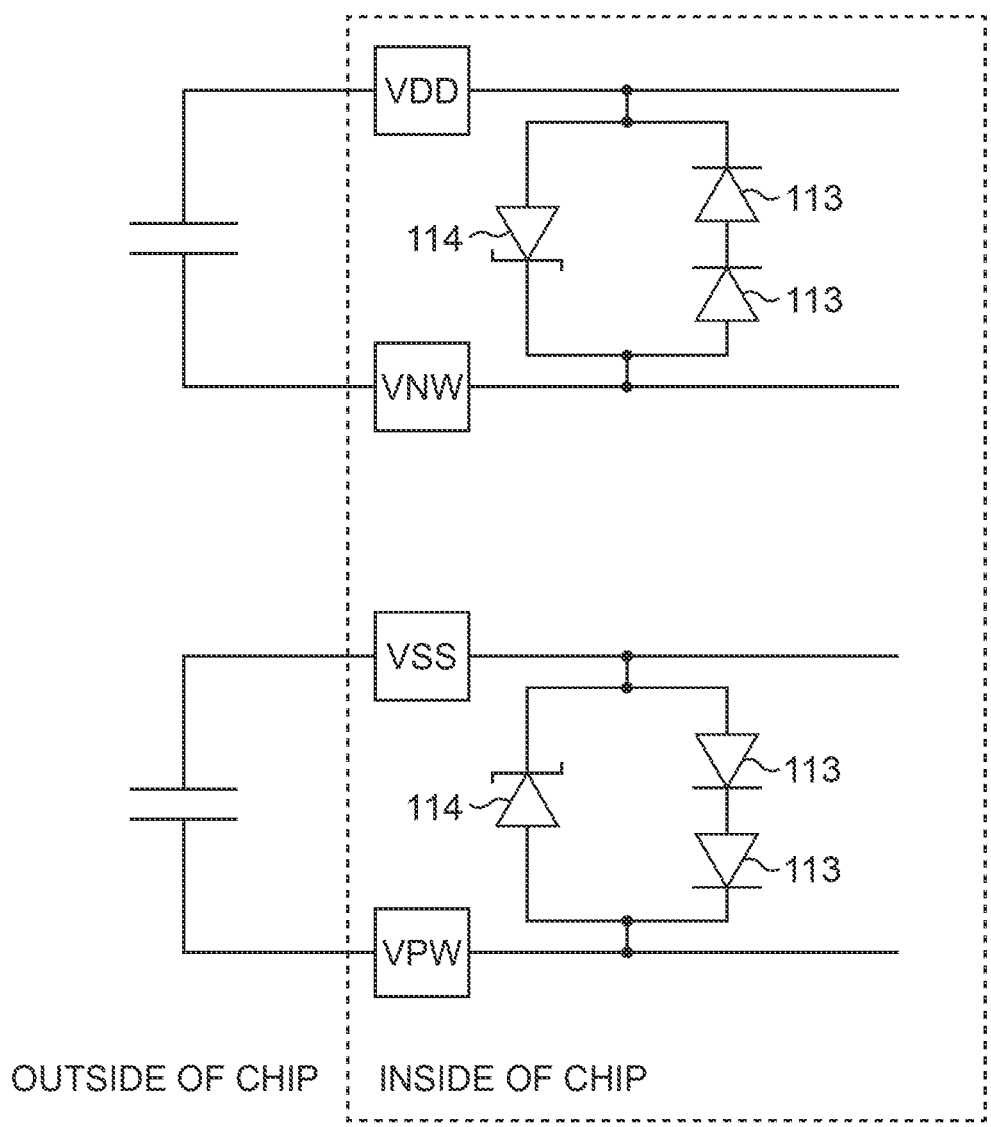

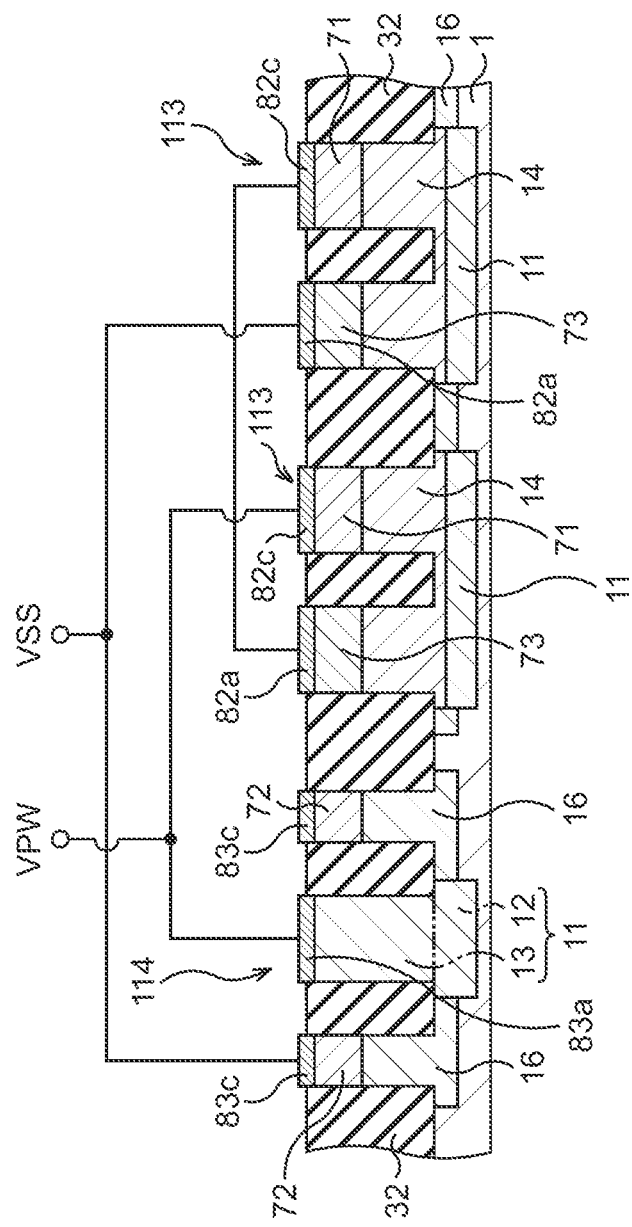

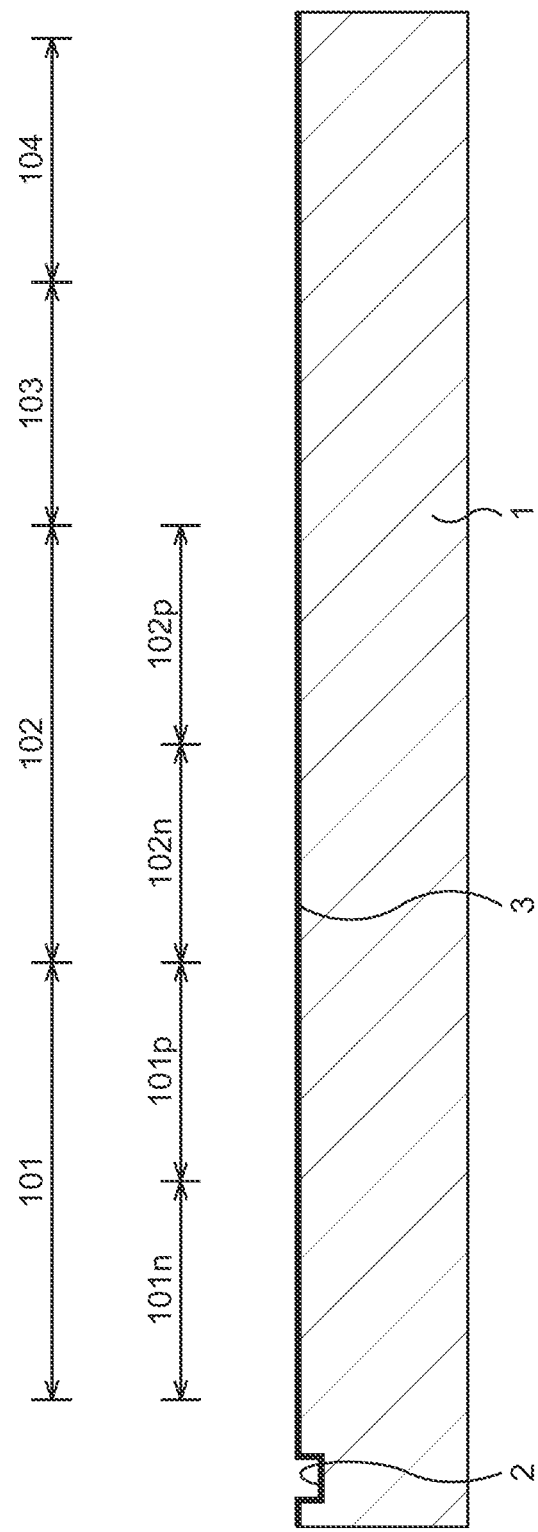

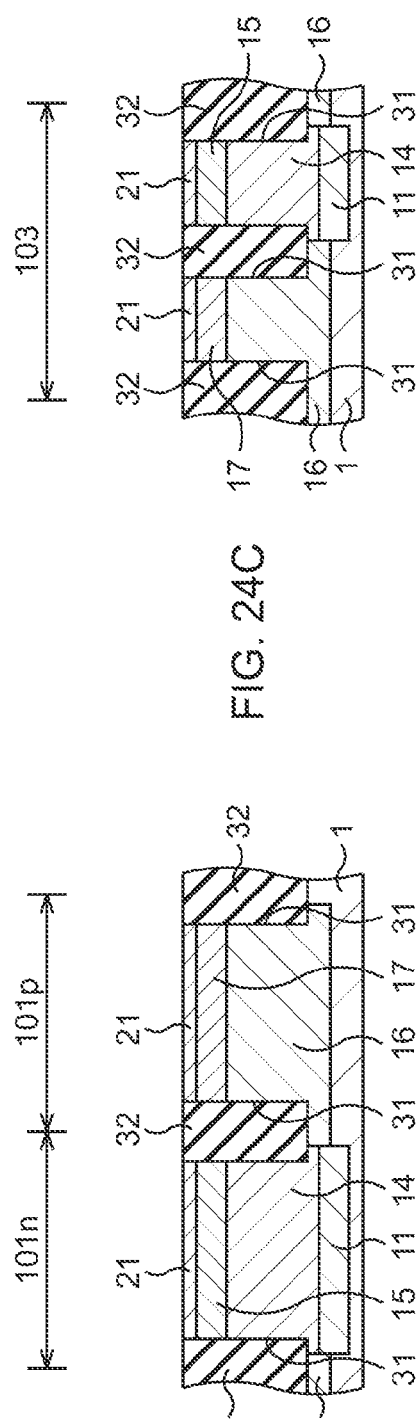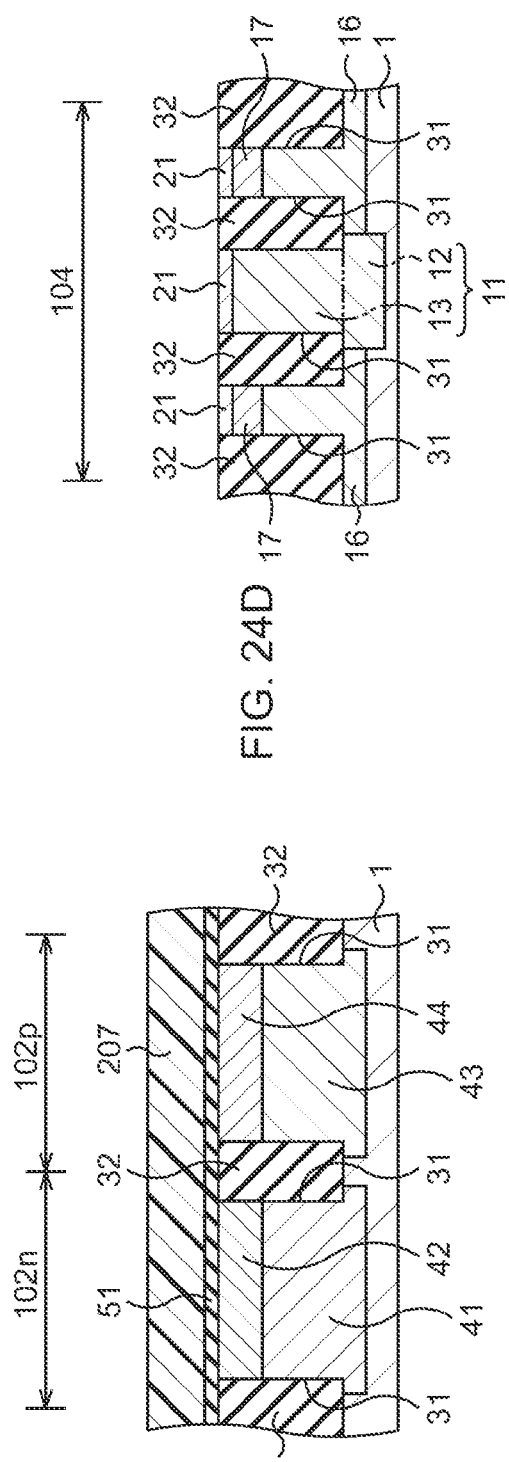
FIG. 24A
FIG. 24B
FIG. 24C
FIG. 24D

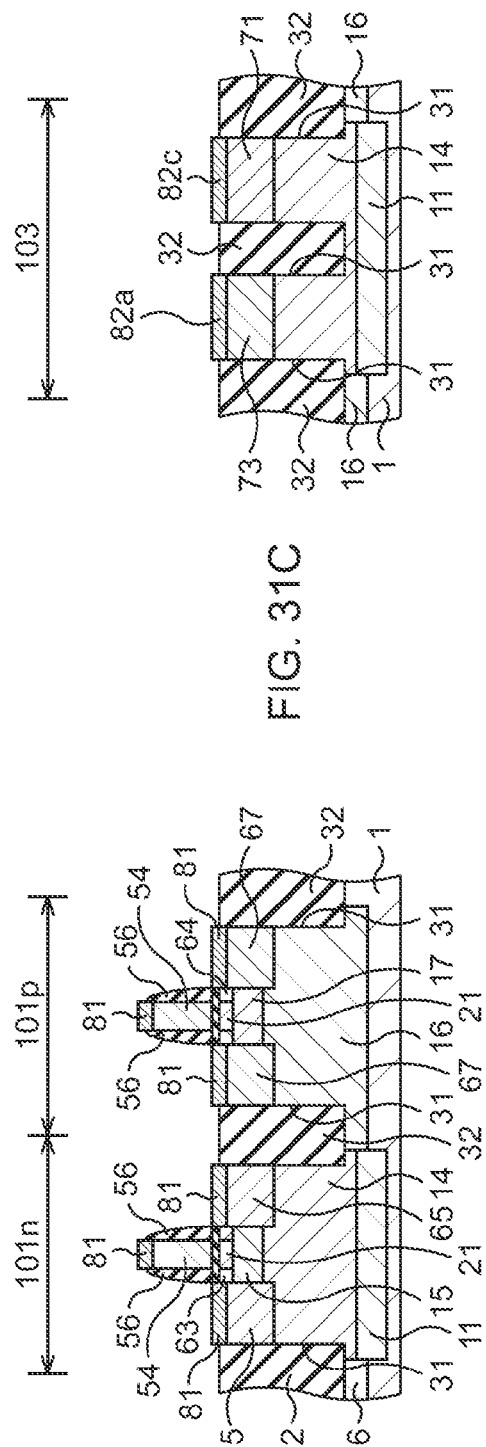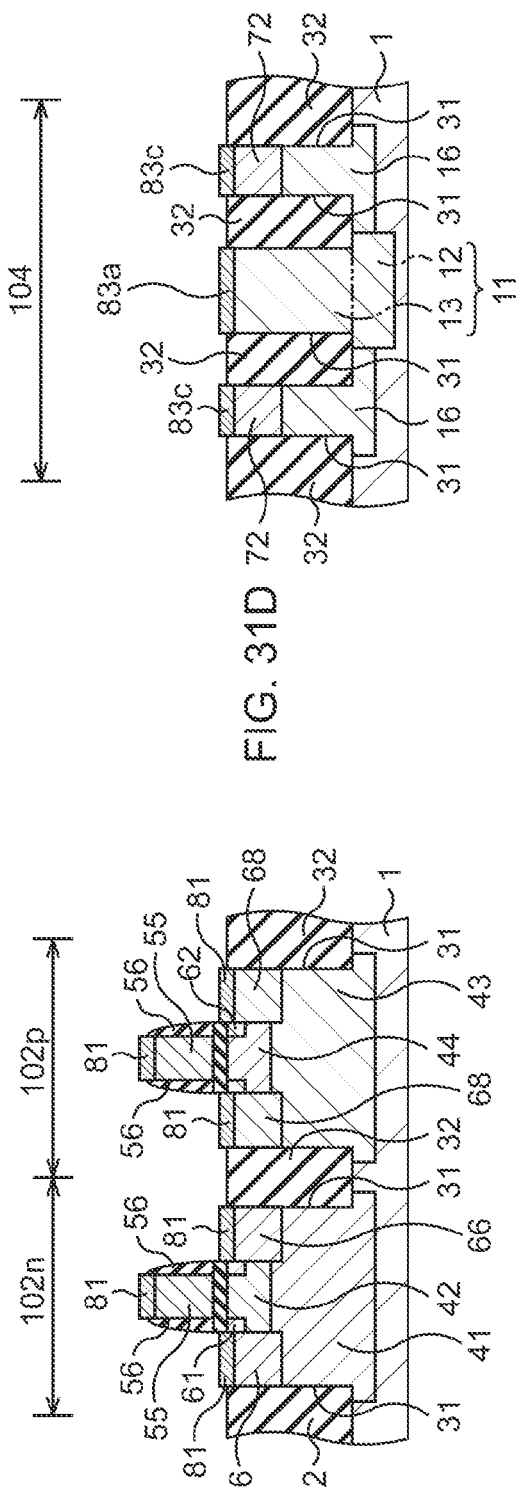

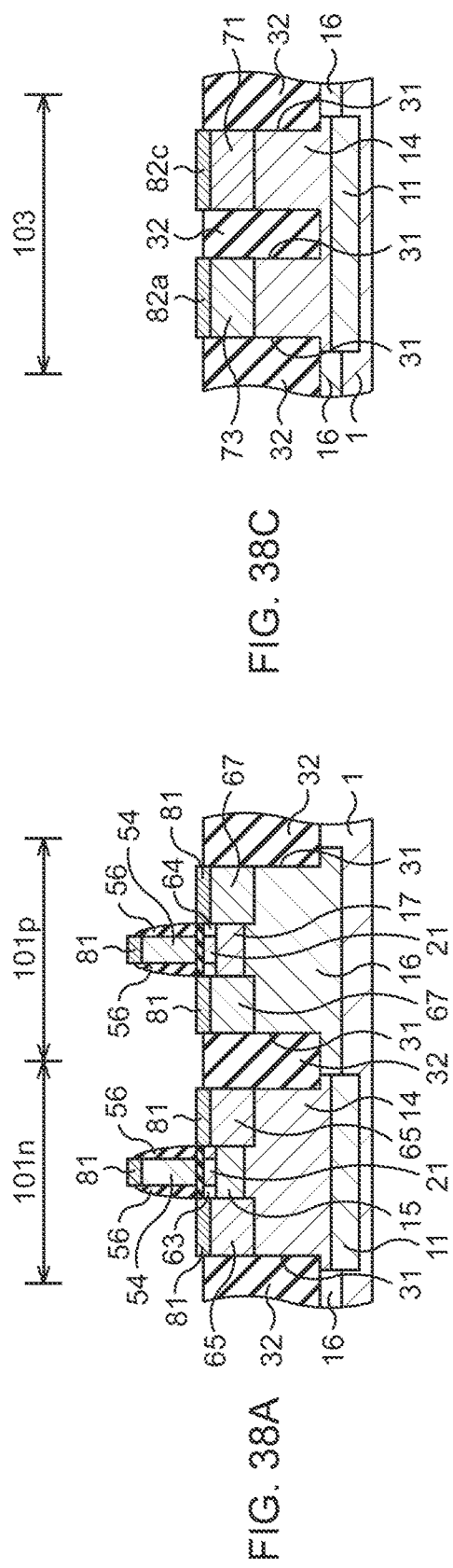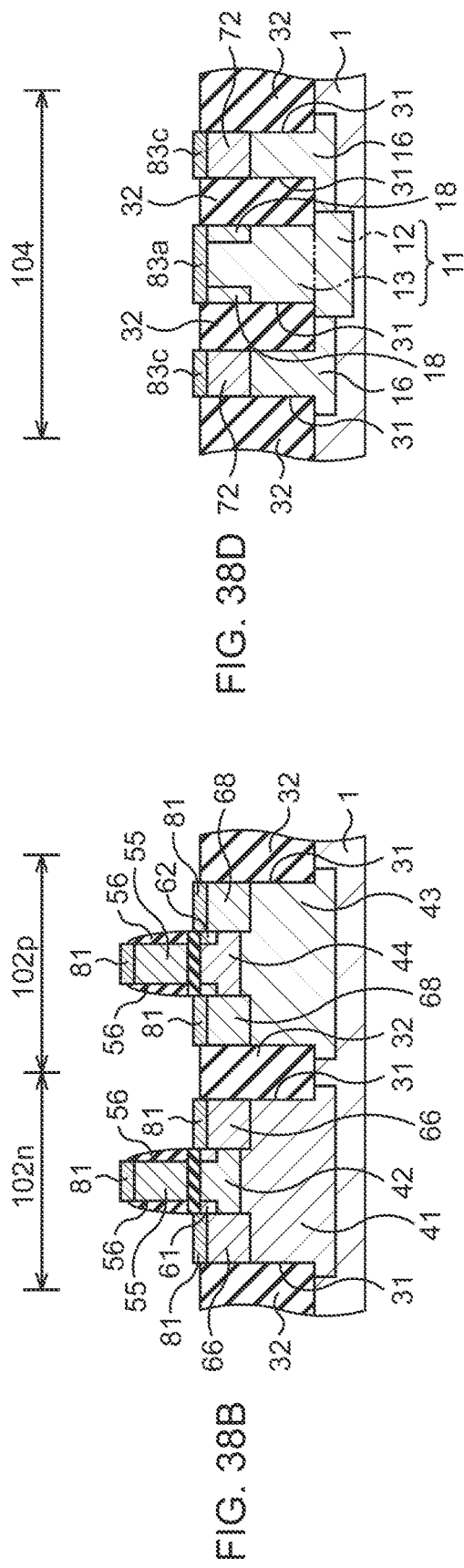

US 9,685,442 B2

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2014-236883, filed on Nov. 21, 2014, the entire contents of which are incorporated herein by reference.

FIELD

The embodiments discussed herein are directed to a semiconductor device and a method of manufacturing the same.

BACKGROUND

Conventionally, various Schottky barrier diodes have been developed to be used for various uses. In general, a low on-voltage (forward voltage) and a low backward current are required for a Schottky barrier diode. However, it is difficult to reduce a backward current sufficiently in a conventional Schottky barrier diode.

Patent Literature 1: Japanese Laid-Open Patent Publication No. 2009-238982
Patent Literature 2: Japanese Laid-Open Patent Publication No. 2001-168352
Patent Literature 3: Japanese Laid-Open Patent Publication No. 2009-64977
Patent Literature 4: Japanese Laid-Open Patent Publication No. 62-179142
Patent Literature 5: Japanese Laid-Open Patent Publication No. 10-335679
Patent Literature 6: Japanese Laid-Open Patent Publication No. 2012-174878

SUMMARY

According to an aspect of the embodiments, a semiconductor device includes: a semiconductor device includes: an insulating film in a first region of a semiconductor substrate; a first impurity region of a first conductivity type and a second impurity region of the first conductivity type, each of the first impurity region and the second impurity region including a part located deeper than the insulating film, and the insulating film being sandwiched by the first impurity region and the second impurity region in planar view in the first region of the semiconductor substrate; a metal silicide film on the first impurity region and in Schottky junction with the first impurity region. The first impurity region contains a first impurity of the first conductivity type such that a peak of a concentration profile is deeper than a bottom of the insulating film. The second impurity region contains a second impurity of the first conductivity type, a concentration of the second impurity in the second impurity region being higher than a concentration of the first impurity in a part of the first impurity region shallower than the bottom of the insulating film. The first impurity region and the second impurity region are in contact with each other at a position deeper than the bottom of the insulating film.

According to another aspect of the embodiments, a method of manufacturing a semiconductor device includes: forming a first impurity region of a first conductivity type in a first region of a semiconductor substrate; forming a second impurity region of the first conductivity type in contact with the first impurity region in the first region of the semiconductor substrate; forming an insulating film that separates a surface of the first impurity region and a surface of the second impurity region to be shallower than the first impurity region and the second impurity region, and such that the first impurity region and the second impurity region are in contact with each other at a position deeper than a bottom of the insulating film in the first region of the semiconductor substrate; and forming a metal silicide film on the first impurity region and in Schottky junction with the first impurity region. A first impurity of the first conductivity type is doped such that a peak of a concentration profile is deeper than the bottom of the insulating film in the forming the first impurity region. A second impurity of the first conductivity type is doped such that a concentration of the second impurity in the second impurity region is higher than a concentration of the first impurity in a part of the first impurity region shallower than the bottom of the insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 is a circuit diagram illustrating a fourth example of a protection circuit;
FIG. 12 a sectional view illustrating the fourth example of a protection circuit;
FIG. 13 is a sectional view illustrating a method of manufacturing the semiconductor device according to the third embodiment in process sequence.

FIGS. 24A to 24D are sectional views illustrating a method of manufacturing the semiconductor device according to the third embodiment in process sequence;

FIGS. 31A to 31D are sectional views illustrating a method of manufacturing the semiconductor device according to the third embodiment in process sequence;

FIGS. 38A to 38D are sectional views illustrating a method of manufacturing the semiconductor device according to the fourth embodiment in process sequence.

DESCRIPTION OF EMBODIMENTS

Hereinafter, a reference example and embodiments are concretely described with reference to attached drawings.

Reference Example

Figure 1A:
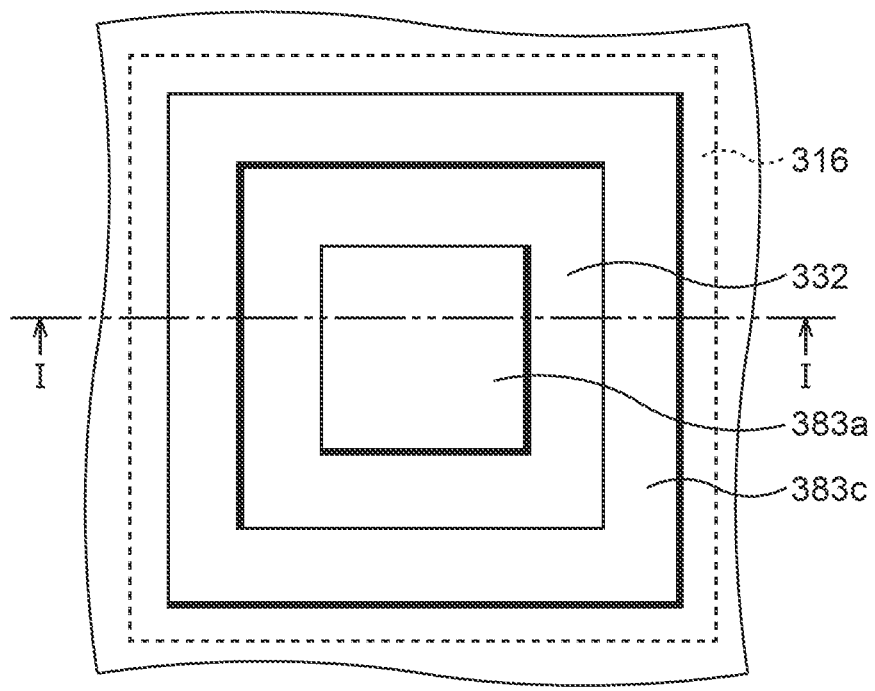
FIGS. 1A and 1B are views illustrating a configuration of a reference example.
Figure 1B:
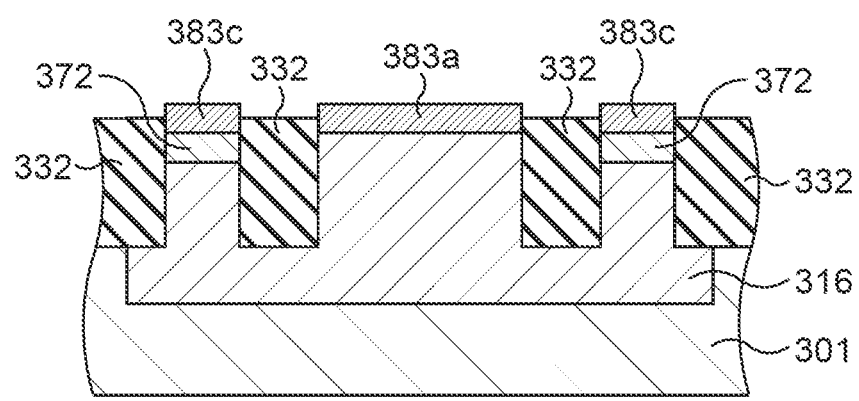

First, a reference example of a Schottky barrier diode is described. FIGS. 1A and 1B are views illustrating a configuration of the reference example, where FIG. 1A is a plan view, and FIG. 1B is a sectional view along a I-I line in FIG. 1A.

In the reference example, as illustrated in FIGS. 1A and 1B, an N-well 316 is formed at a surface of a semiconductor substrate 301 such as a P-type silicon substrate. An insulating film 332 whose planar shape is annular is formed in the N-well 316 to be shallower than the N-well 316. A metal silicide film 383a is formed on a region of the N-well 316 surrounded by the insulating film 332, and the N-well 316 is in Schottky contact with the metal silicide film 383a. An N-type impurity layer 372 is formed at a surface of the N-well 316 at an outside of the insulating film 332, and a metal silicide film 383c is formed on the N-type impurity layer 372. A concentration of an N-type impurity in the N-type impurity layer 372 is higher than that in the N-well 316, and the N-type impurity layer 372 is in ohmic contact with the metal silicide film 383c.

According to the Schottky barrier diode of the reference example, it may be possible to reduce a backward current for some extent, but the degree of reduction is not sufficient. In the reference example, it may be possible to reduce the backward current if a concentration of the N-type impurity in the N-well 316 is reduced, but punch-through easily occurs between the metal silicide film 383a and the semiconductor substrate 301, and a backward withstand voltage is lowered. An addition of process may be necessary to form the N-well whose N-type impurity concentration is low. Thus, various problems may be accompanied to simply reduce the N-type impurity concentration in the N-well 316.

The present inventors came up to the following embodiments as a result of hard study to reduce a backward current of a Schottky barrier diode while avoiding the above-stated various problems.

First Embodiment

Figure 2A:
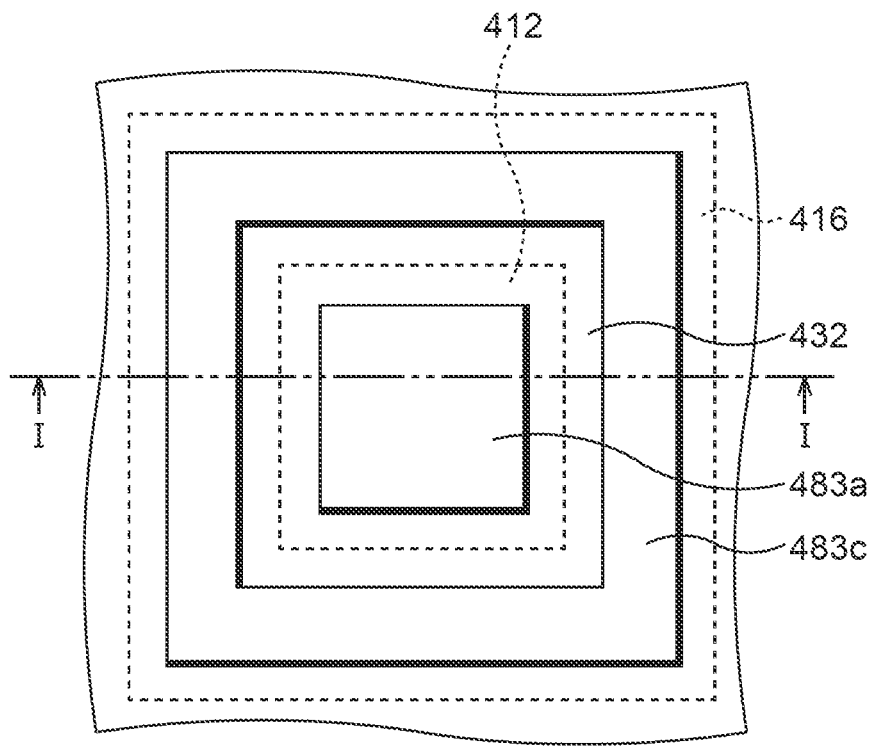
FIGS. 2A and 2B are views illustrating a configuration of a semiconductor device according to a first embodiment.
Figure 2B:
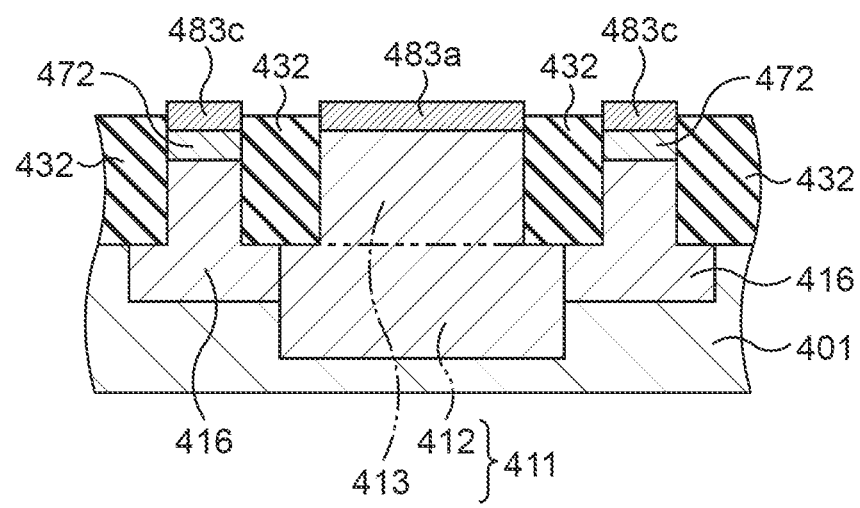

Next, a first embodiment is described. The first embodiment relates to a semiconductor device including a Schottky barrier diode. FIGS. 2A and 2B are views illustrating a configuration of the semiconductor device according to the first embodiment, where FIG. 2A is a plan view, and FIG. 2B is a sectional view along a I-I line in FIG. 2A.

In the first embodiment, as illustrated in FIGS. 2A and 2B, an N-well 411, and an N-well 416 surrounding the N-well 411 in planar view are formed at a surface of a semiconductor substrate 401 such as a P-type silicon substrate. A metal silicide film 483a is formed on the N-well 411, and the N-well 411 is in Schottky contact with metal silicide film 483a. An N-type impurity layer 472 is formed at a surface of the N-well 416, and a metal silicide film 483c is formed on the N-type impurity layer 472. A concentration of an N-type impurity in the N-type impurity layer 472 is higher than that in the N-well 416, and the N-type impurity layer 472 is in ohmic contact with the metal silicide film 483c. An insulating film 432 which insulates the metal silicide film 483a and a part of the N-well 411 which is in Schottky contact with the metal silicide film 483a from the metal silicide film 483c and the N-type impurity layer 472 is formed between the N-well 411 and the N-well 416. The insulating film 432 is formed to be shallower than the N-well 411 and the N-well 416.

A peak of a concentration profile of the N-type impurity contained in the N-well 411 is in a part of the N-well 411 deeper than a bottom of the insulating film 432 (deep part 412), and a concentration of the N-type impurity contained in the N-well 411 is lower as it approximates to a surface on a surface side of the peak. A concentration of the N-type impurity is extremely low in a shallow part 413 on the deep part 412, and for example, it is less than $1.0 \times 10^{16}$ cm$^{-3}$ at a highest part. On the other hand, a maximum value of a concentration of the N-type impurity in the deep part 412 is, for example, over $1.0 \times 10^{16}$ cm$^{-3}$. The N-well 416 is in contact with the deep part 412 on a lower side of the insulating film 432. A concentration of the N-type impurity in the N-well 416 is higher than that in the shallow part 413.

A Schottky barrier diode including Schottky contact between the metal silicide film 483a and the shallow part 413 of the N-well 411 is constituted. The concentration of the N-type impurity in the shallow part 413 is extremely low, and therefore, it is possible to reduce a backward current. The concentration of the N-type impurity in the deep part 412 is sufficiently high, and therefore, punch-through is difficult to occur, while the concentration of the N-type impurity in the shallow part 413 is extremely low, and it is possible to suppress deterioration of a backward withstand voltage due to punch-through. The peak of the concentration profile of the N-type impurity contained in the N-well 411 is in the deep part 412, and therefore, it is possible to easily obtain the concentration profile in which the concentration of the N-type impurity in the shallow part 413 is extremely low and the concentration of the N-type impurity in the deep part 412 is sufficiently high. The deep part 412 whose concentration of the N-type impurity is sufficiently high is in contact with the N-well 416 on the lower side of the insulating film 432, and therefore, parasitic resistance is low and it is possible to obtain excellent forward characteristics.

Next, a method of manufacturing the semiconductor device according to the first embodiment is described. FIG. 3A to FIG. 3E are sectional views illustrating the method of manufacturing the semiconductor device according to the first embodiment in process sequence.

Figure 3A:
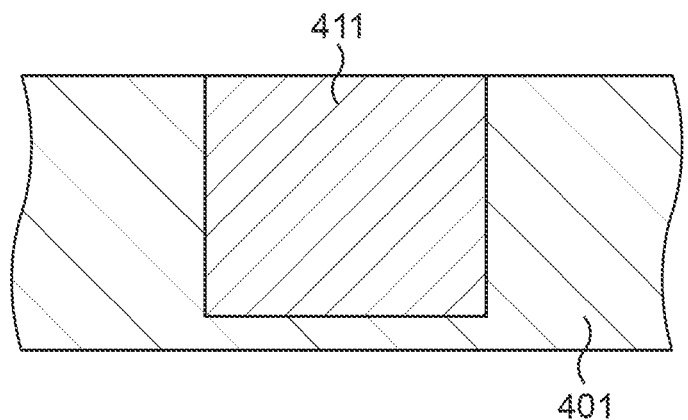
FIG. 3A to FIG. 3E are sectional views illustrating a method of manufacturing the semiconductor device according to the first embodiment in process sequence.
Figure 4A:
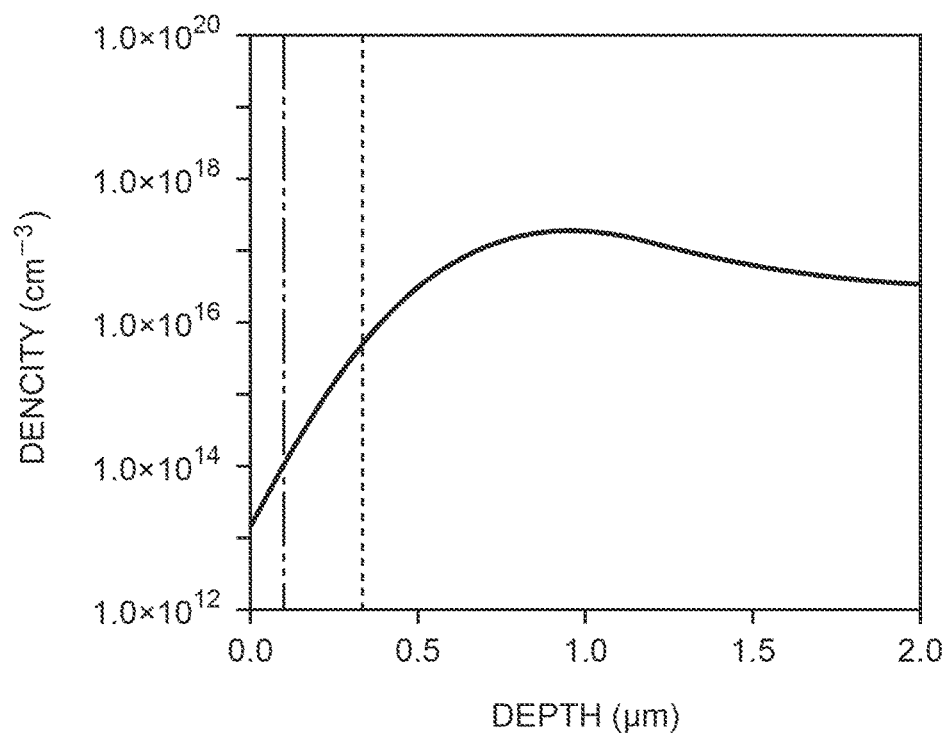
FIG. 4A and FIG. 4B are charts illustrating concentration profiles of an N-type impurity.
Figure 4B:
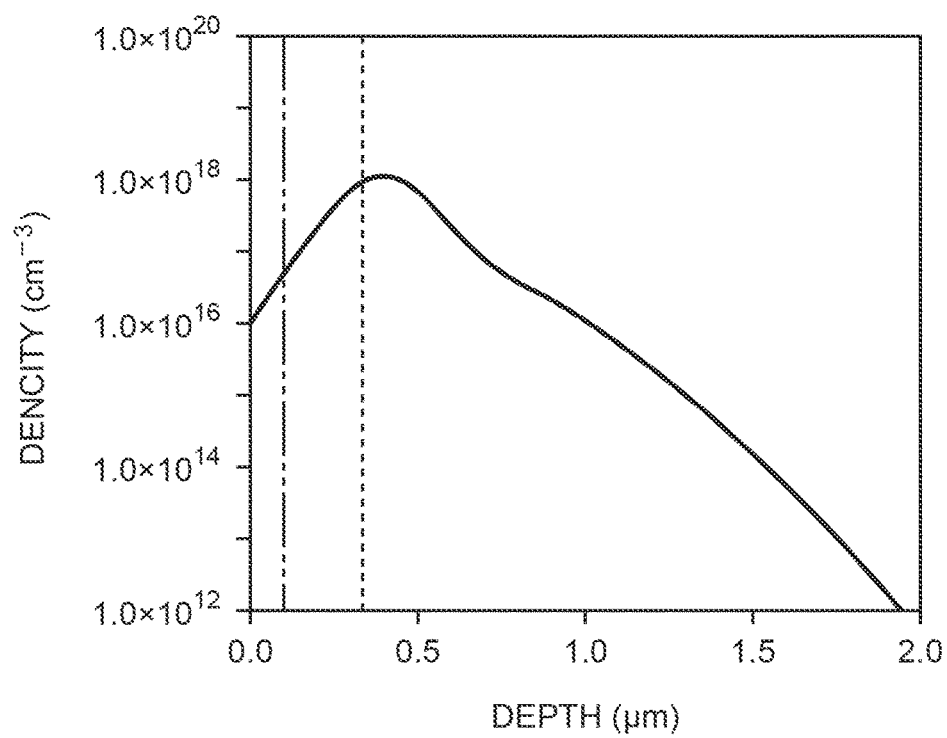

First, as illustrated in FIG. 3A, the N-well 411 is formed at the surface of the semiconductor substrate 401 by photolithography and ion-implantation. At this time, the N-well 411 is formed such that the peak of the concentration profile of the N-type impurity is deeper than the bottom of the insulating film 432 which is to be formed later. The concentration profile in a depth direction of the N-type impurity of the N-well 411 at this time is to be, for example, as illustrated in FIG. 4A. The concentration profile of the N-type impurity in a depth direction when an N-well 316 of the reference example is formed is illustrated in FIG. 4B for comparison. A dotted line in FIG. 4A represents a depth of the bottom of the insulating film 432, and a two-dot chain line represents a depth of a bottom of the metal silicide film 483a formed later. As illustrated in FIGS. 4A and 4B, as for the concentration at the N-well 411 or 316 at an interface with the metal silicide film 483a or 383a, it is extremely low such as approximately $1.0 \times 10^{14}$ cm$^{-3}$ in the embodiment, while it is high such as over $1.0 \times 10^{16}$ cm$^{-3}$ in the reference example. The large difference of the impurity concentrations leads to a large difference of backward current. In the reference example, if a dose amount is simply lowered to set the concentration at the interface between the N-well 316 and the metal silicide film 383a to be approximately $1.0 \times 10^{14}$ cm$^{-3}$, the N-type impurity in the whole of the N-well 316 becomes insufficient.

Figure 3B:
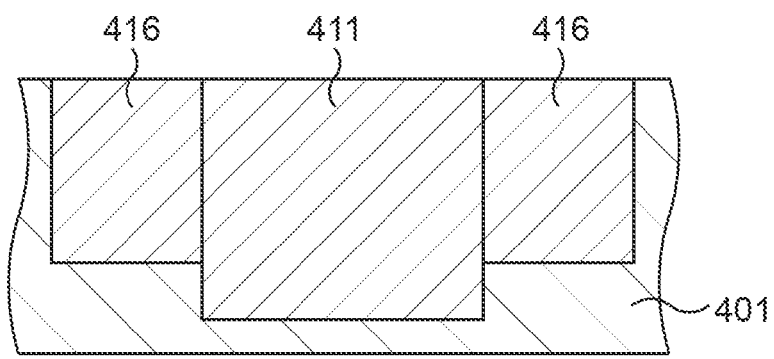

Then, as illustrated in FIG. 3B, the N-well 416 which surrounds the N-well 411 in planar view is formed at the surface of the semiconductor substrate 401 by photolithography and ion-implantation. The N-well 416 may be formed to overlap with the N-well 411.

Figure 3C:
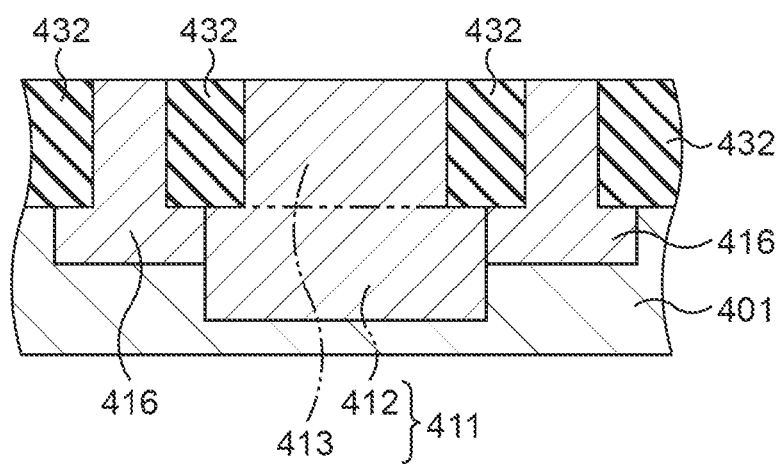

Thereafter, as illustrated in FIG. 3C, a trench which is shallower than the N-well 411 and the N-well 416 is formed along a boundary of the N-well 411 and the N-well 416, and the insulating film 432 is formed in the trench. The N-well 411 may be defined into the deep part 412 which is deeper than the insulating film 432 and the shallow part 413 on the deep part 412.

Figure 3D:
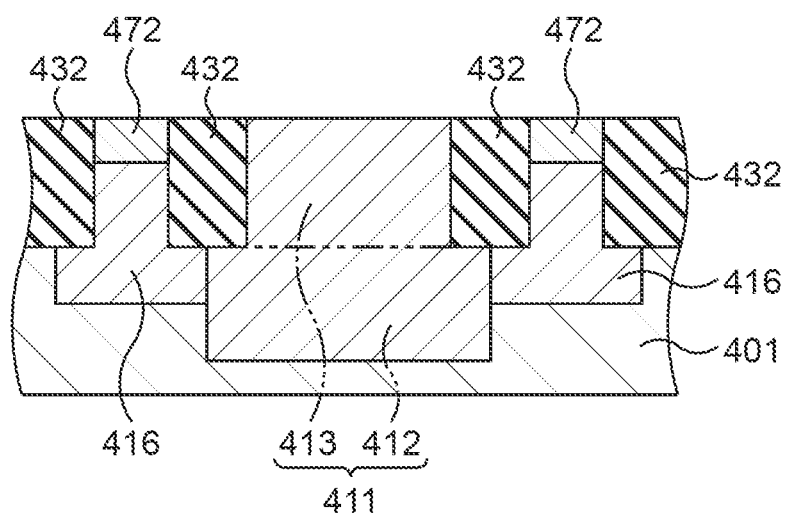

Subsequently, as illustrated in FIG. 3D, the N-type impurity layer 472 is formed at the surface of the N-well 416 by photolithography and ion-implantation. The concentration of the N-type impurity in the N-type impurity layer 472 is higher than that in the N-well 416.

Figure 3E:
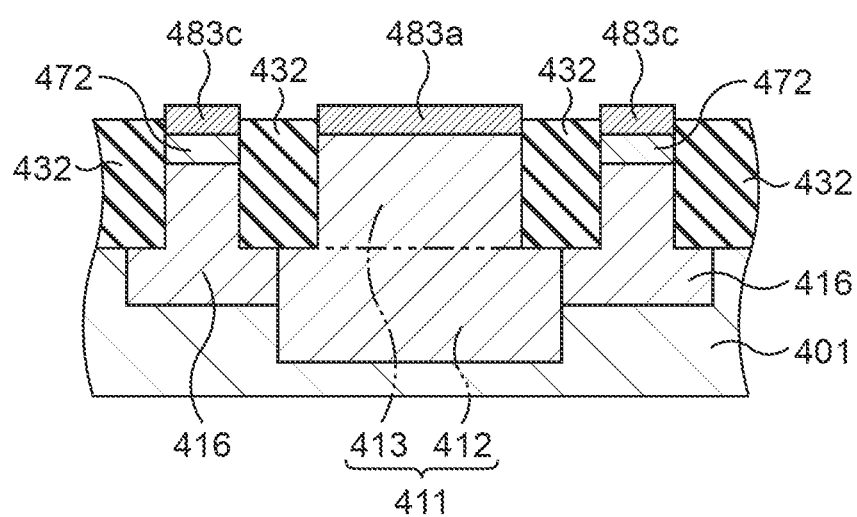

Then, as illustrated in FIG. 3E, the metal silicide film 483a is formed on the N-well 411, and the metal silicide film 483c is formed on the N-type impurity layer 472. The N-well 411 is in Schottky contact with the metal silicide film 483a, and the N-type impurity layer 472 is ohmic contact with the metal silicide film 483c.

Thus, the semiconductor device according to the first embodiment can be manufactured.

Second Embodiment

Figure 5A:
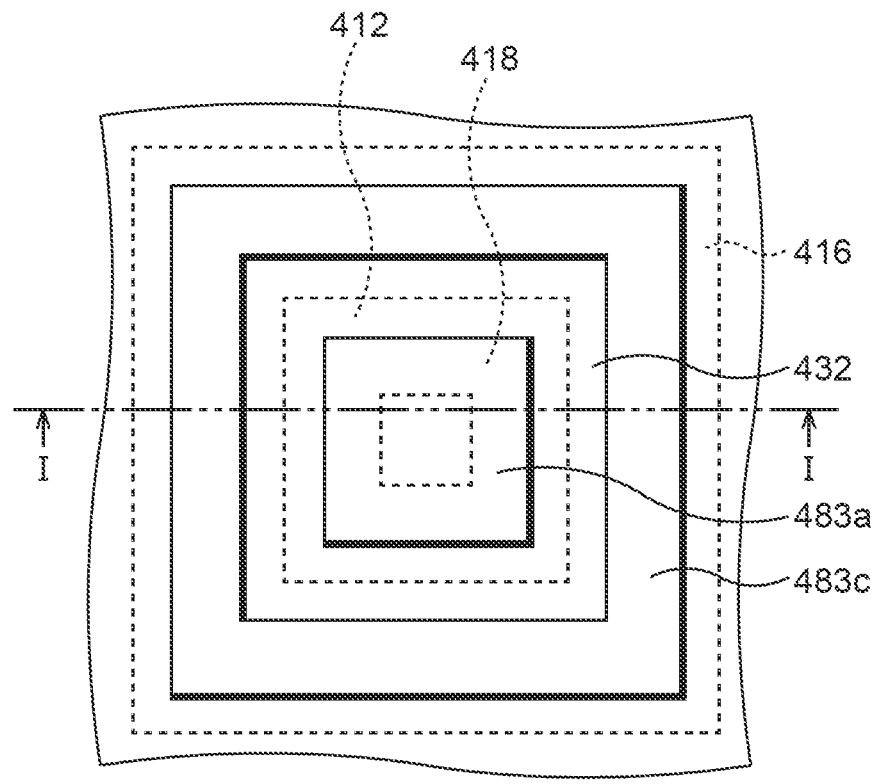
FIGS. 5A and 5B are views illustrating a configuration of a semiconductor device according to a second embodiment.
Figure 5B:
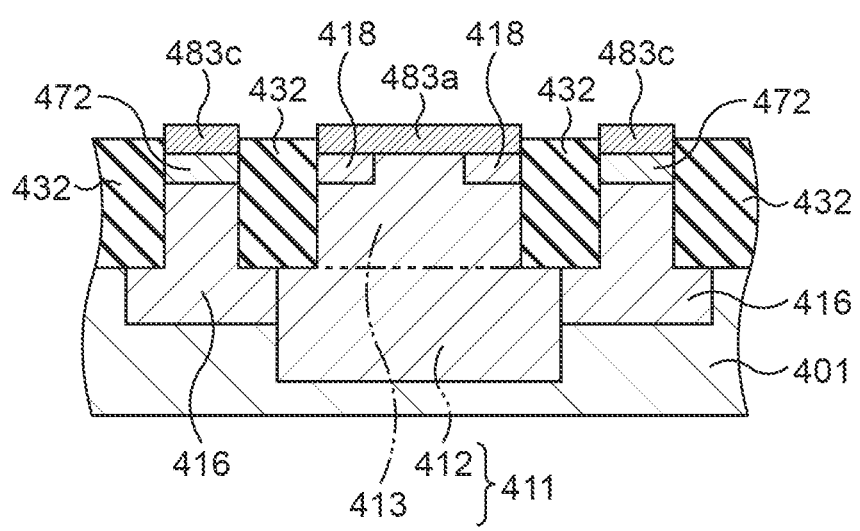

Next, a second embodiment is described. The second embodiment relates to a semiconductor device including a Schottky barrier diode. FIGS. 5A and 5B are views illustrating a configuration of the semiconductor device according to the second embodiment, where FIG. 5A is a plan view, and FIG. 5B is a sectional view along a I-I line in FIG. 5A.

In the second embodiment, as illustrated in FIGS. 5A and 5B, a P-type impurity layer 418 whose planar shape is annular is formed at a surface of the shallow part 413 as a guard ring. Other configurations are similar to the first embodiment.

A Schottky barrier diode including the Schottky contact between the metal silicide film 483a and the shallow part 413 of the N-well 411 and the P-type impurity layer 418 as the guard ring is constituted. It is also possible to obtain the similar effect as the first embodiment according to the second embodiment. Also, it is possible to further reduce a backward current by relaxation of electric field concentration compared to the first embodiment. It is possible to suppress deterioration of a backward withstand voltage due to punch-through, though the P-type impurity layer 418 is formed and the concentration of the N-type impurity in the shallow part 413 is low.

Figure 6A:
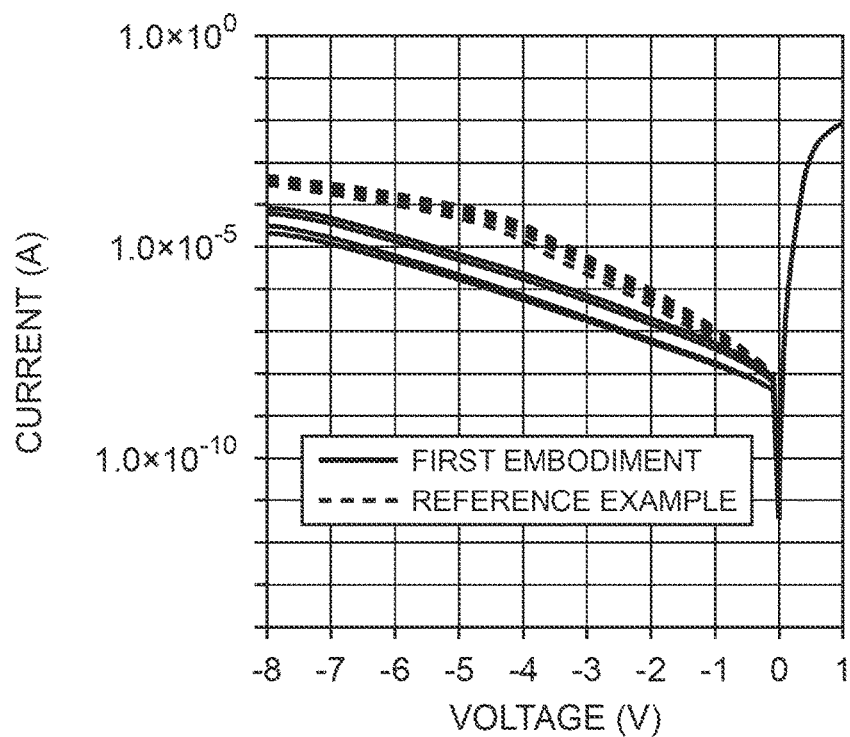
FIG. 6A and FIG. 6B are charts illustrating current-voltage characteristics.
Figure 6B:
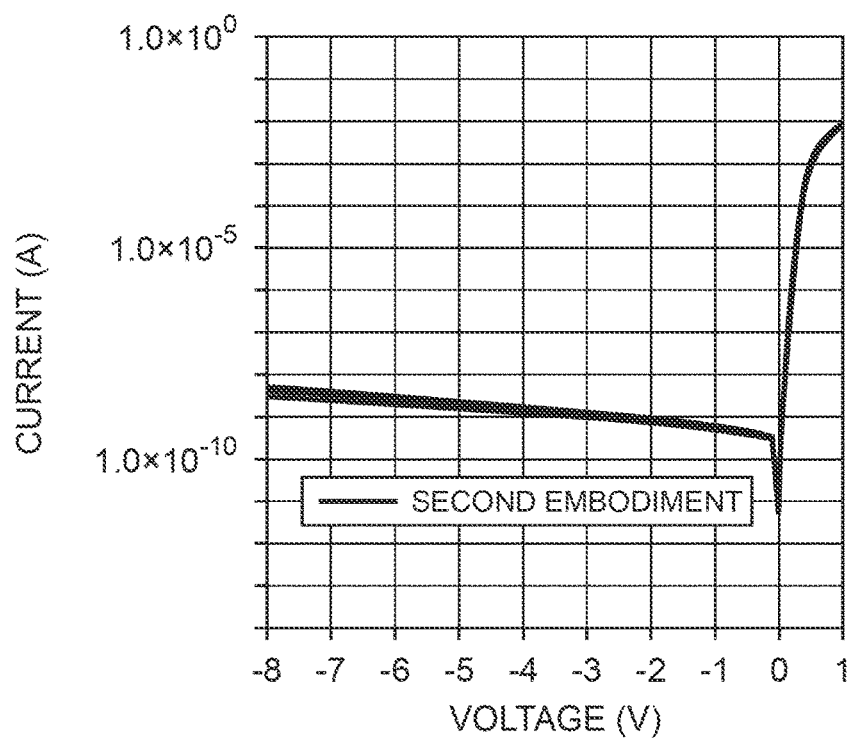

Current-voltage characteristics in the reference example and the first embodiment are illustrated in FIG. 6A, and current-voltage characteristics in the second embodiment are illustrated in FIG. 6B. As illustrated in FIG. 6A, as for the reference example and the first embodiment where a guard ring is not included, the backward current is lower in the first embodiment, and as illustrated in FIG. 6B, in the second embodiment including a guard ring, the backward current is further lower.

Third Embodiment

Next, a third embodiment is described. The third embodiment relates to a semiconductor device including a DDC transistor, a high-voltage transistor, a low resistance diode (LRD), and a Schottky barrier diode (SBD). FIGS. 7A to 7D are sectional views illustrating a configuration of the semiconductor device according to the third embodiment. The DDC transistor has a large effect on suppressing variation of a threshold voltage due to statistical fluctuations of impurities, and it is effective for a high-speed transistor operating at a low voltage (for example, 0.9 V) used for a logic circuit or the like. A high-voltage NMOS transistor is a transistor where a high-voltage (for example, 3.3 V) compared to a driving voltage of the DDC transistor is applied, and it is used for, for example, 3.3 V I/O. The LRD is a PN junction diode, for example, and it is included for a surge protection, for example. The SBD is included for prevention of latch up of the DDC transistor, for example.

Figure 7C:
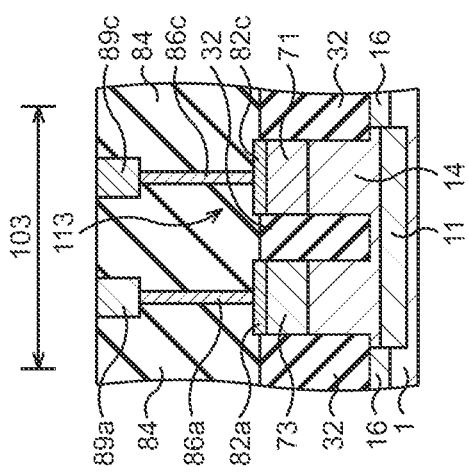
FIGS. 7A to 7D are sectional views illustrating a configuration of a semiconductor device according to a third embodiment.
Figure 7D:
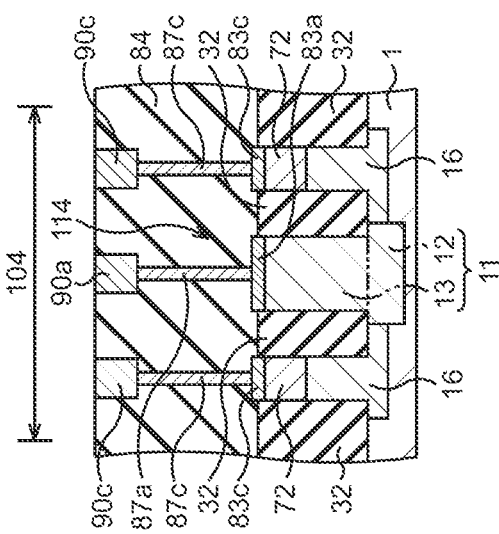
Figure 7A:
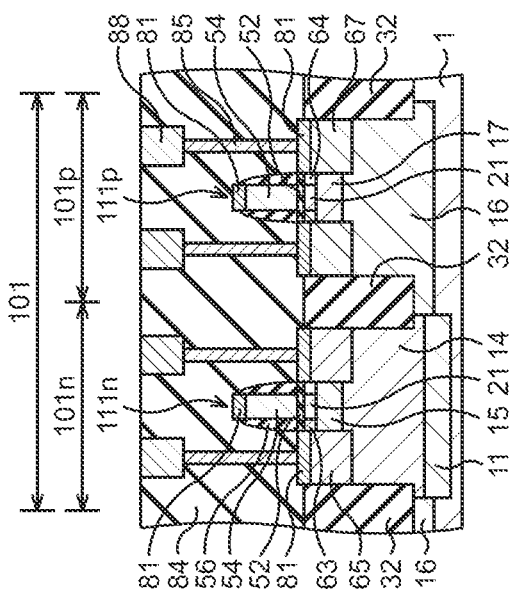
Figure 7B:
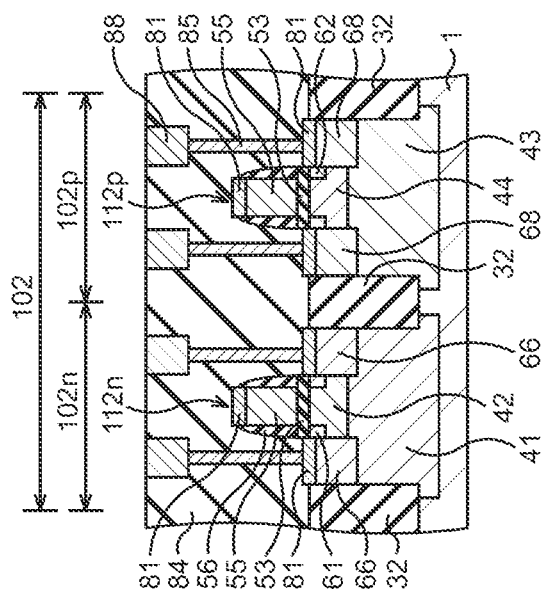

In the semiconductor device according to the third embodiment, as illustrated in FIGS. 7A to 7D, a region 101 in which a DDC-NMOS transistor 111n and a DDC-PMOS transistor 111p are formed, a region 102 in which a high-voltage NMOS transistor 112n and a high-voltage PMOS transistor 112p are formed, a region 103 in which an LRD 113 is formed, and a region 104 in which an SBD 114 is formed are included in a semiconductor substrate 1 such as a silicon substrate. The DDC-NMOS transistor 111n is an N-channel type MOS transistor with DDC technology. The DDC-PMOS transistor 111p is a P-channel type MOS transistor with DDC technology. The high-voltage NMOS transistor 112n is an N-channel type MOS transistor which is driven by a higher voltage than the DDC-NMOS transistor 111n. The high-voltage PMOS transistor 112p is a P-channel type MOS transistor which is driven by a higher voltage than the DDC-PMOS transistor 111p. A region 101n in which the DDC-NMOS transistor 111n is formed and a region 101p in which the DDC-PMOS transistor 111p is formed are included in the region 101. A region 102n in which the high-voltage NMOS transistor 112n is formed and a region 102p in which the high-voltage PMOS transistor 112p is formed are included in the region 102. The region 101 is illustrated in FIG. 7A, the region 102 is illustrated in FIG. 7B, the region 103 is illustrated in FIG. 7C, and the region 104 is illustrated FIG. 7D.

A P-well 14 is formed at a surface of the semiconductor substrate 1 and an N-well 11 is formed under the P-well 14 in the region 101n. An N-well 16 surrounding the P-well 14 from a lateral side is also formed. The P-well 14 is a double well surrounded from a lower side and a lateral side by the N-well 11 and the N-well 16. A P-type impurity layer 15 is formed as a channel impurity layer (threshold voltage control layer) on the P-well 14, and a non-doped epitaxial silicon layer 21 is formed on the P-type impurity layer 15. A gate insulating film 52 is formed on the epitaxial silicon layer 21, and a gate electrode 54 is formed on the gate insulating film 52. A sidewall insulating film 56 is formed on a side surface of the gate electrode 54. An N-type impurity layer 63 is formed as an extension region at a lower side of the sidewall insulating film 56 between the P-type impurity layer 15 and the gate insulating film 52. An N-type impurity layer 65 in contact with the N-type impurity layer 63 and the P-type impurity layer 15 is formed to be deeper than the P-type impurity layer 15 on the outside of the sidewall insulating film 56 seen from the gate electrode 54. Metal silicide films 81 are formed on the gate electrode 54 and on the N-type impurity layer 65. Thus, the DDC-NMOS transistor 111n including the N-type impurity layer 65, the N-type impurity layer 63, the P-type impurity layer 15, the epitaxial silicon layer 21, the gate insulating film 52, the gate electrode 54, and so on is formed in the region 101n. The double well (the N-well 11 and the N-well 16) is included in the DDC-NMOS transistor 111n, and therefore, it is possible to apply a back bias of a voltage different from a power supply voltage and a reference voltage on the DDC-NMOS transistor 111n as it is described later.

The N-well 16 is formed at the surface of the semiconductor substrate 1 in the region 101p. An N-type impurity layer 17 is formed as a channel impurity layer (threshold voltage control layer) on the N-well 16, the non-doped epitaxial silicon layer 21 is formed on the N-type impurity layer 17. The gate insulating film 52 is formed on the epitaxial silicon layer 21, and the gate electrode 54 is formed on the gate insulating film 52. The sidewall insulating film 56 is formed on the side surface of the gate electrode 54. A P-type impurity layer 64 is formed as an extension region at a lower side of the sidewall insulating film 56 between the N-type impurity layer 17 and the gate insulating film 52. A P-type impurity layer 67 in contact with the P-type impurity layer 64 and the N-type impurity layer 17 is formed to be deeper than the N-type impurity layer 17 on the outside of the sidewall insulating film 56 seen from the gate electrode 54. The metal silicide films 81 are formed on the gate electrode 54 and on the P-type impurity layer 67. Thus, the DDC-PMOS transistor 111p including the P-type impurity layer 67, the P-type impurity layer 64, the N-type impurity layer 17, the epitaxial silicon layer 21, the gate insulating film 52, and the gate electrode 54 and so on is formed in the region 101p.

A P-well 41 is formed at the surface of the semiconductor substrate 1 in the region 102n. A P-type impurity layer 42 is formed on the P-well 41, a gate insulating film 53 thicker than the gate insulating film 52 is formed on the P-type impurity layer 42, and a gate electrode 55 is formed on the gate insulating film 53. For example, a gate length of the gate electrode 55 is larger than a gate length of the gate electrode 54. The sidewall insulating film 56 is formed on a side surface of the gate electrode 55. An N-type impurity layer 61 is formed as an LDD (lightly-doped drain) region at a lower side of the sidewall insulating film 56 at a surface of the P-type impurity layer 42. An N-type impurity layer 66 in contact with the N-type impurity layer 61 and the P-type impurity layer 42 is formed to be deeper than the P-type impurity layer 42 on the outside of the sidewall insulating film 56 seen from the gate electrode 55. The metal silicide films 81 are formed on the gate electrode 55 and on the N-type impurity layer 66. Thus, the high-voltage NMOS transistor 112n including the N-type impurity layer 66, the N-type impurity layer 61, the P-type impurity layer 42, the gate insulating film 53, the gate electrode 55 and so on is formed in the region 102n.

An N-well 43 is formed at the surface of the semiconductor substrate 1 in the region 102p. An N-type impurity layer 44 is formed on the N-well 43, the gate insulating film 53 thicker than the gate insulating film 52 is formed on the N-type impurity layer 44, and the gate electrode 55 is formed on the gate insulating film 53. The sidewall insulating film 56 is formed on the side surface of the gate electrode 55. A P-type impurity layer 62 is formed as the LDD region at a lower side of the sidewall insulating film 56 at a surface of the N-type impurity layer 44. A P-type impurity layer 68 in contact with the P-type impurity layer 62 and the N-type impurity layer 44 is formed to be deeper than the N-type impurity layer 44 on the outside of the sidewall insulating film 56 seen from the gate electrode 55. The metal silicide films 81 are formed on the gate electrode 55 and on the P-type impurity layer 68. Thus, the high-voltage PMOS transistor 112p including the P-type impurity layer 68, the P-type impurity layer 62, the N-type impurity layer 44, the gate insulating film 53, the gate electrode 55 and so on is formed in the region 102p.

The P-well 14 is formed at the surface of the semiconductor substrate 1, and the N-well 11 is formed under the P-well 14, in the region 103. The N-well 16 surrounding the P-well 14 from the lateral side is also formed. The P-well 14 is a double well surrounded from a lower side and a lateral side by the N-well 11 and the N-well 16. An element isolation insulating film 32 is formed in the P-well 14 to be shallower than the P-well 14, and a surface layer of the P-well 14 is defined to be two regions which are insulated from each other. An N-type impurity layer 71 is formed at a surface of the P-well 14 in one region, and a P-type impurity layer 73 is formed as a contact layer at the surface of the P-well 14 in the other region. A metal silicide film 82c is formed as a cathode electrode on the N-type impurity layer 71, and a metal silicide film 82a is formed as an anode electrode on the P-type impurity layer 73. Thus, an PN junction diode including the P-well 14 and the N-type impurity layer 71 is formed as the LRD 113 in the region 103.

The N-well 11, and the N-well 16 surrounding the N-well 11 in planar view are formed at the surface of the semiconductor substrate 1 in the region 104. A metal silicide film 83a is formed as an anode electrode on the N-well 11, and the metal silicide film 83a is in Schottky contact with the N-well 11. An N-type impurity layer 72 is formed as a contact layer at a surface of the N-well 16, and a metal silicide film 83c is formed as a cathode electrode on the N-type impurity layer 72. A concentration of the N-type impurity in the N-type impurity layer 72 is higher than that in the N-well 16, and the metal silicide film 83c is in ohmic contact with the N-type impurity layer 72. The element isolation insulating film 32 which insulates the metal silicide film 83a and a part of the N-well 11 which is in Schottky contact with the metal silicide film 83a from the metal silicide film 83c and the N-type impurity layer 72 is formed between the N-well 11 and the N-well 16. The element isolation insulating film 32 is formed to be shallower than the N-well 11 and the N-well 16.

A peak of a concentration profile of the N-type impurity contained in the N-well 11 is in a part of the N-well 11 deeper than a bottom of the element isolation insulating film 32 (deep part 12), and a concentration of the N-type impurity contained in the N-well 11 is lower as it approximates to a surface on a surface side of the peak. A concentration of the N-type impurity is extremely low in a shallow part 13 on the deep part 12, and for example, it is less than $1.0 \times 10^{16}$ cm$^{-3}$ at a highest part. On the other hand, a maximum value of a concentration of the N-type impurity in the deep part 12 is, for example, over $1.0 \times 10^{16}$ cm$^{-3}$. The N-well 16 is in contact with the deep part 12 on a lower side of the element isolation insulating film 32. A concentration of the N-type impurity in the N-well 16 is higher than that in the shallow part 13, and the concentration of the N-type impurity in the deep part 12 is higher than that in the N-well 16. Thus, the SBD 114 including the N-well 11, the metal silicide film 83a, and the N-well 16 is formed in the region 104.

An interlayer insulating film 84 is formed over the semiconductor substrate 1, and a conductive plug 85, a conductive plug 86a, a conductive plug 86c, a conductive plug 87a, a conductive plug 87c, a wiring 88, a wiring 89a, a wiring 89c, a wiring 90a, and a wiring 90c are formed in the interlayer insulating film 84. The conductive plug 85 is in contact with the metal silicide film 81, and the wiring 88 is in contact with the conductive plug 85. The conductive plug 86a is in contact with the metal silicide film 82a, and the wiring 89a is in contact with the conductive plug 86a. The conductive plug 86c is in contact with the metal silicide film 82c, and the wiring 89c is in contact with the conductive plug 86c. The conductive plug 87a is in contact with the metal silicide film 83a, the wiring 90a is in contact with the conductive plug 87a. The conductive plug 87c is in contact with the metal silicide film 83c, and the wiring 90c is in contact with the conductive plug 87c.

In the embodiment, the concentration of the N-type impurity in the shallow part 13 is extremely low, and therefore, it is possible to reduce a backward current. The concentration of the N-type impurity in the deep part 12 is sufficiently high, and therefore, punch-through is difficult to occur, while the concentration of the N-type impurity in the shallow part 13 is extremely low, and it is possible to suppress deterioration of a the backward withstand voltage due to punch-through. The peak of the concentration profile of the N-type impurity contained in the N-well 11 is in the deep part 12, and therefore, it is possible to easily obtain the concentration profile in which the concentration of the N-type impurity at the shallow part 13 is extremely low and the concentration of the N-type impurity in the deep part 12 is sufficiently high. The deep part 12 whose concentration of the N-type impurity is sufficiently high is in contact with the N-well 16 on the lower side of the element isolation insulating film 32, and therefore, parasitic resistance is low and it is possible to obtain excellent forward characteristics.

Figure 8:
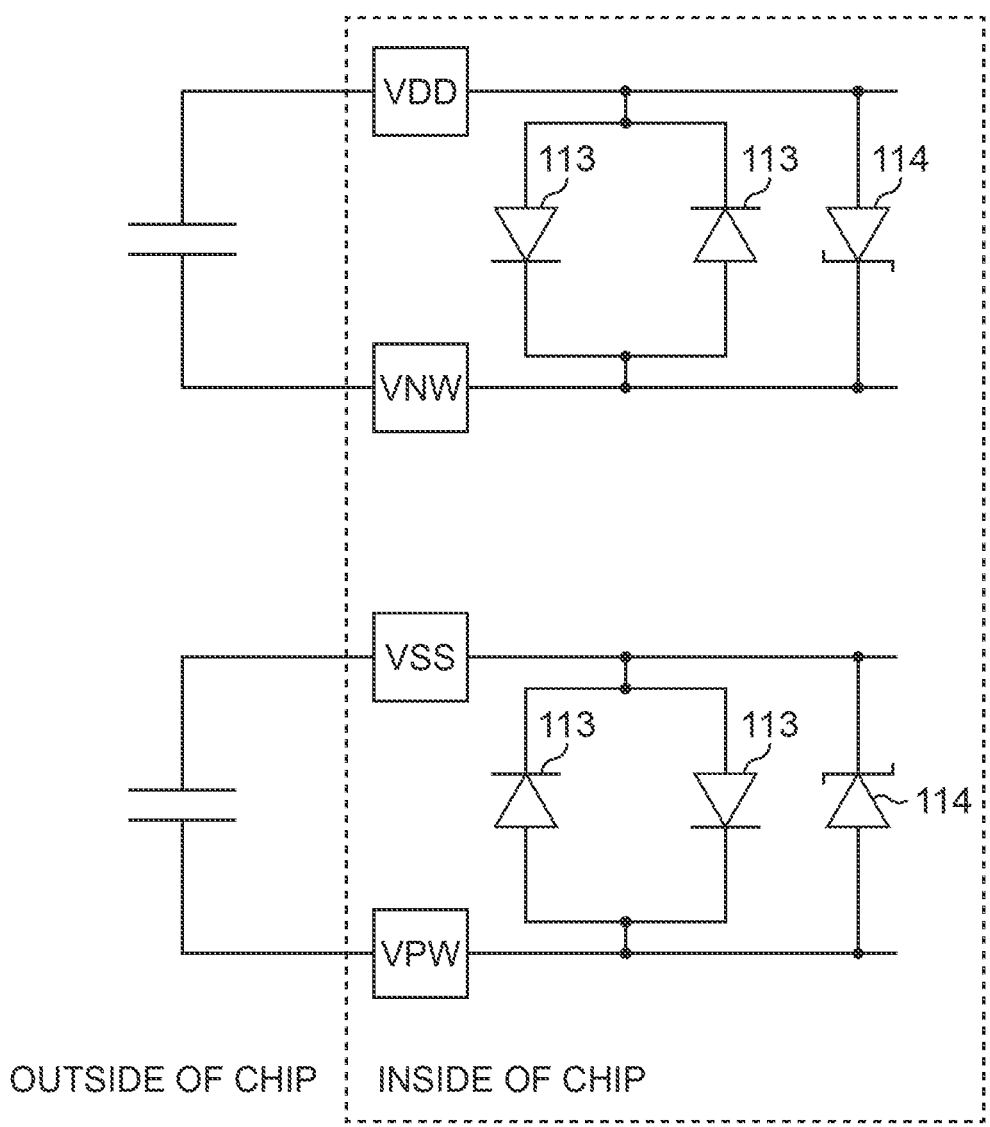
FIG. 8 is a circuit diagram illustrating a first example of a protection circuit.

The LRD 113 and the SBD 114 are circuit elements constituting a protection circuit of the semiconductor device, and for example, as illustrated in FIG. 8, they are inversely connected in parallel (inverse-parallel connection) between a VDD line and a VNW line, and between a VSS line and a VPW line. The VDD line is a power supply voltage line. The VSS line is a reference voltage line. The VNW line is a voltage line connected to the N-well 16 in the region 101p, and a back-bias at a voltage different from the power supply voltage and the reference voltage is applied to the DDC-PMOS transistor 111p via the VNW line. The VPW line is a voltage line connected to the P-well 14 in the region 101n, and a back-bias at a voltage different from the power supply voltage and the reference voltage is applied to the DDC-NMOS transistor 111n via the VPW line.

The LRD 113 is a diode for surge protection, and in this example, the two LRDs 113 inversely connected in parallel constitute a bidirectional diode.

The SBD 114 is a diode for latch-up prevention. In general, a DDC transistor has a large effect on suppressing variation of the threshold voltage due to statistical fluctuations of impurities, but it is not possible to suppress variation of the threshold voltage between chips. The back-bias is applied to the DDC transistor, and thereby, it is possible to suppress the variation of the threshold voltage between chips, but a voltage different from the power supply voltage and the reference voltage is applied to a well, and therefore, a latch-up resistance resulting from noises such as a voltage inversion is lowered. In the embodiment, the SBD 114 is connected between the VDD line and the VNW line, and between the VSS line and the VPW line, and therefore, it is possible to improve the latch-up resistance, and to reduce power consumption of the DDC-NMOS transistor 111n and the DDC-PMOS transistor 111p.

Figure 9:
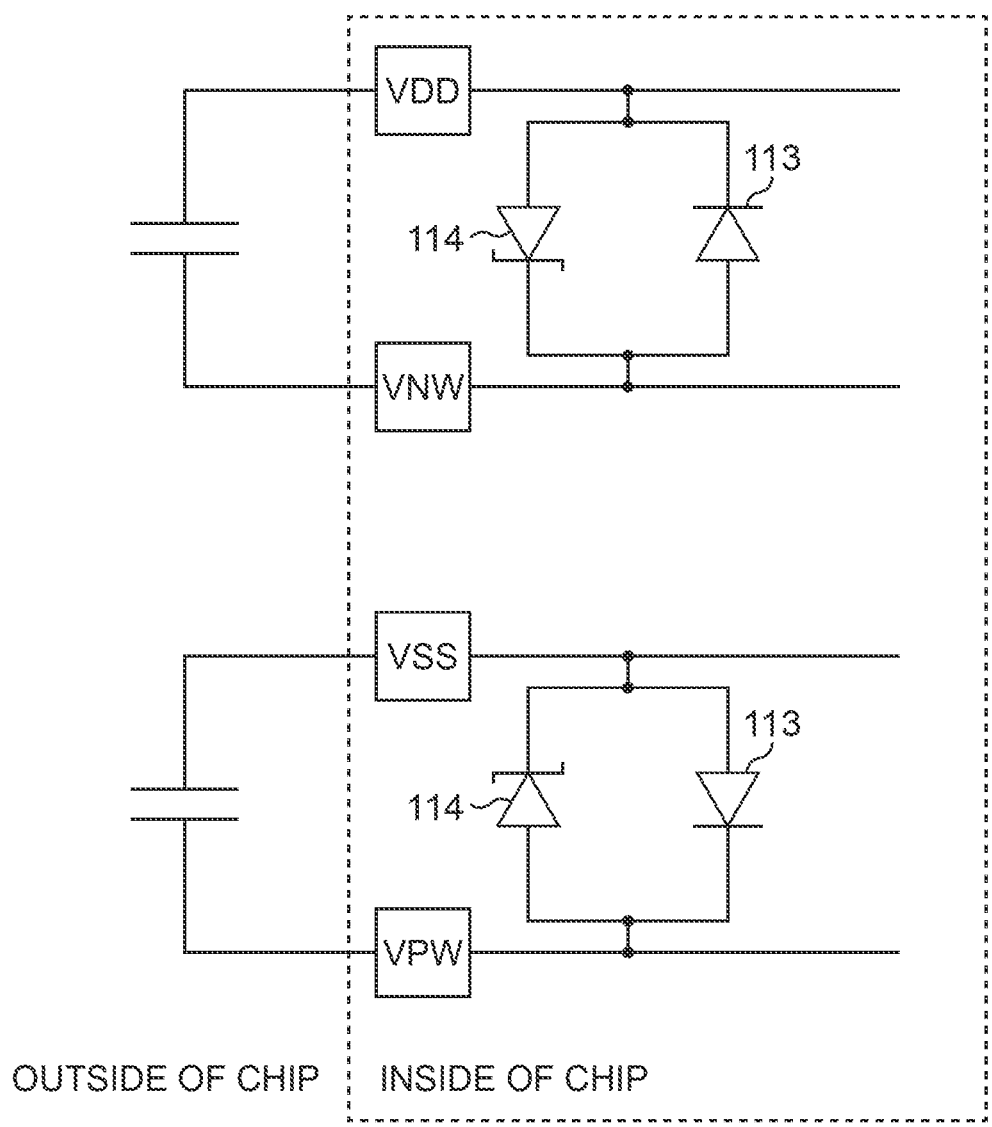
FIG. 9 is a circuit diagram illustrating a second example of a protection circuit.
Figure 10:
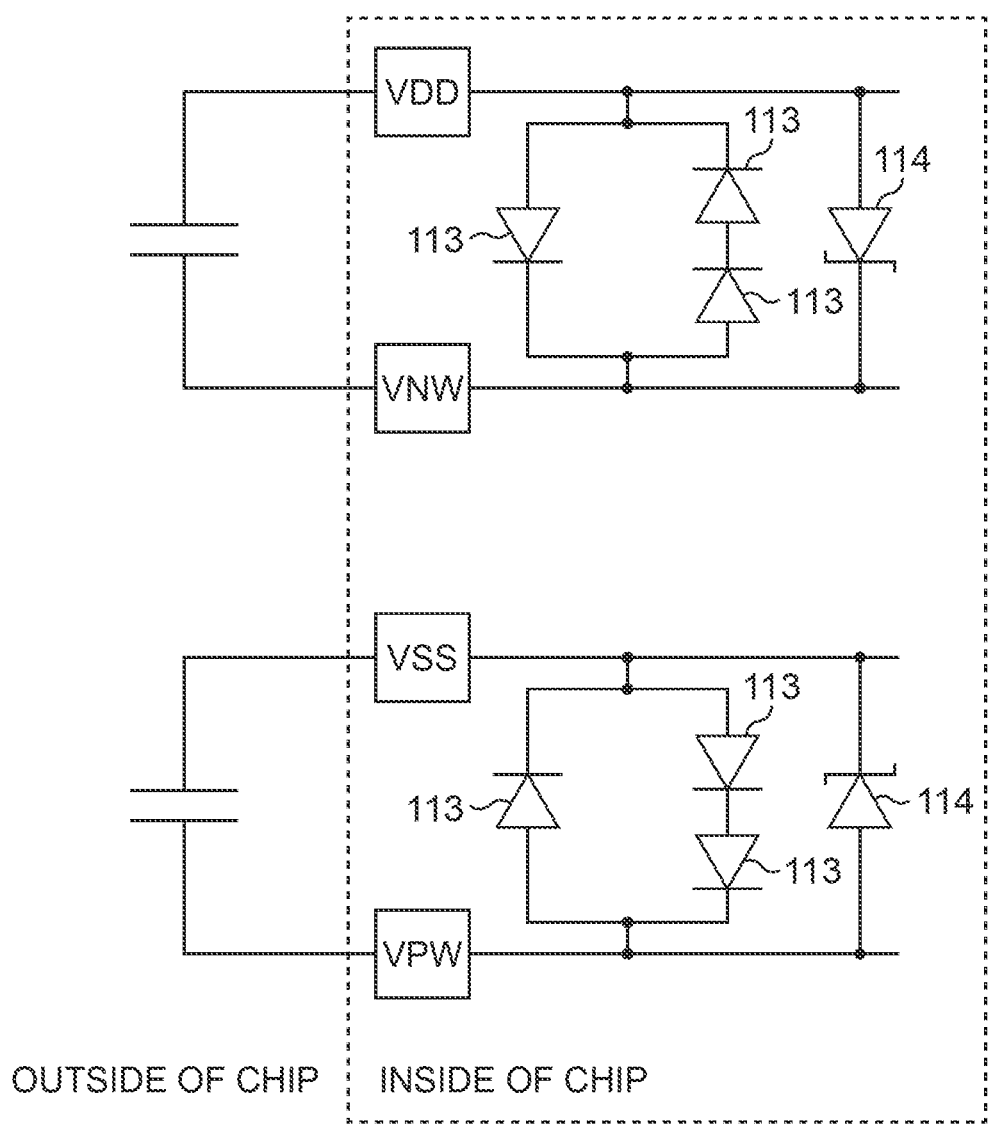
FIG. 10 is a circuit diagram illustrating a third example of a protection circuit.
Figure 14A:
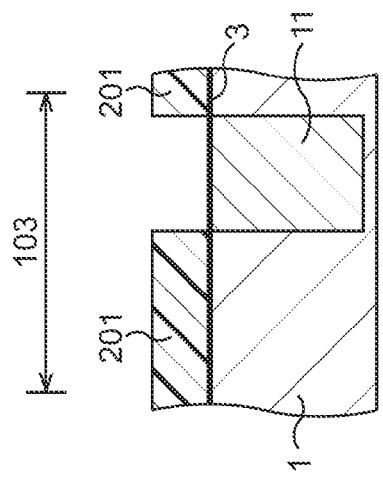
FIGS. 14A to 14D are sectional views illustrating a method of manufacturing the semiconductor device according to the third embodiment in process sequence.
Figure 14C:
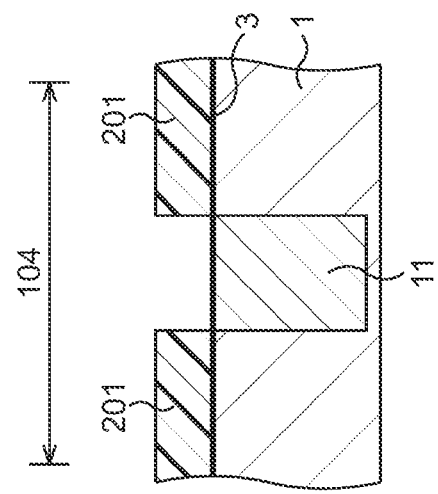
Figure 14B:
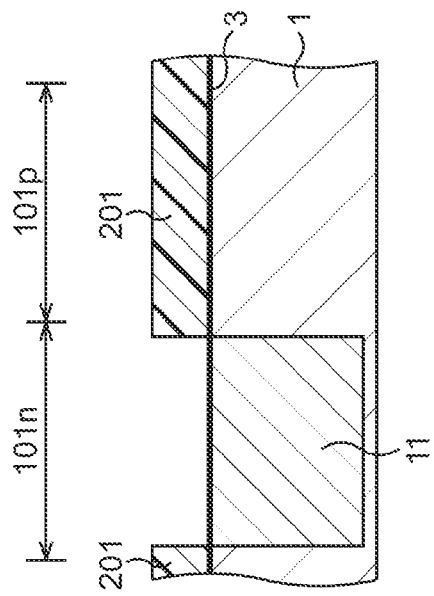
Figure 14D:
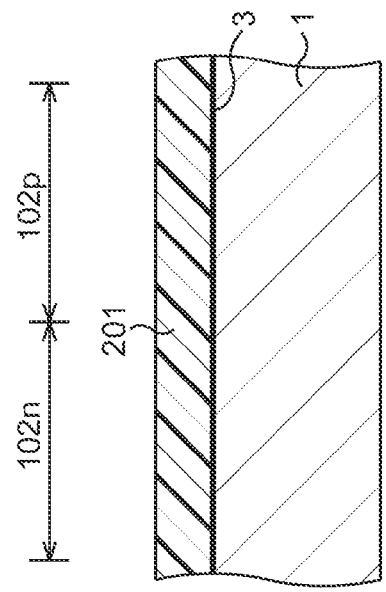
Figure 15A:
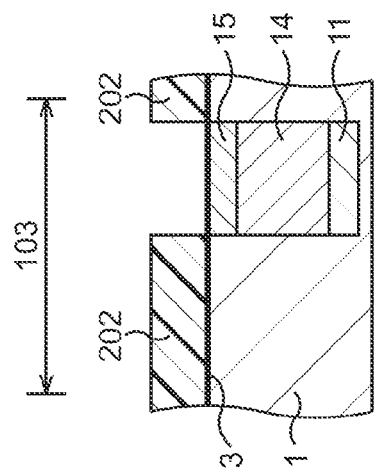
FIGS. 15A to 15D are sectional views illustrating a method of manufacturing the semiconductor device according to the third embodiment in process sequence.
Figure 15B:
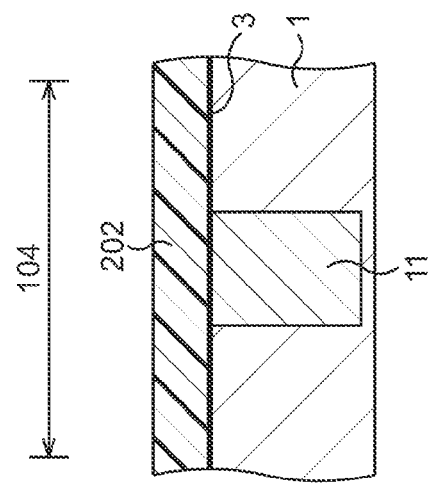
Figure 15C:
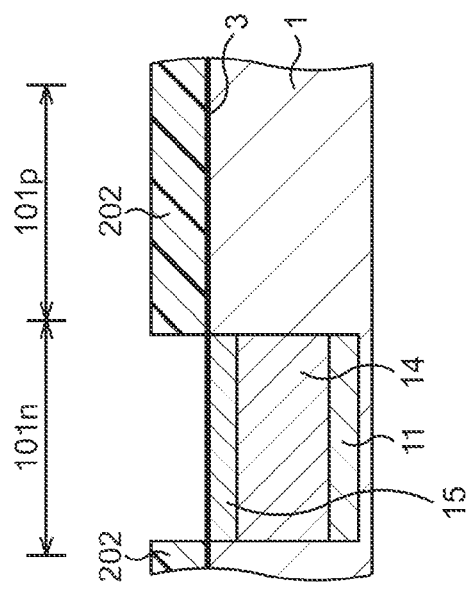
Figure 15D:
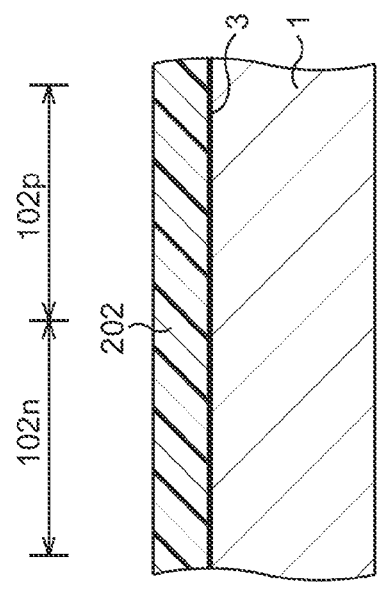
Figure 16C:
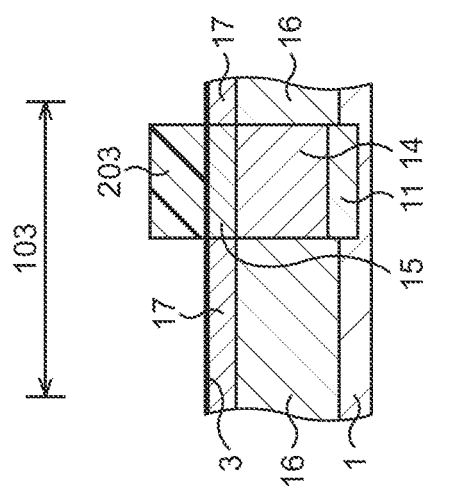
FIGS. 16A to 16D are sectional views illustrating a method of manufacturing the semiconductor device according to the third embodiment in process sequence.
Figure 16D:
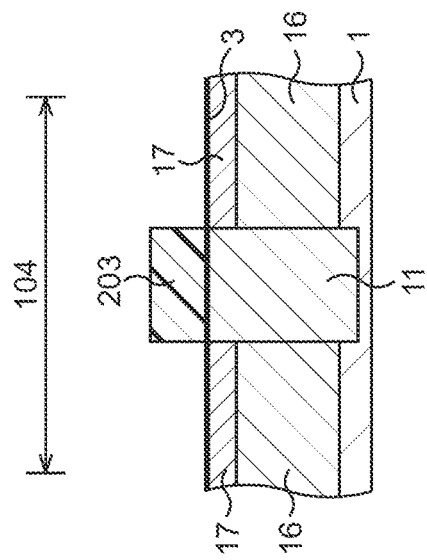
Figure 16A:
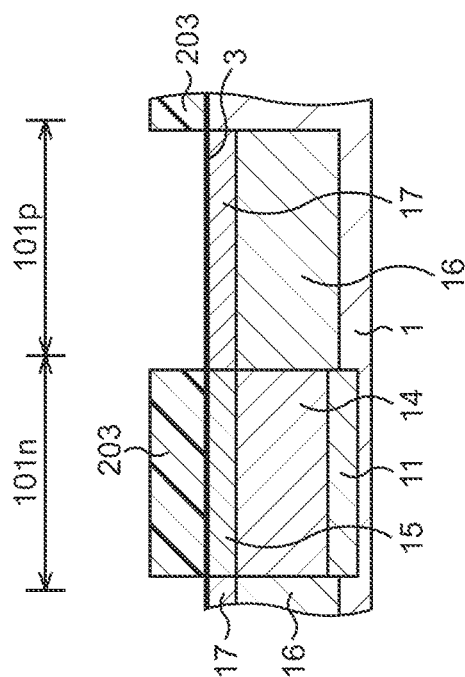
Figure 16B:
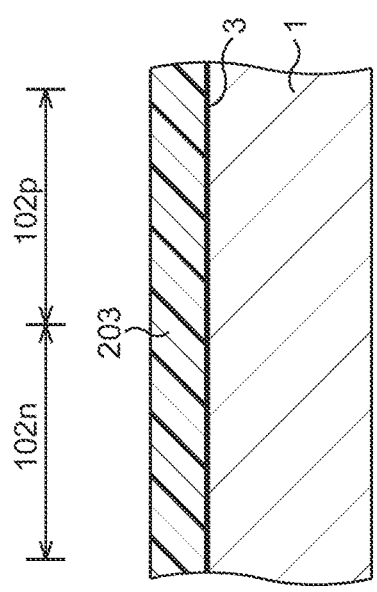
Figure 17A:
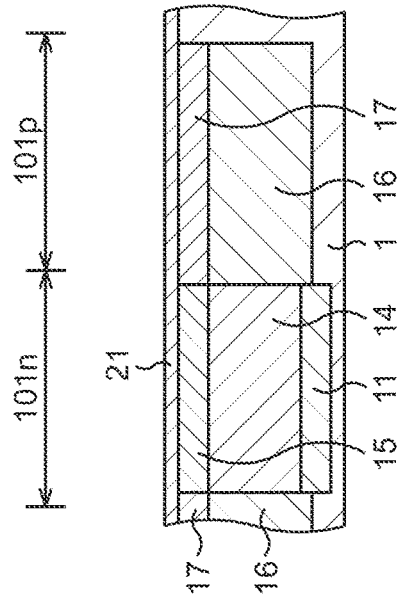
FIGS. 17A to 17D are sectional views illustrating a method of manufacturing the semiconductor device according to the third embodiment in process sequence.
Figure 17B:
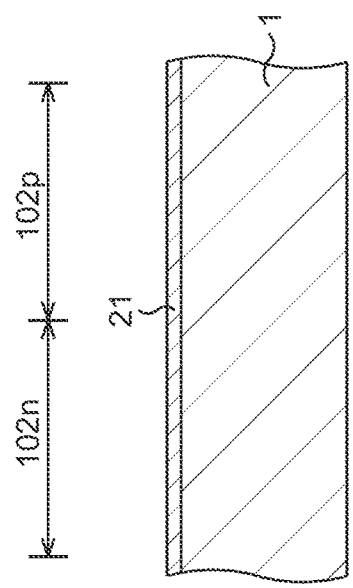
Figure 17C:
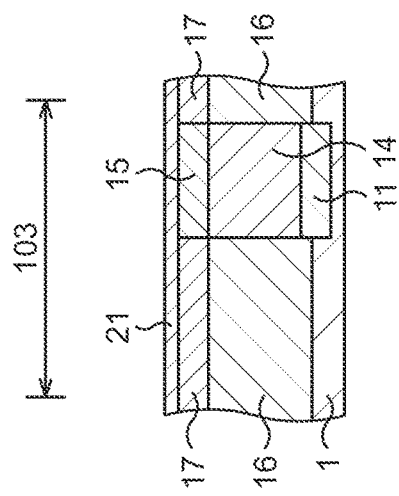
Figure 17D:
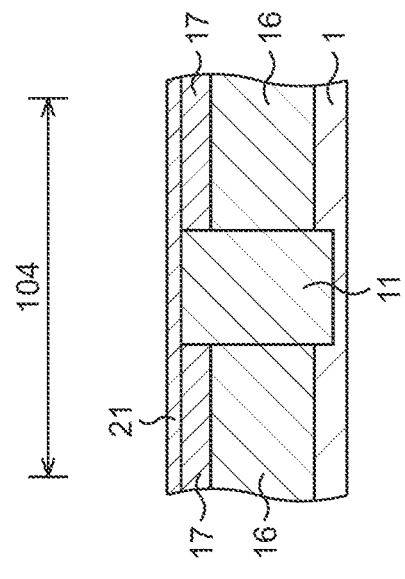
Figure 18A:
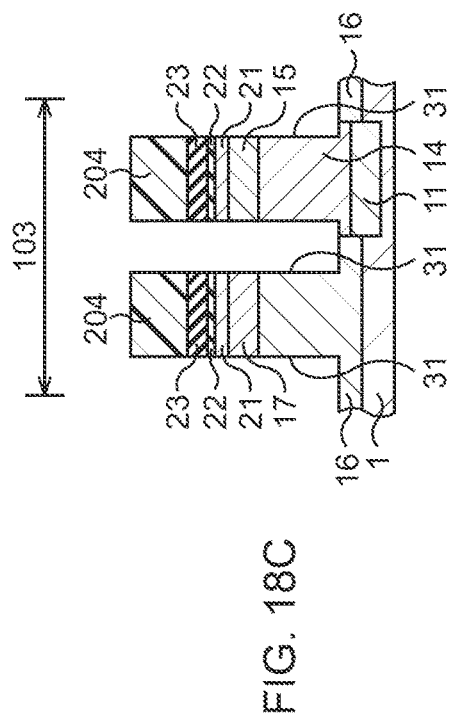
FIGS. 18A to 18D are sectional views illustrating a method of manufacturing the semiconductor device according to the third embodiment in process sequence.
Figure 18C:
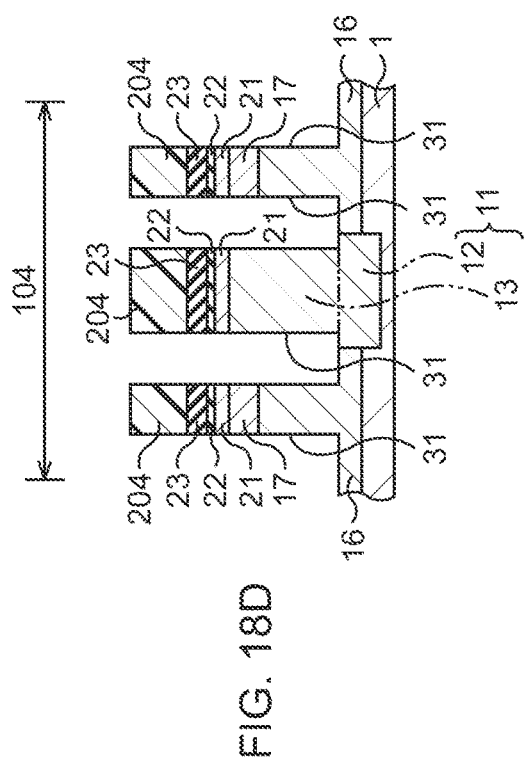
Figure 18B:
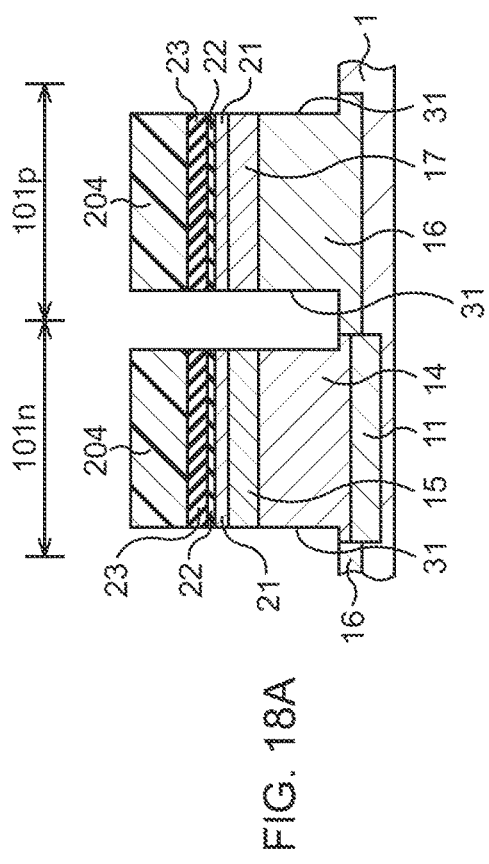
Figure 18D:
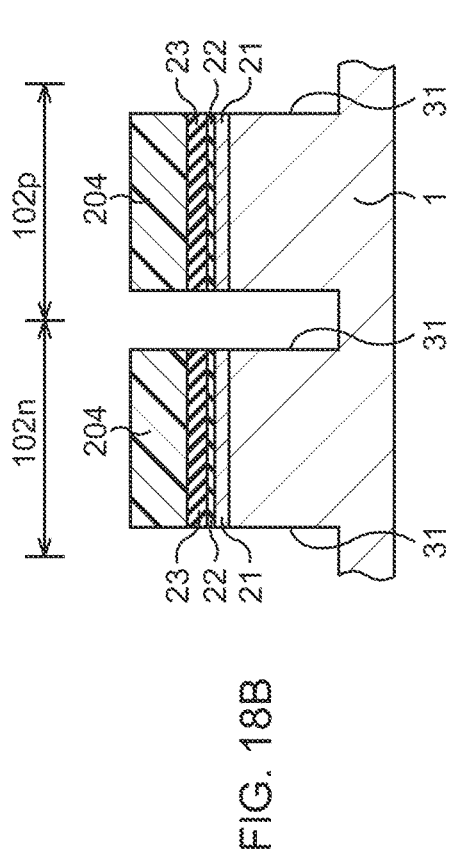
Figure 19C:
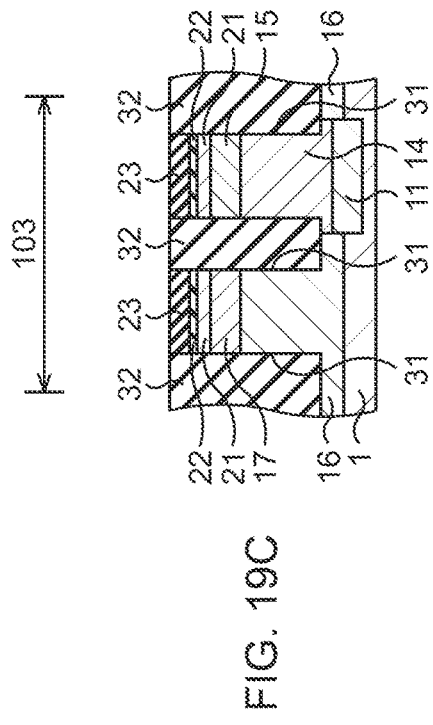
FIGS. 19A to 19D are sectional views illustrating a method of manufacturing the semiconductor device according to the third embodiment in process sequence.
Figure 19D:
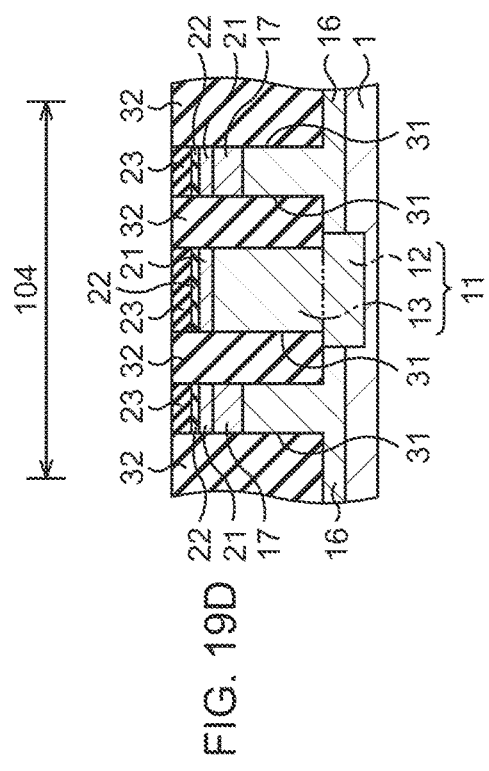
Figure 19A:
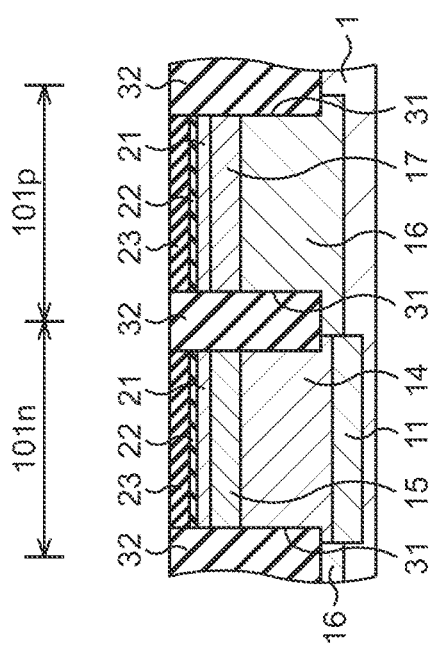
Figure 19B:
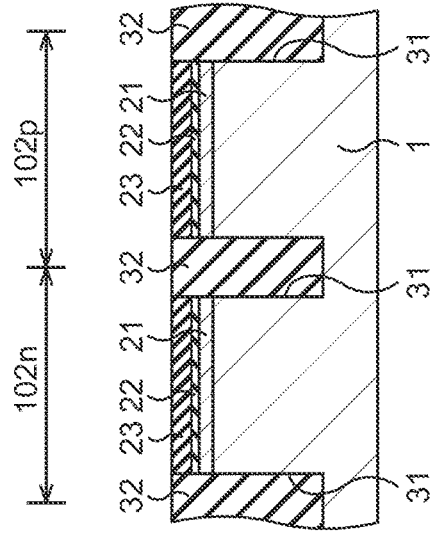
Figure 20C:
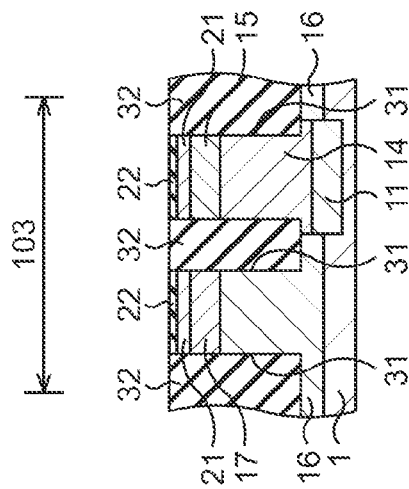
FIGS. 20A to 20D are sectional views illustrating a method of manufacturing the semiconductor device according to the third embodiment in process sequence.
Figure 20D:
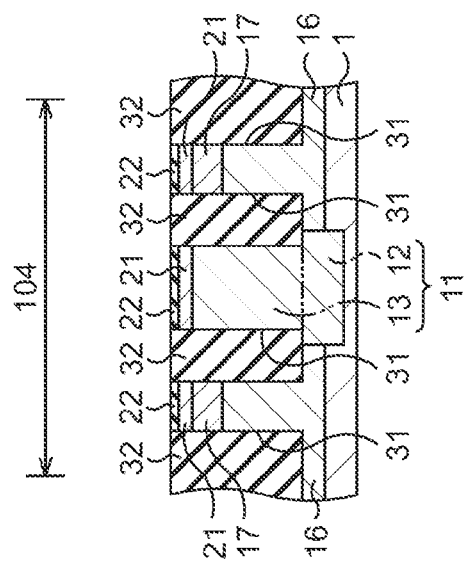
Figure 20A:
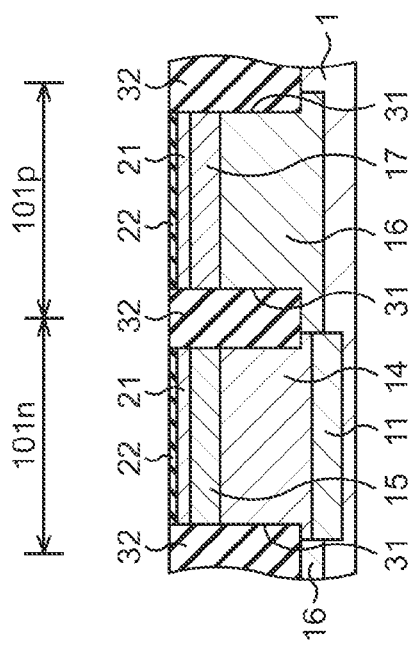
Figure 20B:
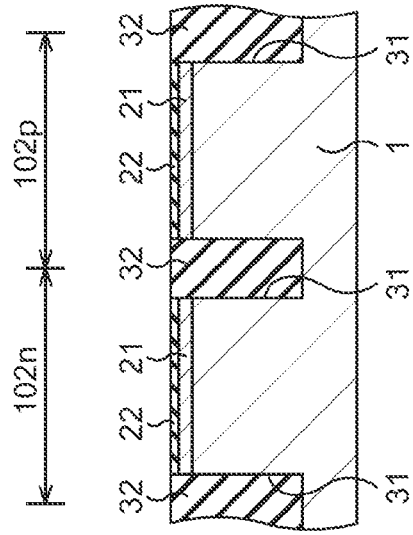
Figure 21A:
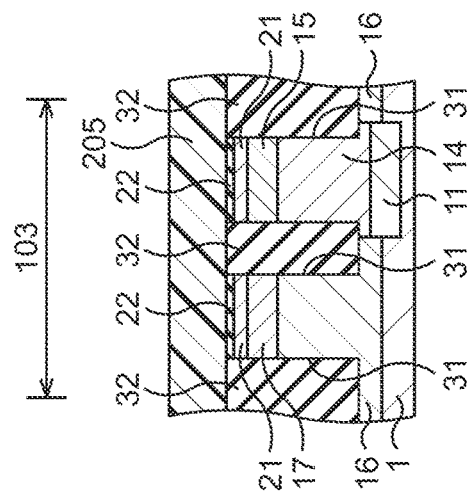
FIGS. 21A to 21D are sectional views illustrating a method of manufacturing the semiconductor device according to the third embodiment in process sequence.
Figure 21C:
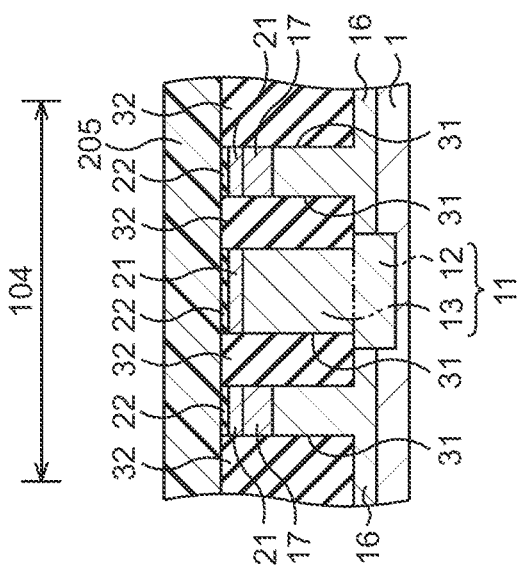
Figure 21B:
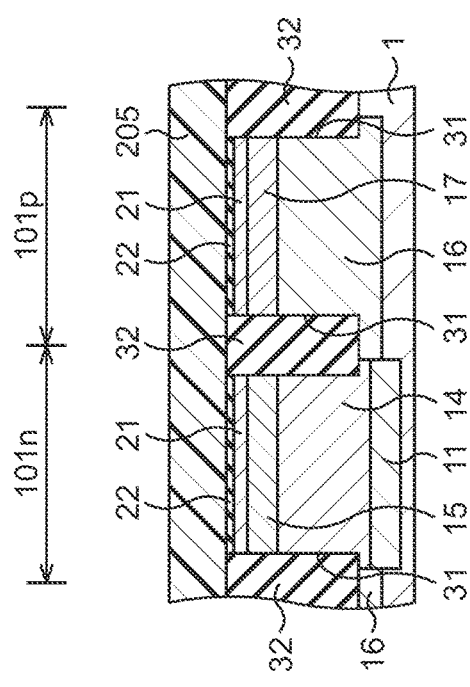
Figure 21D:
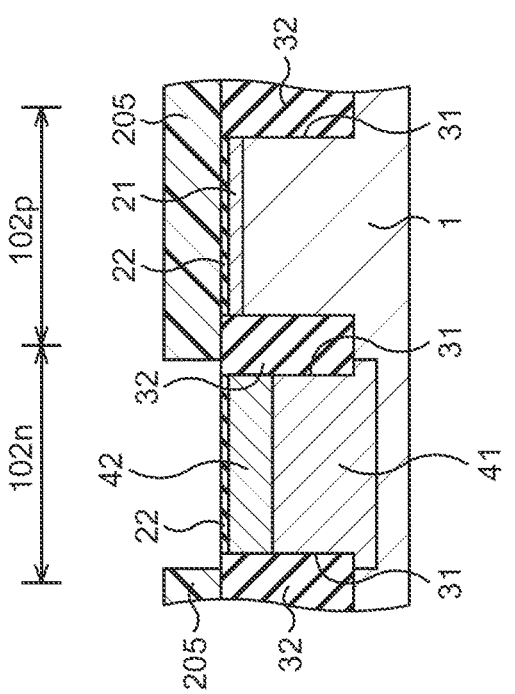
Figure 22A:
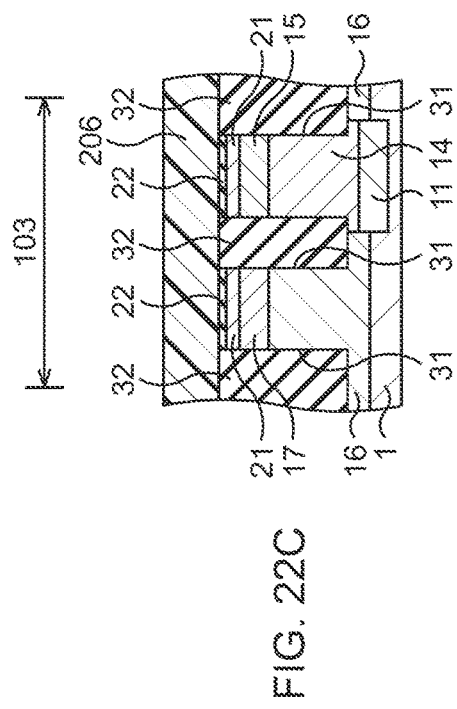
FIGS. 22A to 22D are sectional views illustrating a method of manufacturing the semiconductor device according to the third embodiment in process sequence.
Figure 22C:
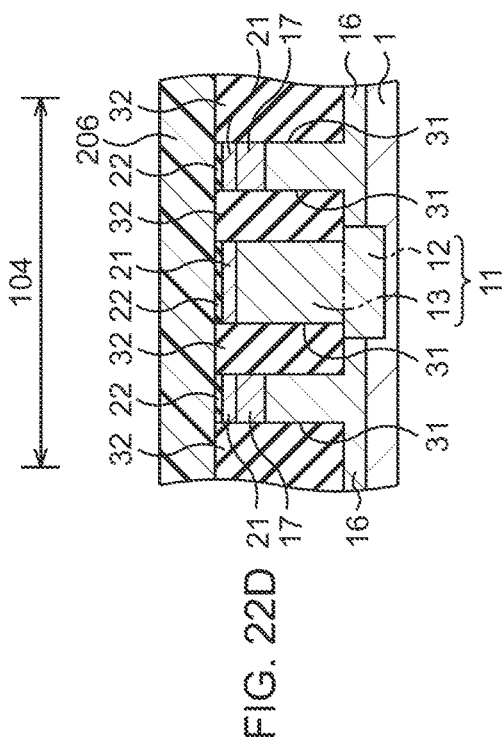
Figure 22B:
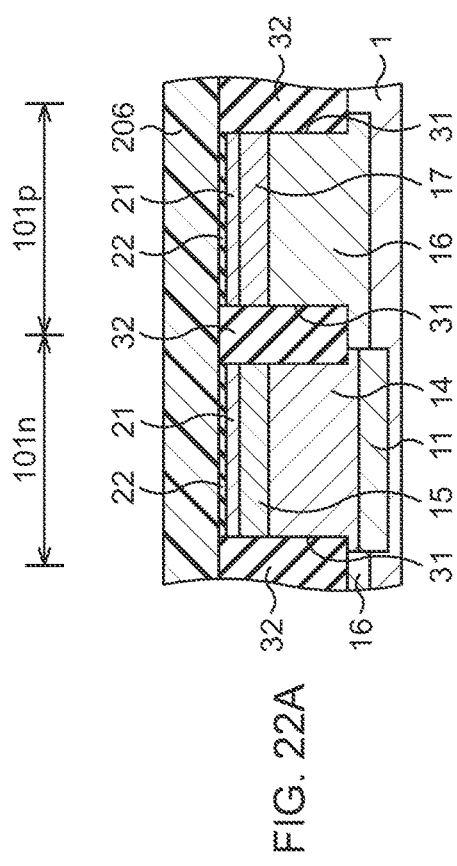
Figure 22D:
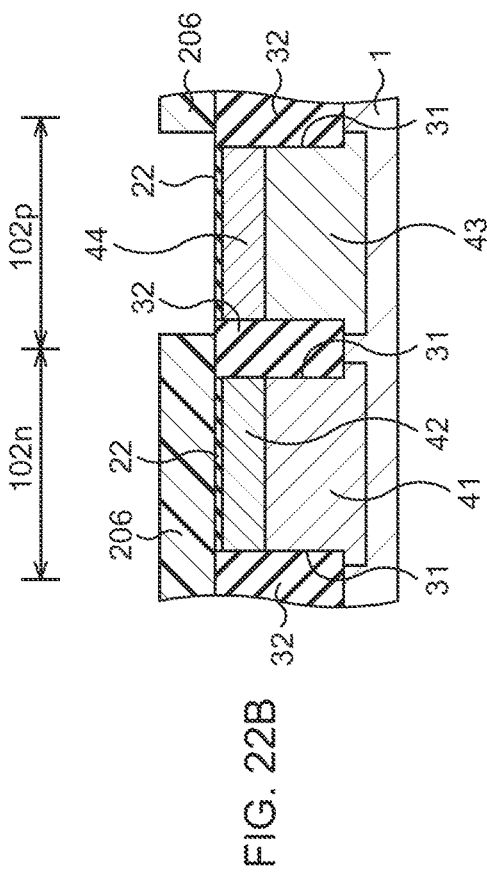
Figure 23A:
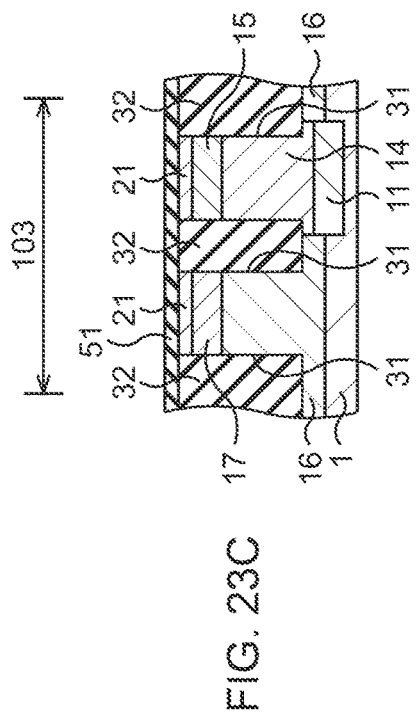
FIGS. 23A to 23D are sectional views illustrating a method of manufacturing the semiconductor device according to the third embodiment in process sequence.
Figure 23B:
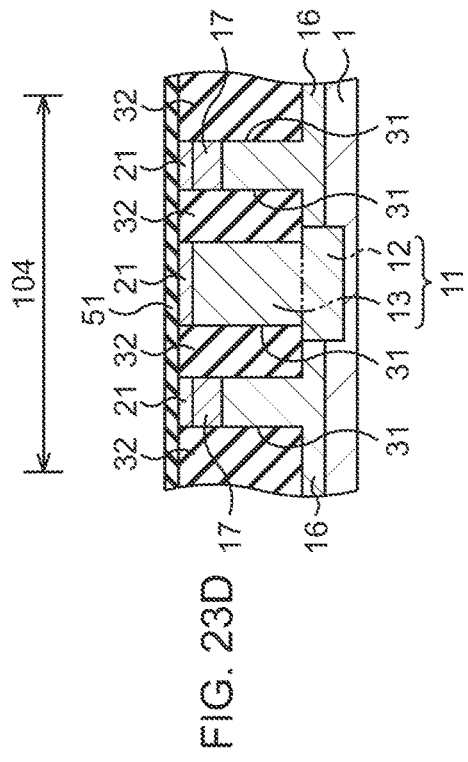
Figure 23C:
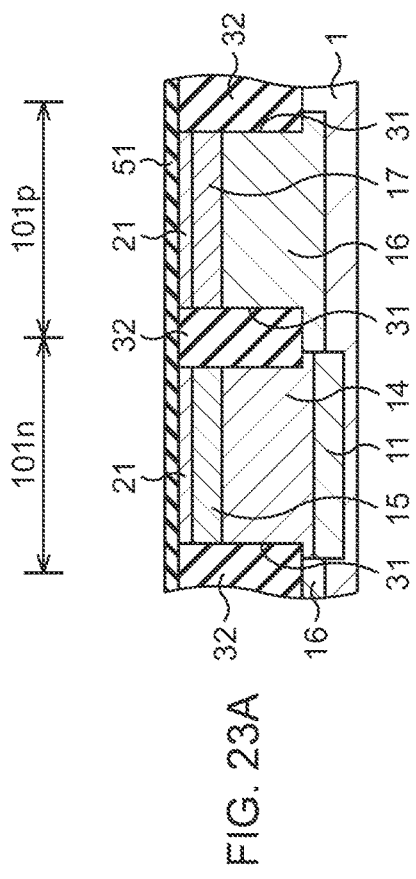
Figure 23D:
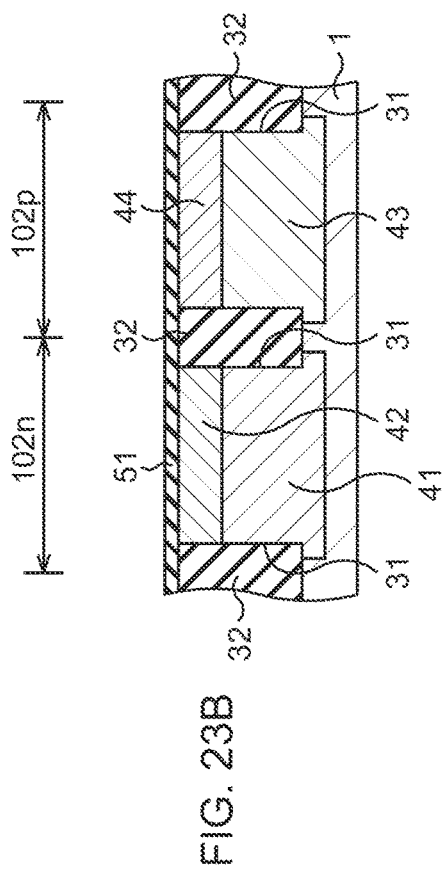
Figure 25A:
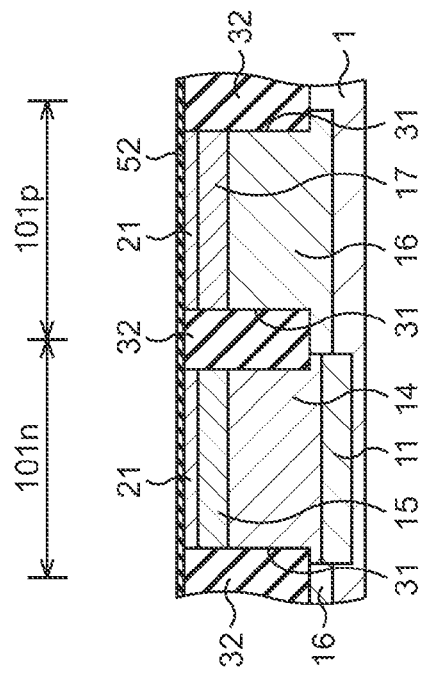
FIGS. 25A to 25D are sectional views illustrating a method of manufacturing the semiconductor device according to the third embodiment in process sequence.
Figure 25B:
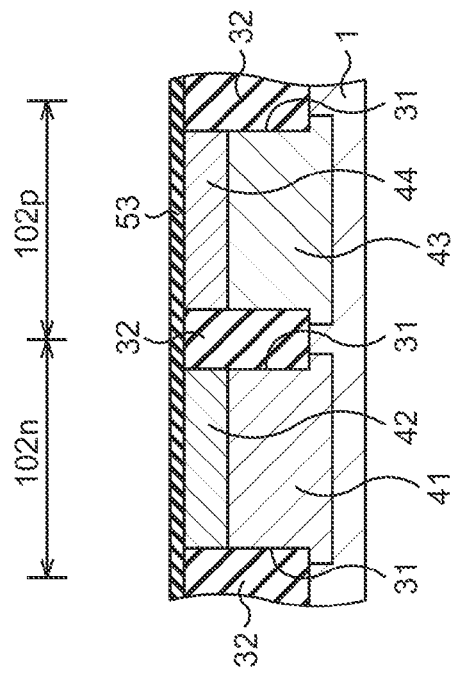
Figure 25C:
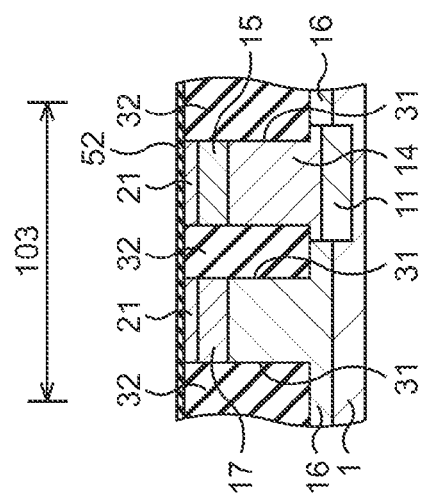
Figure 25D:
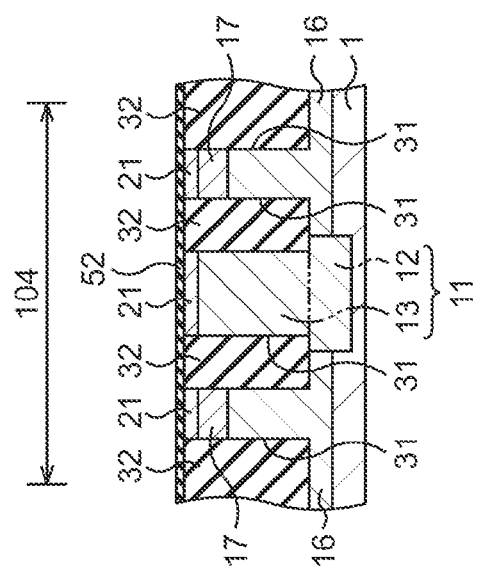
Figure 26A:
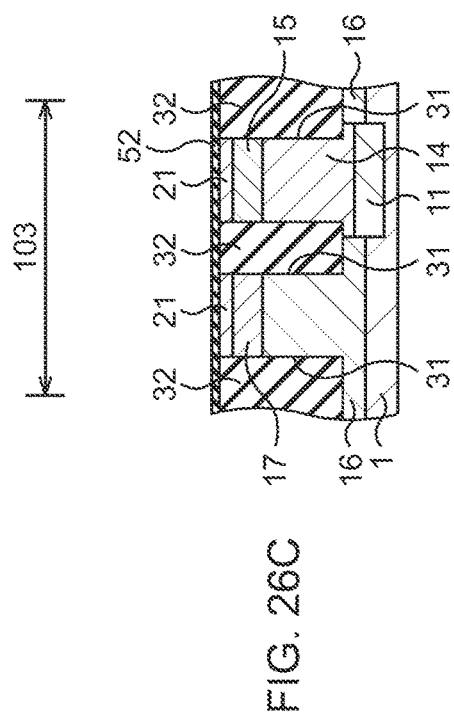
FIGS. 26A to 26D are sectional views illustrating a method of manufacturing the semiconductor device according to the third embodiment in process sequence.
Figure 26B:
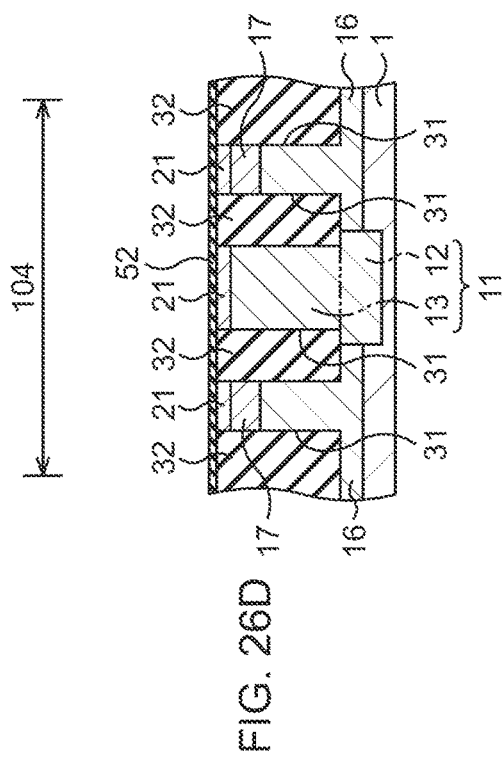
Figure 26C:
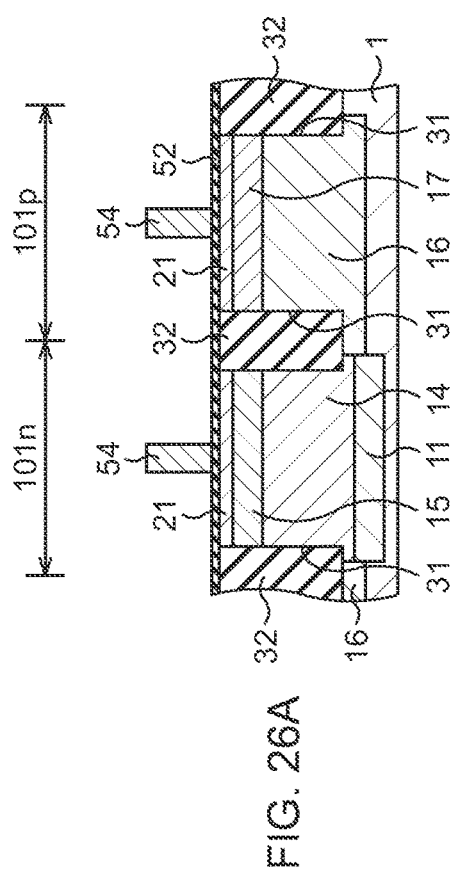
Figure 26D:
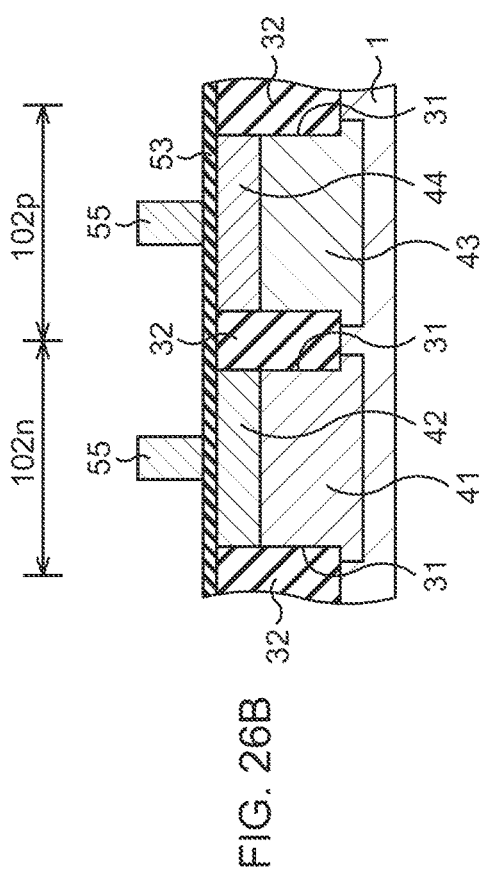
Figure 27A:
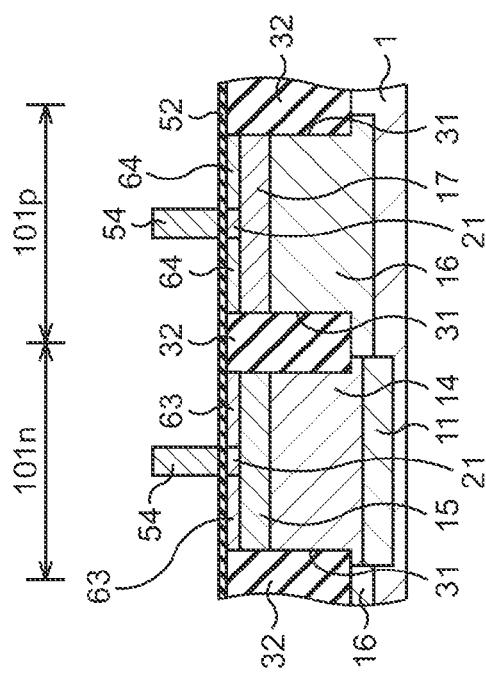
FIGS. 27A to 27D are sectional views illustrating a method of manufacturing the semiconductor device according to the third embodiment in process sequence.
Figure 27B:
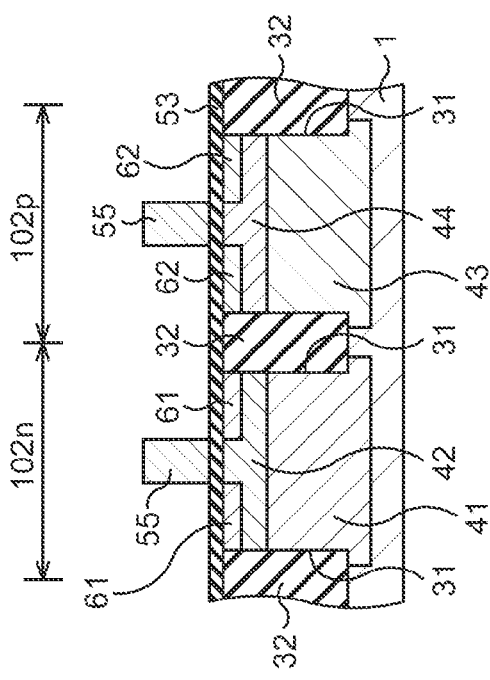
Figure 27C:
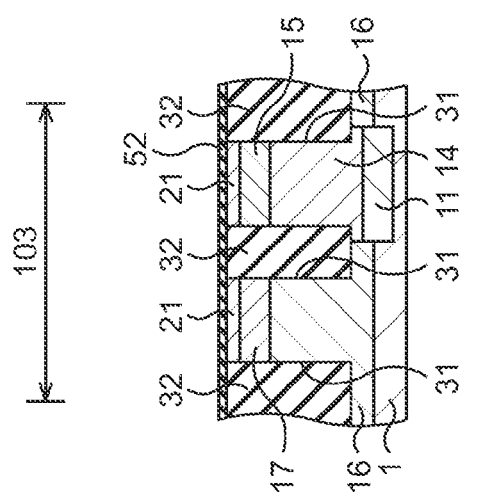
Figure 27D:
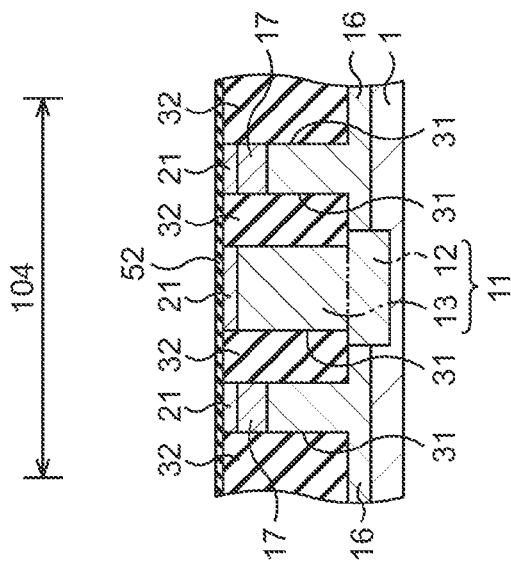
Figure 28A:
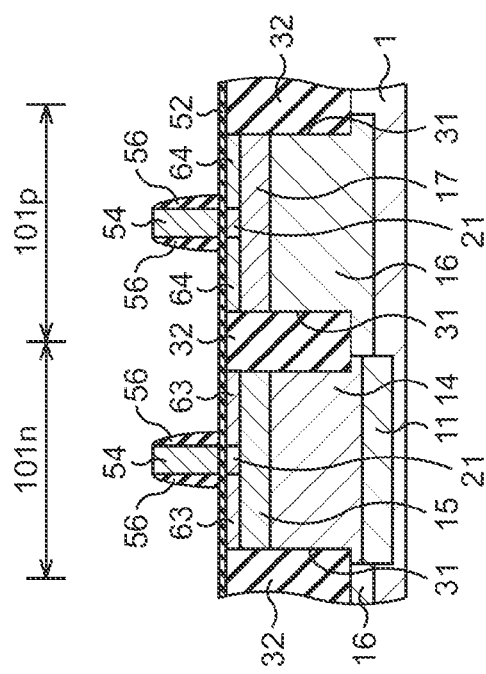
FIGS. 28A to 28D are sectional views illustrating a method of manufacturing the semiconductor device according to the third embodiment in process sequence.
Figure 28B:
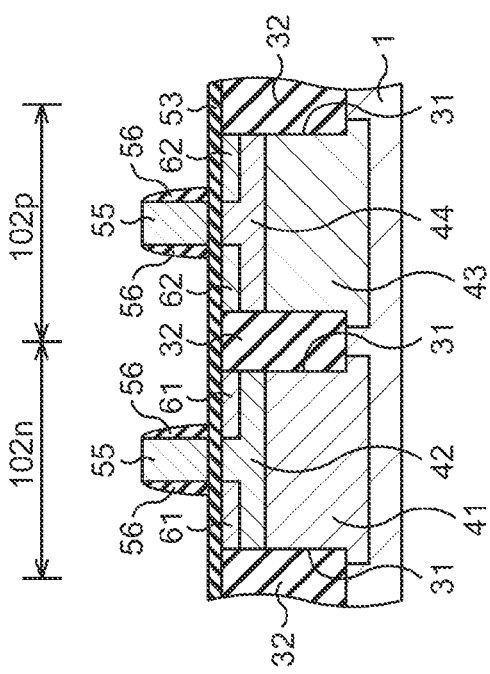
Figure 28C:
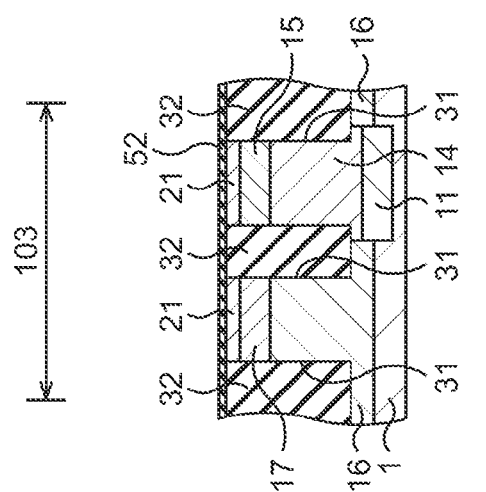
Figure 28D:
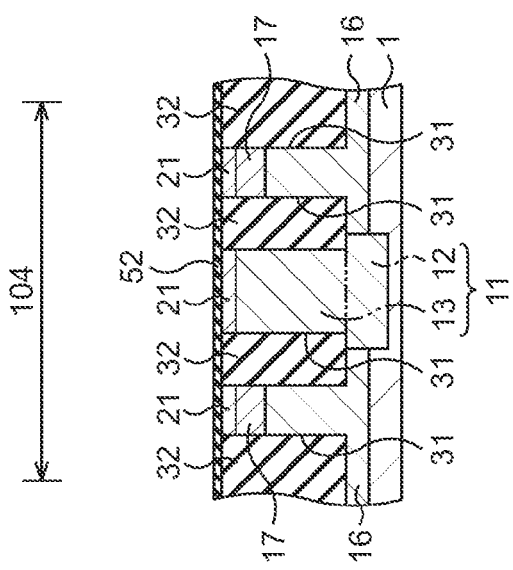
Figure 29A:
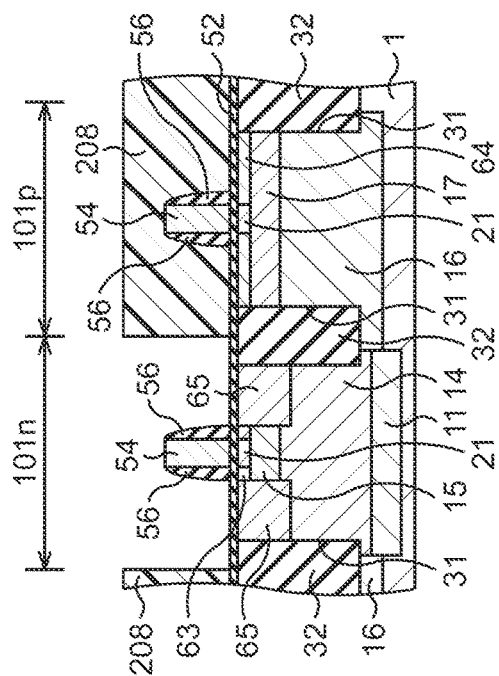
FIGS. 29A to 29D are sectional views illustrating a method of manufacturing the semiconductor device according to the third embodiment in process sequence.
Figure 29B:
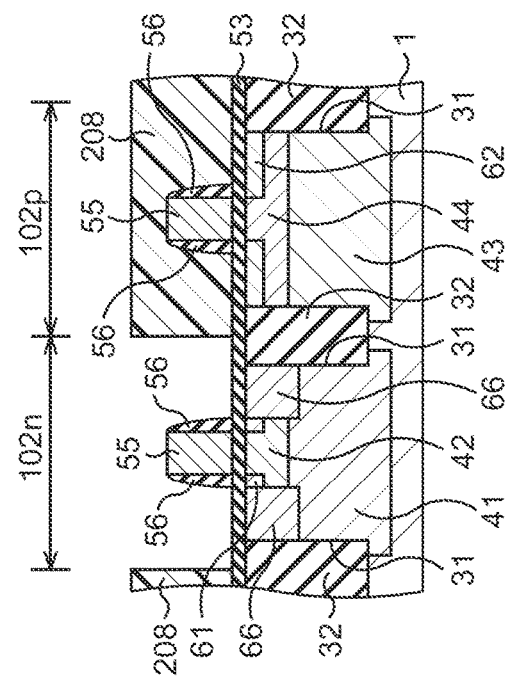
Figure 29C:
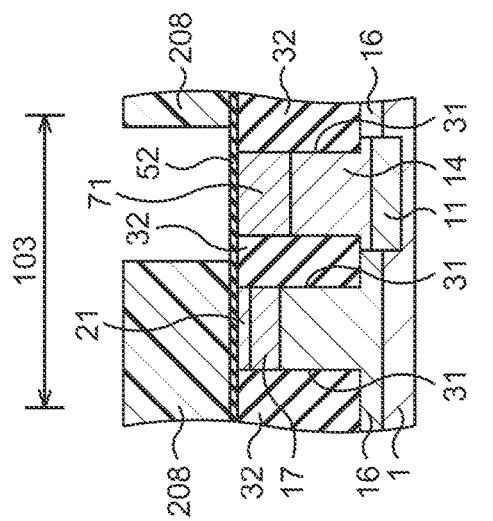
Figure 29D:
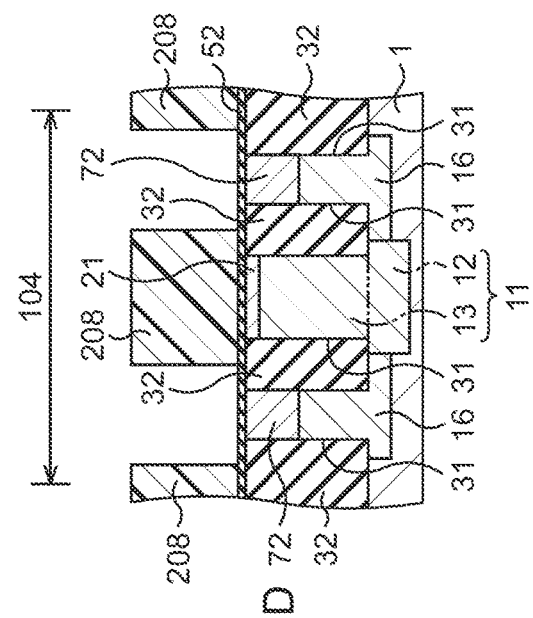
Figure 30A:
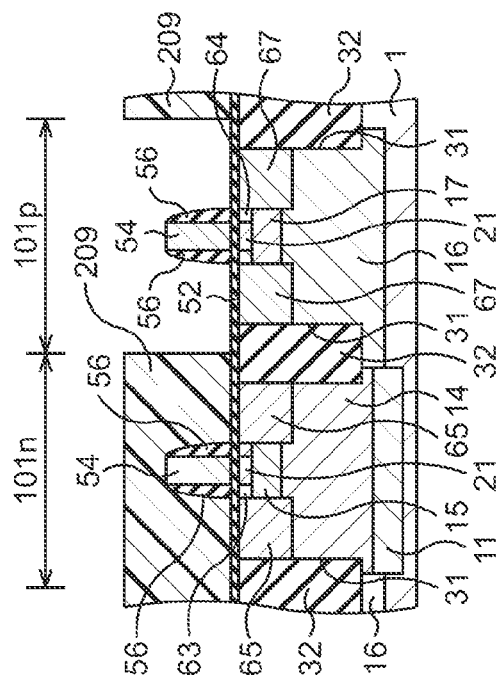
FIGS. 30A to 30D are sectional views illustrating a method of manufacturing the semiconductor device according to the third embodiment in process sequence.
Figure 30B:
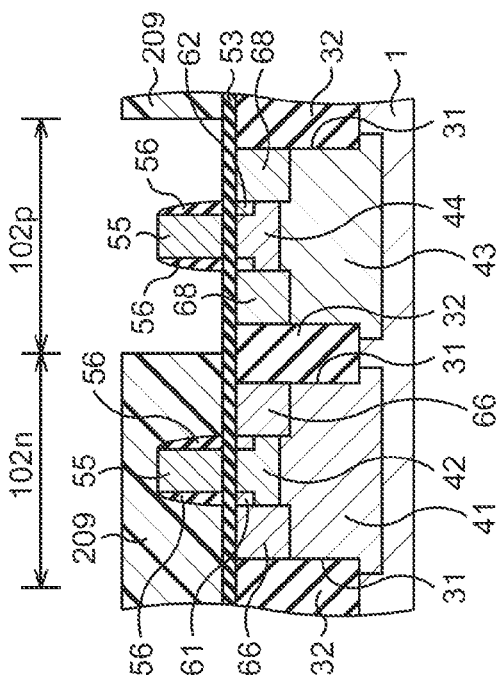
Figure 30C:
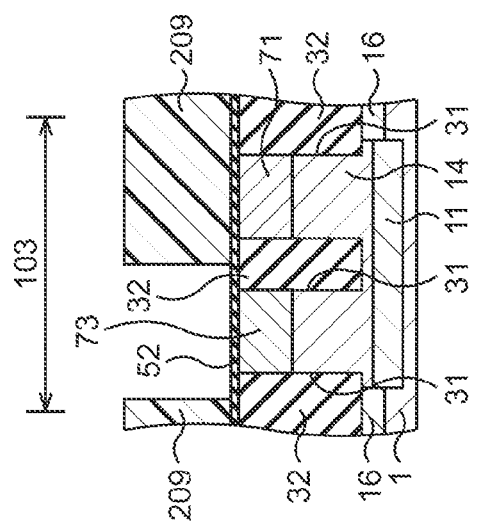
Figure 30D:
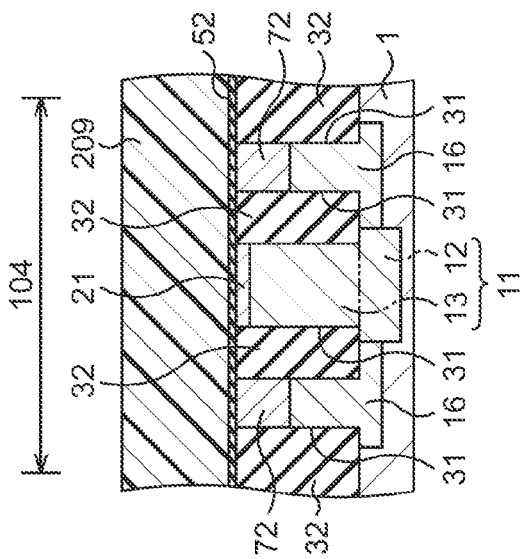
Figure 32A:
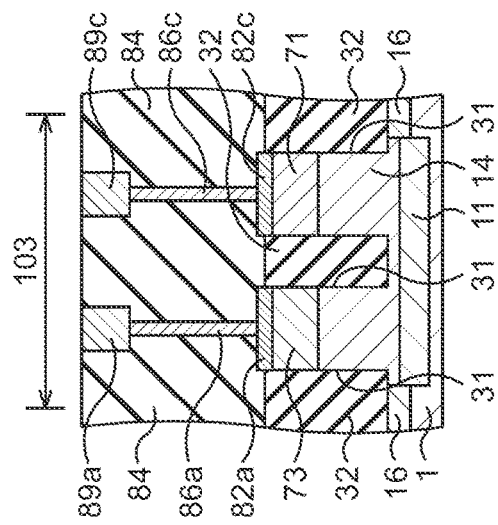
FIGS. 32A to 32D are sectional views illustrating a method of manufacturing the semiconductor device according to the third embodiment in process sequence.
Figure 32C:
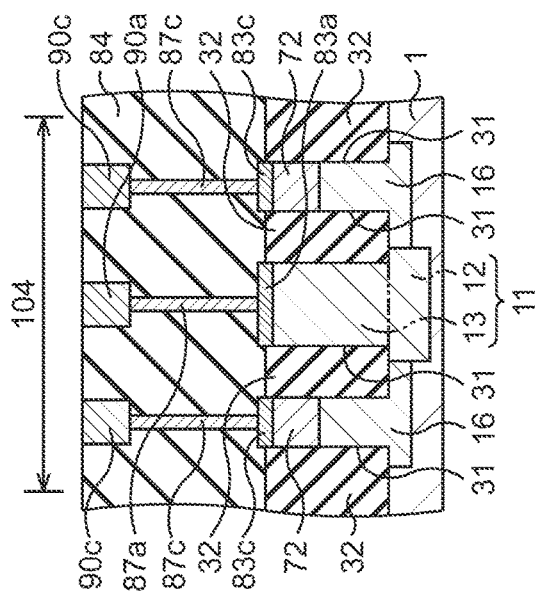
Figure 32B:
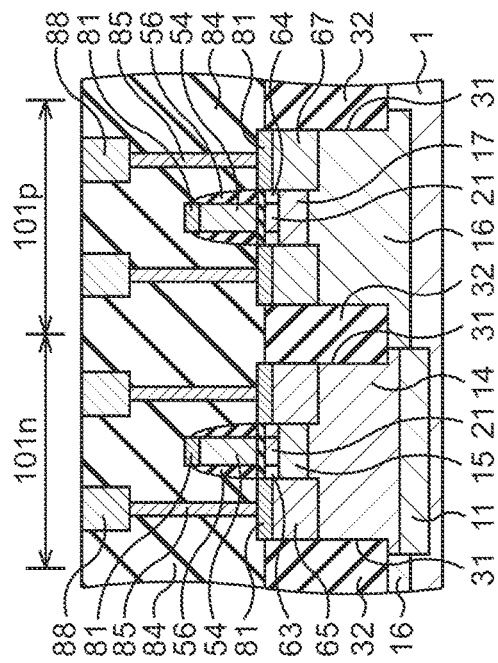
Figure 32D:
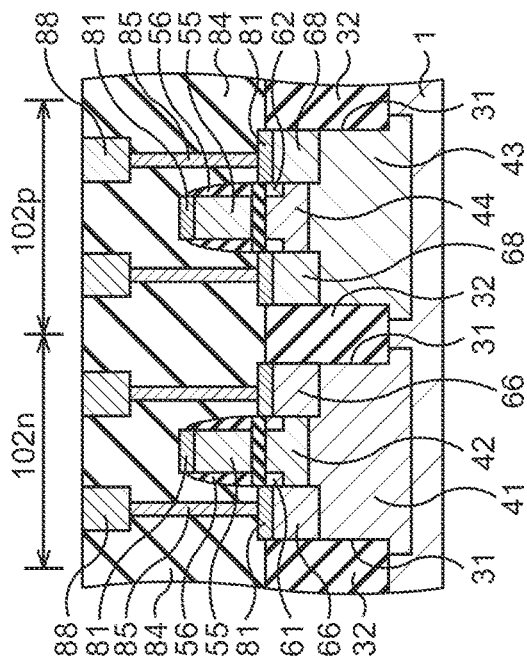

FIG. 9, FIG. 10 and FIG. 11 are views illustrating other examples of protection circuits including the LRD 113 and the SBD 114.

In the example illustrated in FIG. 9, the SBD 114 serves also as the LRD 113 which is connected in the same direction as the SBD 114 in the example illustrated in FIG. 8. The SBD 114 functions as a diode for latch-up prevention, and a parallel connected body of the LRD 113 and the SBD 114 functions as a bidirectional diode for surge protection.

In the example illustrated in FIG. 10, the LRD 113 which is connected in reverse to the SBD 114 in the example illustrated in FIG. 8 has a two-stage configuration. In the example illustrated in FIG. 11, the LRD 113 which is connected in reverse to the SBD 114 in the example illustrated in FIG. 9 has the two-stage configuration. In the example illustrated in FIG. 8 or FIG. 9, a stationary current may flow from the VNW line to the VDD line depending on a voltage applied to the VNW line, and a stationary current may flow from the VSS line to the VPW line depending on a voltage applied to the VPW line. For example, when a voltage which exceeds a threshold voltage of the LRD 113 is applied to the VPW line (for example, −0.6 V), a stationary current flows from the VSS line to the VPW line. On the other hand, in the example illustrated in FIG. 10 or FIG. 11, even when a voltage which exceeds the threshold voltage of the LRD 113 is applied to the VPW line, a stationary current does not flow as long as the voltage does not exceed the double of the threshold voltage of the LRD 113.

The SBD 114 is not necessarily provided both of between the VDD line and the VNW line and between the VSS line and the VPW line, and the SBD 114 may be provided either one of them, for example, only in the protection circuit between the VSS line and the VPW line.

A circuitry of the VSS line and the VPW line in the example illustrated in FIG. 11 may be enabled by connecting two pieces of LRDs 113 and the SBD 114 as, for example, illustrated in FIG. 12.

A SBD for latch-up prevention is sometimes manufactured as a discrete product, and is separately mounted on a circuit board where a semiconductor chip is mounted. However, in this case, the number of components increases to incur a cost increase. Besides, the latch-up may occur even though a Schottky barrier diode is mounted on the circuit board. The present inventors studied hard as for the problem, and it became clear that a loose connection of the semiconductor chip is a cause thereof. An operation test of the semiconductor chip is performed under a state in which the semiconductor chip is plugged in a socket formed on the circuit board, but when there is the loose connection between the socket and the semiconductor chip, the latch-up may occur even though the Schottky barrier diode is mounted.

On the other hand, in the embodiment, the SBD 114 is formed on the semiconductor substrate 1 which is in common with the DDC-NMOS transistor 111*n*, the DDC-PMOS transistor 111*p*, the high-voltage NMOS transistor 112*n* and the high-voltage PMOS transistor 112*p*, and therefore, the above-stated demerit which occurs when the SBD is prepared as an external component does not occur.

Next, a method of manufacturing the semiconductor device according to the third embodiment is described. FIG. 13 to FIG. 32 are sectional views illustrating the method of manufacturing the semiconductor device according to the third embodiment in process sequence. FIGS. 14A to 32A each illustrate the region 101, FIGS. 14B to 32B each illustrate the region 102, FIGS. 14C to 32C each illustrate the region 103, and FIGS. 14D to 32D each illustrate the region 104.

First, as illustrated in FIG. 13, the region 101 where the DDC transistor is to be formed, the region 102 where the high-voltage transistor is to be formed, the region 103 where the PN junction diode is to be formed, and the region 104 where the Schottky barrier diode is to be formed are set at the semiconductor substrate 1 such as a silicon substrate. Further, the region 101*n* where the DDC-NMOS transistor is to be formed and the region 101*p* where the DDC-PMOS transistor is to be formed are set in the region 101, and the region 102*n* where the high-voltage NMOS transistor is to be formed and the region 102*p* where the high-voltage PMOS transistor is to be formed are set in the region 102. Then, an alignment mark 2 is formed at the surface of the semiconductor substrate 1. When the alignment mark 2 is formed, for example, a region where the alignment mark 2 is to be formed is exposed by photolithography, a photoresist film covering the other regions is formed on the semiconductor substrate 1, and the semiconductor substrate 1 is etched using the photoresist film as a mask. Then, the photoresist film is removed by asking, for example. Thereafter, a protective film 3 is formed on the surface of the semiconductor substrate 1. As the protective film 3, a silicon oxide film is formed by, for example, a thermal oxidation method. The alignment mark 2 is formed in a region which is not included in a final product of the semiconductor substrate 1 such as, for example, a scribe region.

Then, as illustrated in FIGS. 14A to 14D, a photoresist film 201 exposing the region 101*n*, a region where the PN junction is to be formed in the region 103, and a region where the Schottky junction is to be formed in the region 104, and covering the other regions such as the region 101*p* and the region 102 is formed on the semiconductor substrate 1 by photolithography. The alignment mark 2 is used for alignment of the photolithography. Thereafter, the N-well 11 is formed at the surface of the semiconductor substrate 1 in the region 101*n*, the region 103 and the region 104 by doping of impurities using the photoresist film 201 as a mask. The N-well 11 is formed such that the peak of the concentration profile of the N-type impurity is deeper than the bottom of the element isolation insulating film 32 formed later. When the N-well 11 is formed, ion-implantation of phosphorus ion (P$^+$) is performed with the acceleration energy at 700 keV, and the dose amount at $1.5 \times 10^{13}$ cm$^{-2}$, for example. Then, the photoresist film 201 is removed by asking, for example.

Then, as illustrated in FIGS. 15A to 15D, a photoresist film 202 exposing the region 101*n* and the region where the PN junction is to be formed in the region 103, and covering the other regions such as the region 101*p*, the region 102 and the region 104 is formed on the semiconductor substrate 1 by photolithography. The alignment mark 2 is used for alignment of the photolithography. Thereafter, the P-well 14 and the P-type impurity layer 15 are formed at a part of the N-well 11 in the region 101*n* and the region 103 by doping of impurities using the photoresist film 202 as a mask. When the P-well 14 is formed, ion-implantation of boron ion (B$^+$) is performed from four directions inclined relative to a substrate normal direction with the acceleration energy at 135 keV and the dose amount at $1.0 \times 10^{13}$ cm$^{-2}$, for example. When the P-type impurity layer 15 is formed, ion-implantation of germanium ion (Ge$^+$) is performed with the acceleration energy at 30 keV and the dose amount at $5 \times 10^{14}$ cm$^{-2}$, ion-implantation of carbon ion (C$^+$) is performed with the acceleration energy at 5 keV and the dose amount at $5 \times 10^{14}$ cm$^{-2}$, ion-implantation of the boron ion is performed with the acceleration energy at 10 keV and the dose amount at $1.8 \times 10^{13}$ cm$^{-2}$, ion-implantation of boron fluoride ion (BF$_2^+$) is performed with the acceleration energy at 25 keV and the dose amount at $6 \times 10^{12}$ cm$^{-2}$, and ion-implantation of the boron fluoride ion (BF$_2^+$) is performed with the acceleration energy at 10 keV and the dose amount at $2.3 \times 10^{12}$ cm$^{-2}$, for example. Then, the photoresist film 202 is removed by asking, for example. Germanium functions to prevent channeling of the boron ion by amorphousizing the semiconductor substrate 1, and to increase probability in which carbon is disposed at a lattice point by amorphousizing the semiconductor substrate 1. The carbon disposed at the lattice point functions to suppress diffusion of boron. From the viewpoint as stated above, germanium is ion-implanted prior to carbon and boron. The P-well 14 is desirably formed prior to the P-type impurity layer 15.

Then, as illustrated in FIGS. 16A to 16D, a photoresist film 203 exposing a region around the P-well 14, a region around the N-well 11, and the region 101p, and covering the other regions such as the region 102, the region where the P-well 14 exists, and the region where the N-well 11 exists is formed on the semiconductor substrate 1 by photolithography. The alignment mark 2 is used for alignment of the photolithography. Thereafter, the N-well 16 and the N-type impurity layer 17 are formed at the surface of the semiconductor substrate 1 in the region 101n, the region 101p, the region 103 and the region 104 by doping of impurities with the photoresist film 203 as a mask. When the N-well 16 is formed, ion-implantation of the phosphorous ion is performed from the four directions inclined relative to the substrate normal direction with the acceleration energy at 330 keV and the dose amount at $7.5 \times 10^{12}$ cm$^{-2}$, ion-implantation of antimony ion (Sb$^+$) is performed with the acceleration energy at 80 keV and the dose amount at $1.2 \times 10^{13}$ cm$^{-2}$, and ion-implantation of the antimony ion is performed with the acceleration energy at 130 keV and the dose amount at $6 \times 10^{12}$ cm$^{-2}$, for example. When the N-type impurity layer 17 is formed, ion-implantation of the antimony ion is performed with the acceleration energy at 20 keV and the dose amount at $6 \times 10^{12}$ cm$^{-2}$, for example. Then, the photoresist film 203 is removed by asking, for example.

Then, a heat treatment is performed in an inert atmosphere, and thereby, damages generated in the semiconductor substrate 1 during the ion-implantations are recovered, and the implanted ions are activated. At this time, for example, an atmosphere is a nitrogen atmosphere, a substrate temperature is 600° C., and a time period is 150 seconds. Thereafter, as illustrated in FIGS. 17A to 17D, the protective film 3 is removed. The protective film 3 may be removed by wet etching using a hydrofluoric acid aqueous solution, for example. Subsequently, the non-doped epitaxial silicon layer 21 is formed on the semiconductor substrate 1. The epitaxial silicon layer 21 may be formed by a chemical vapor deposition (CVD) method, and a thickness thereof is 25 nm, for example.

Then, as illustrated in FIGS. 18A to 18D, a silicon oxide film 22 is formed over a surface of the epitaxial silicon layer 21, and a silicon nitride film 23 is formed over the silicon oxide film 22. The silicon oxide film 22 may be formed by wet oxidizing a surface of the epitaxial silicon layer 21 under a reduced pressure by an ISSG (in-situ steam generation) oxidation method, for example, and a thickness thereof is 3 nm, for example. At this time, for example, a substrate temperature is 810° C., and a time period is 20 seconds. The silicon nitride film 23 may be formed by a reduced pressure CVD method, for example, and a thickness thereof is 80 nm, for example. At this time, for example, a substrate temperature is 700° C., and a time period is 150 minutes. Thereafter, a photoresist film 204 exposing an element isolation region is formed on the silicon nitride film 23 by photolithography. The alignment mark 2 is used for alignment of the photolithography. Subsequently, an element isolation trench 31 is formed in the element isolation region. When the element isolation trenches 31 are formed, the anisotropic etching of the silicon nitride film 23, the silicon oxide film 22, the epitaxial silicon layer 21, and the semiconductor substrate 1 is performed using the photoresist film 204 as a mask. In this anisotropic etching, for example, dry etching is performed. Then, the photoresist film 204 is removed by asking, for example.

Then, as illustrated in FIGS. 19A to 19D, the element isolation insulating film 32 is formed in the element isolation trenche 31. When the element isolation insulating film 32 is formed, first, a silicon oxide film with a thickness of, for example, 10 nm is formed as a liner film at an inner surface of the element isolation trench 31 by thermally oxidizing the surfaces of the epitaxial silicon layer 21 and the semiconductor substrate 1. A substrate temperature at this time is 650° C., for example. Thereafter, a silicon oxide film with a thickness of, for example, 475 nm is deposited by, for example, a high-density plasma CVD method, to thereby embed the element isolation trench 31 with the silicon oxide film 31. Subsequently, a silicon oxide film on the silicon nitride film 23 is removed by, for example, a chemical mechanical polishing (CMP) method. The element isolation insulating film 32 having so-called an STI (shallow trench isolation) structure is thereby formed.

Then, as illustrated in FIGS. 20A to 20D, the element isolation insulating film 32 is etched for, for example, approximately 50 nm by wet etching using the hydrofluoric acid aqueous solution with the silicon nitride film 23 as a mask, for example. A height of the surface of the epitaxial silicon layer 21 and a height of the surface of the element isolation insulating film 32 become nearly equal by this etching under a state when the semiconductor device is completed. Thereafter, the silicon nitride film 23 is removed by wet etching using hot phosphoric acid, for example.

Then, as illustrated in FIGS. 21A to 21D, a photoresist film 205 exposing the region 102n and covering the other regions such as the region 101, the region 102p, the region 103, and the region 104 is formed on the silicon oxide film 22 and the element isolation insulating film 32 by photolithography. The alignment mark 2 is used for alignment of the photolithography. Thereafter, the P-well 41 is formed in the semiconductor substrate 1, and the P-type impurity layer 42 is formed in the semiconductor substrate 1 and the epitaxial silicon layer 21 in the region 102n by doping of impurities using the photoresist film 205 as a mask. When the P-well 41 is formed, ion-implantation of the boron ion is performed from four directions inclined relative to a substrate normal direction with the acceleration energy at 150 keV and the dose amount at $7.5 \times 10^{12}$ cm$^{-2}$, for example. When the P-type impurity layer 42 is formed, ion-implantation of the boron fluoride ion is performed with the acceleration energy at 5 keV and the dose amount at $3.2 \times 10^{12}$ cm$^{-2}$, for example. Then, the photoresist film 205 is removed by asking, for example.

Then, as illustrated in FIGS. 22A to 22D, a photoresist film 206 exposing the region 102p and covering the other regions such as the region 101, the region 102n, the region 103, and the region 104 is formed on the silicon oxide film 22 and the element isolation insulating film 32 by photolithography. The alignment mark 2 is used for alignment of the photolithography. Thereafter, the N-well 43 is formed in the semiconductor substrate 1, and the N-well 43 and the N-type impurity layer 44 are formed in the semiconductor substrate 1 and the epitaxial silicon layer 21 in the region 102p by doping of impurities using the photoresist film 206 as a mask. When the N-well 43 is formed, ion-implantation of the phosphorus ion is performed from four directions inclined relative to the substrate normal direction with the acceleration energy at 360 keV and the dose amount at $7.5 \times 10^{12}$ cm$^{-2}$, for example. When the N-type impurity layer 44 is formed, ion-implantation of arsenic ion (As$^+$) is performed with the acceleration energy at 100 keV and the dose amount at $1.2 \times 10^{12}$ cm$^{-2}$, for example. Then, the photoresist film 206 is removed by asking, for example. The N-well 43 may be formed instead of a part of the N-well 16 which constitutes the double well by surrounding the P-well 14.

Then, as illustrated in FIGS. 23A to 23D, the silicon oxide film 22 is removed. The silicon oxide film 22 may be removed by wet etching using the hydrofluoric acid aqueous solution, for example. Thereafter, a silicon oxide film 51 is formed on the surface of the epitaxial silicon film 21. The silicon oxide film 51 may be formed by thermally oxidizing the surface of the epitaxial silicon layer 21 under the wet atmosphere, for example, and a thickness thereof is 7 nm, for example. At this time, a substrate temperature is 750° C., and a time period is 52 minutes.

Then, as illustrated in FIGS. 24A to 24D, a photoresist film 207 covering the region 102 and exposing the other regions such as the region 101, the region 103, and the region 104 is formed on the silicon oxide film 51. Thereafter, the silicon oxide film 51 is removed in the region 101, the region 103, and the region 104 by etching using the photoresist film 207 as a mask. The silicon oxide film 51 may be removed by the wet etching using the hydrofluoric acid aqueous solution, for example. Then, the photoresist film 207 is removed by asking, for example.

Then, as illustrated in FIGS. 25A to 25D, a gate insulating film 52 is formed at the surface of the epitaxial silicon layer 21 in each of the region 101, the region 103, and the region 104, and a gate insulating film 53 is formed by additional oxidation of the silicon oxide film 51 in the region 102. When the gate insulating film 52 and the gate insulating film 53 are formed, for example, wet oxidation under the reduced pressure by the ISSG oxidation method is performed, and heat treatment is performed in the nitrogen monoxide (NO) atmosphere at a temperature of 870° C. for 13 seconds. A thickness of the gate insulating film 52 is 2 nm, for example.

Then, as illustrated in FIGS. 26A to 26D, a gate electrode 54 is formed on the gate insulating film 52 in each of the region 101n and the region 101p, and a gate electrode 55 is formed on the gate insulating film 53 in each of the region 102n and the region 102p. When the gate electrode 54 and the gate electrode 55 are formed, a non-doped polycrystalline silicon film with a thickness of 100 nm is deposited on the gate insulating film 52 or the gate insulating film 53 by the reduced pressure CVD method, for example, and the polycrystalline silicon film is patterned by photolithography and dry-etching. When the polycrystalline silicon film is deposited, the substrate temperature is 605° C., for example.

Then, as illustrated in FIGS. 27A to 27D, an N-type impurity layer 61 is formed in the P-type impurity layer 42 in the region 102n, a P-type impurity layer 62 is formed in the N-type impurity layer 44 in the region 102p, an N-type impurity layer 63 is formed in the epitaxial silicon layer 21 in the region 101n, and a P-type impurity layer 64 is formed in the epitaxial silicon layer 21 in the region 101p. The N-type impurity layer 61 may be formed by photolithography and ion-implantation of the phosphorous ion, for example, and in this ion-implantation, for example, the acceleration energy is at 35 keV and the dose amount is at $1.0 \times 10^{13}$ cm$^{-2}$. The P-type impurity layer 62 may be formed by photolithography and ion-implantation of the boron ion, for example, and in this ion-implantation, for example, the acceleration energy is at 0.5 keV and the dose amount is at $1.8 \times 10^{14}$ cm$^{-2}$. The N-type impurity layer 63 may be formed by photolithography and ion-implantation of the arsenic ion, for example, and in this ion-implantation, for example, the acceleration energy is at 1.5 keV and the dose amount is at $9.0 \times 10^{14}$ cm$^{-2}$. The P-type impurity layer 64 may be formed by photolithography and ion-implantation of the arsenic ion, for example, and in this ion-implantation, for example, the acceleration energy is at 0.5 keV and the dose amount is at $3.2 \times 10^{14}$ cm$^{-2}$.

Then, as illustrated in FIGS. 28A to 28D, the sidewall insulating film 56 is formed on the side surface of each of the gate electrodes 54 and the side surface of each of the gate electrodes 55. When the sidewall insulating film 56 is formed, a silicon oxide film with a thickness of 74 nm is deposited by the reduced pressure CVD method at a substrate temperature of 520° C., and anisotropic etching is performed for this silicon oxide film, for example. In this anisotropic etching, the reactive ion etching (RIE) is performed, for example.

Then, as illustrated in FIGS. 29A to 29D, a photoresist film 208 exposing the region 101n, the region 102n, the region where the PN junction is to be formed in the region 103, and the region where the contact layer is to be formed in the region 104, and covering the other regions such as the region 101p and the region 102p is formed by photolithography. The alignment mark 2 is used for alignment of the photolithography. Thereafter, an N-type impurity layer 65 is formed in the N-type impurity layer 63, the P-type impurity layer 15 and the P-well 14 in the region 101n, an N-type impurity layer 66 is formed in the N-type impurity layer 61, the P-type impurity layer 42 and the P-well 41 in the region 102n, an N-type impurity layer 71 is formed in the epitaxial silicon layer 21, the P-type impurity layer 15, and the P-well 14 in the region 103, and an N-type impurity layer 72 is formed in the epitaxial silicon layer 21, the N-type impurity layer 17, and the N-well 16 in the region 104, by doping of impurities using the photoresist film 208 as a mask. When the N-type impurity layer 65, the N-type impurity layer 66, the N-type impurity layer 71, and the N-type impurity layer 72 are formed, ion-implantation of the phosphorus ion is performed with the acceleration energy at 8 keV and the dose amount at $1.2 \times 10^{16}$ cm$^{-2}$, for example. Then, the photoresist film 208 is removed by asking, for example.

Then, as illustrated in FIGS. 30A to 30D, a photoresist film 209 exposing the region 101p, the region 102p, and the region where the contact layer is to be formed in the region 103, and covering the other regions such as the region 101n, the region 102n, and the region 104 is formed by photolithography. The alignment mark 2 is used for alignment of the photolithography. Thereafter, a P-type impurity layer 67 is formed in the P-type impurity layer 64, the N-type impurity layer 17 and the N-well 16 in the region 101p, a P-type impurity layer 68 is formed in the P-type impurity layer 62, the N-type impurity layer 44 and the N-well 43 in the region 102p, and a P-type impurity layer 73 is formed in the epitaxial silicon layer 21, the N-type impurity layer 17 and the N-well 16 in the region 103, by doping of impurities using the photoresist film 209 as a mask. When the P-type impurity layer 67, the P-type impurity layer 68, and the P-type impurity layer 73 are formed, ion-implantation of the boron ion is performed with the acceleration energy at 4 keV and the dose amount at $6.0 \times 10^{15}$ cm$^{-2}$, for example. Then, the photoresist film 209 is removed by asking, for example.

Then, in an inert gas atmosphere, rapid thermal annealing (RTA) is performed at, for example, 1025° C., and thereby, activation of the doped impurities and the diffusion of the gate electrodes 54 or the gate electrodes 55 are performed. Thereafter, as illustrated in FIGS. 31A to 31D, a metal silicide film 81 is formed on the gate electrodes 54, the gate electrodes 55, the N-type impurity layer 65, the N-type impurity layer 66, the P-type impurity layer 67 and the P-type impurity layer 68, a metal silicide film 82c is formed on the N-type impurity layer 71, a metal silicide film 82a is formed on the P-type impurity layer 73, a metal silicide film 83c is formed on the N-type impurity layer 72, and a metal silicide film 83a is formed on the shallow part 13. A cobalt silicide film with a thickness of 15.5 nm, for example, is formed as the metal silicide film 81, the metal silicide film 82c, the metal silicide film 82a, the metal silicide film 83c, or the metal silicide film 83a. When the cobalt silicide film is formed, for example, an exposed part of the gate insulating film 52 or the gate insulating film 53 is removed, and a cobalt (Co) film with a thickness of 3.8 nm and a titanium nitride (TiN) film with a thickness of 3 nm are deposited. Then, a heat treatment is performed in a nitrogen atmosphere at 520° C. for 30 minutes, the titanium nitride film and the unreacted cobalt film are removed, and a heat treatment is performed in a nitrogen atmosphere at 700° C. for 30 minutes. The epitaxial silicon layer 21 on the shallow part 13 is taken into the metal silicide film 83a.

Then, as illustrated in FIGS. 32A to 32D, the interlayer insulating film 84 is formed on the semiconductor substrate 1, and a surface of the interlayer insulating film 84 is polished to be planarized by a CMP method, for example. Thereafter, the conductive plug 85, the conductive plug 86a, the conductive plug 86c, the conductive plug 87a, the conductive plug 87c, the wiring 88, the wiring 89a, the wiring 89c, the wiring 90a and the wiring 90c are formed in the interlayer insulating film 84. The conductive plug 85, the conductive plug 86a, the conductive plug 86c, the conductive plug 87a, the conductive plug 87c, the wiring 88, the wiring 89a, the wiring 89c, the wiring 90a, and the wiring 90c may be formed by a dual damascene method, for example.

It is thereby possible to manufacture the semiconductor device according to the third embodiment.

Characteristics of the embodiment, and characteristics of a case when the P-well 41 and the P-type impurity layer 42 are formed instead of the P-well 14 and the P-type impurity layer 15 in the region 103 are described. In general, it is desirable that a rising voltage of a forward current is low in an LRD used as a surge protection element, and the higher the concentration of the impurities in the semiconductor layer constituting the PN junction, the more it is desirable from the above-stated viewpoint.

When a semiconductor device including the DDC-NMOS transistor 111n and the high-voltage NMOS transistor 112n is manufactured, it is conceivable to form the PN junction of the LRD in addition to form the high-concentration impurity layer for source/drain and the impurity layer and the well in reverse conducting type which are in contact with the impurity layer in either of these transistors.

Figure 33:
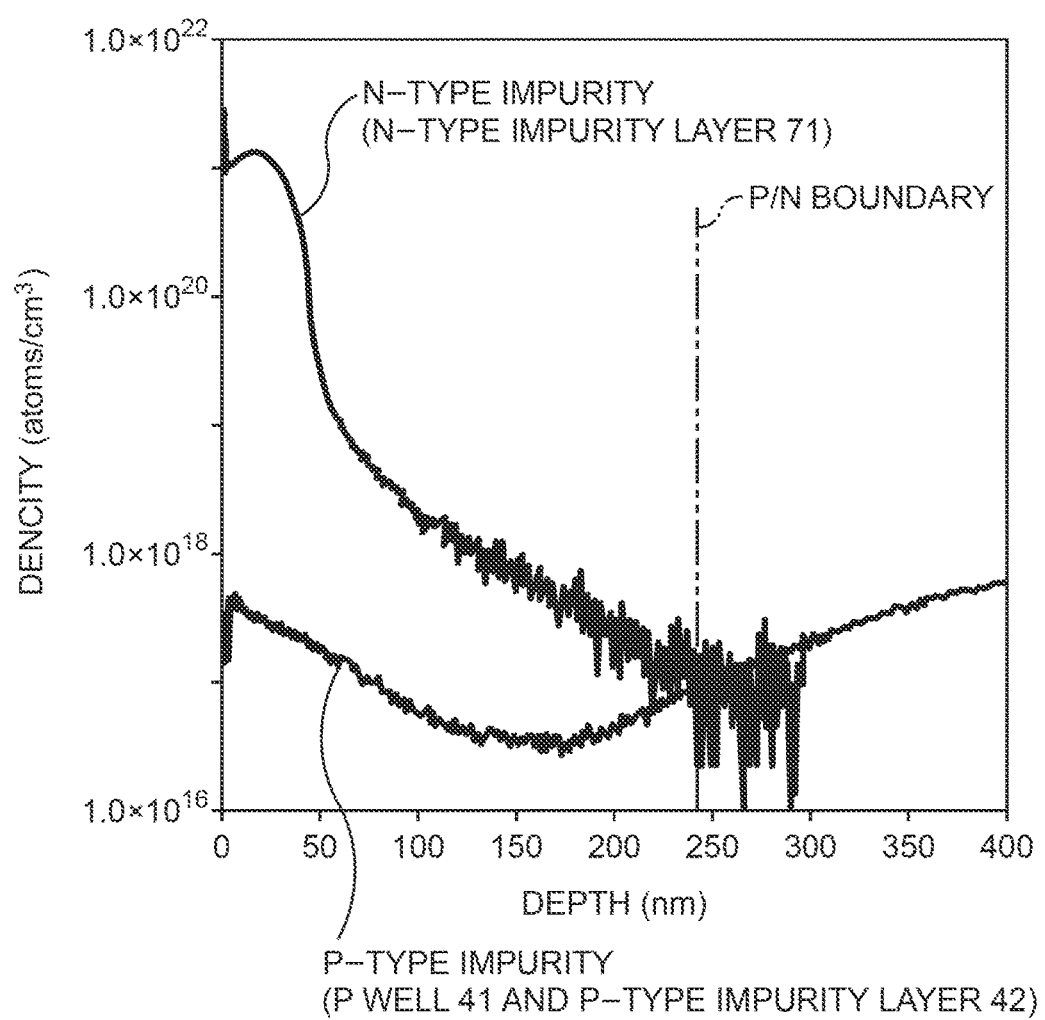
FIG. 33 is a chart illustrating a distribution of impurities in a reference example.

When the P-well 41 and the P-type impurity layer 42 are formed in the region 103 in addition to the P-well 41 and the P-type impurity layer 42 in the region 102n different from the embodiment, a distribution of impurities as illustrated in FIG. 33 is obtained. A horizontal axis in FIG. 33 represents a depth from a surface in the region 103, and a vertical axis represents measurement results of an impurity concentration by the secondary ion mass spectrometry (SIMS) method.

Figure 34:
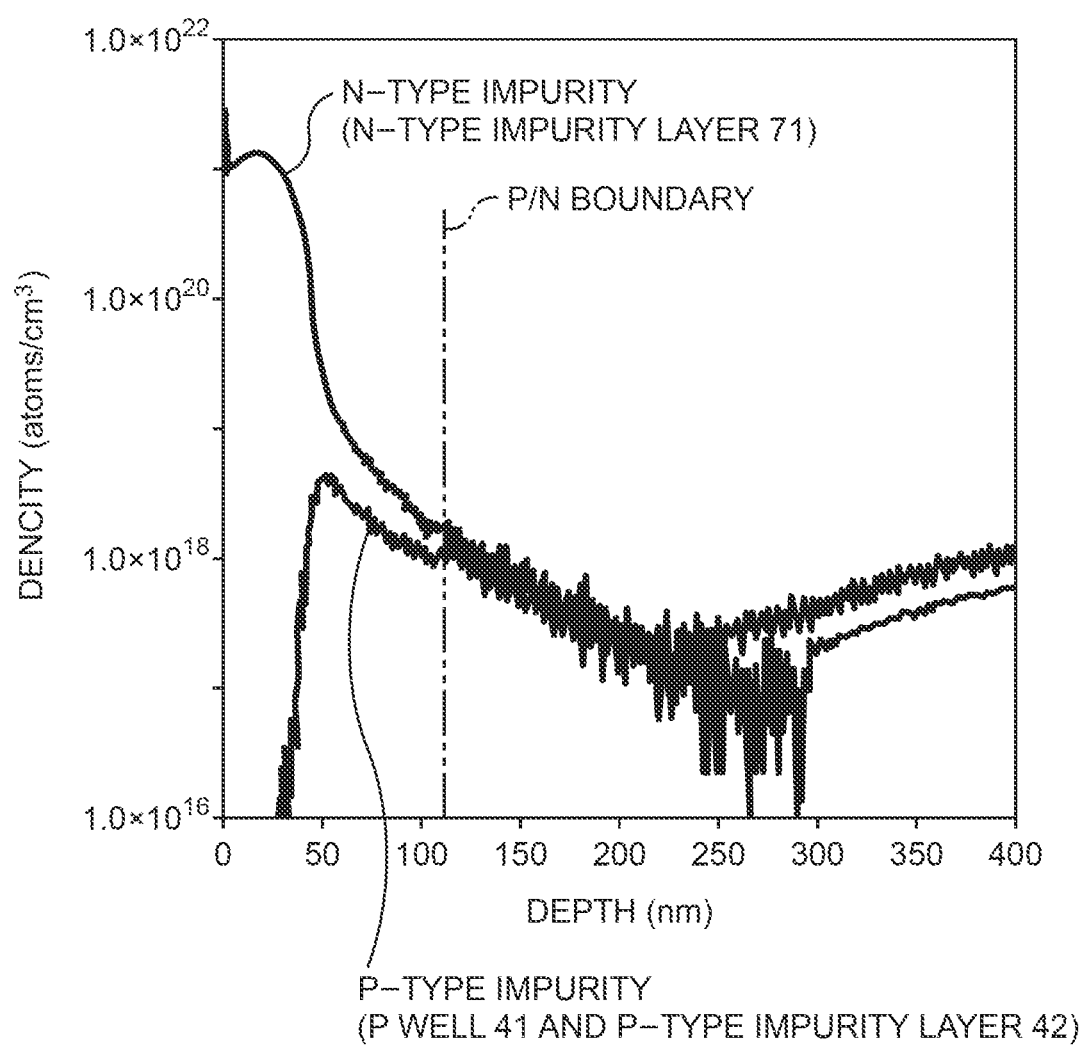
FIG. 34 is a chart illustrating a distribution of impurities in the third embodiment.

On the other hand, when the P-well 14 and the P-type impurity layer 15 are formed in the region 103 in addition to the P-well 14 and the P-type impurity layer 15 in the region 101n as the embodiment, a distribution of impurities as illustrated in FIG. 34 is obtained. A horizontal axis in FIG. 34 represents a depth from a surface in the region 103, and a vertical axis represents measurement results of an impurity concentration by the SIMS method.

As illustrated in FIG. 33, when the P-well 41 and the P-type impurity layer 42 are formed in the region 103, the PN junction is formed in a region where the impurity concentration is at approximately $1 \times 10^{17}$ cm$^{-2}$. On the other hand, when the P-well 14 and the P-type impurity layer 15 are formed as the embodiment, as illustrated in FIG. 34, the PN junction is formed in a region where the impurity concentration is at approximately over $1 \times 10^{18}$ cm$^{-2}$. Therefore, according to the embodiment, it is possible to suppress the rising voltage of the forward current to be low and to obtain the high surge protection ability compared to the case when the P-well 41 and the P-type impurity layer 42 are formed in the region 103.

Figure 35:
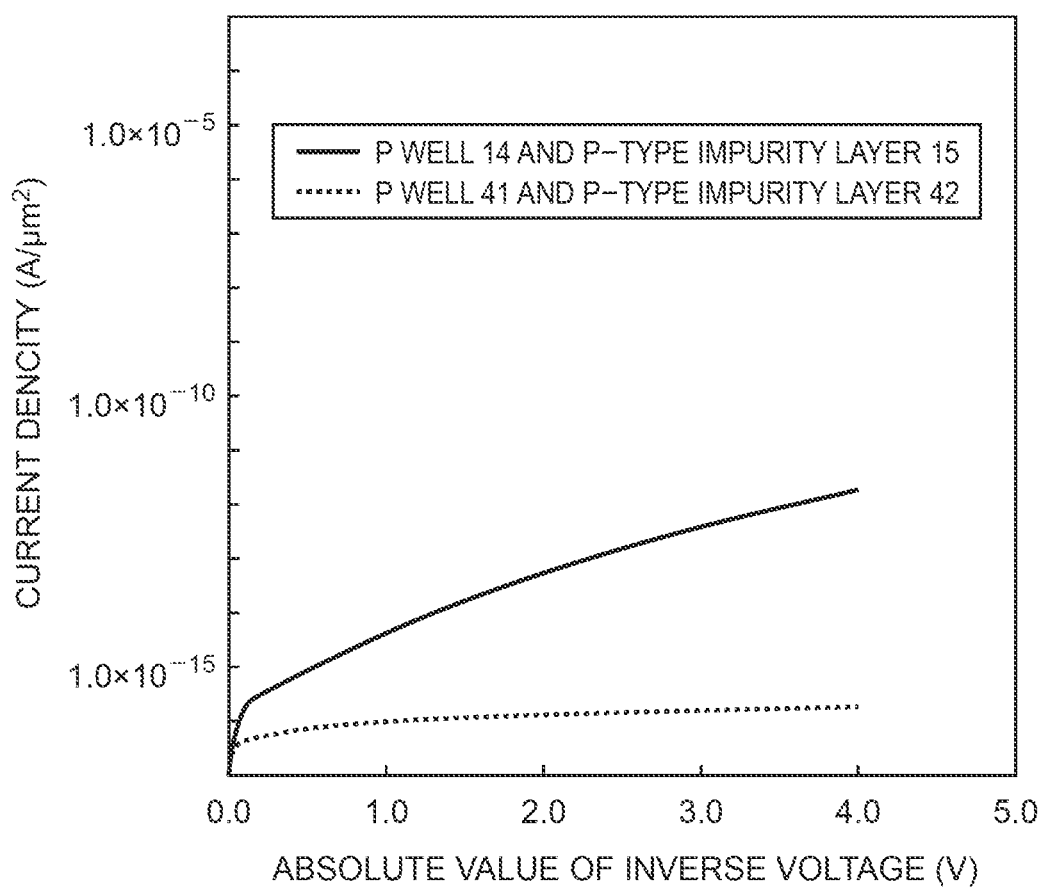
FIG. 35 is a view illustrating backward characteristics of an LRD.
Figure 36A:
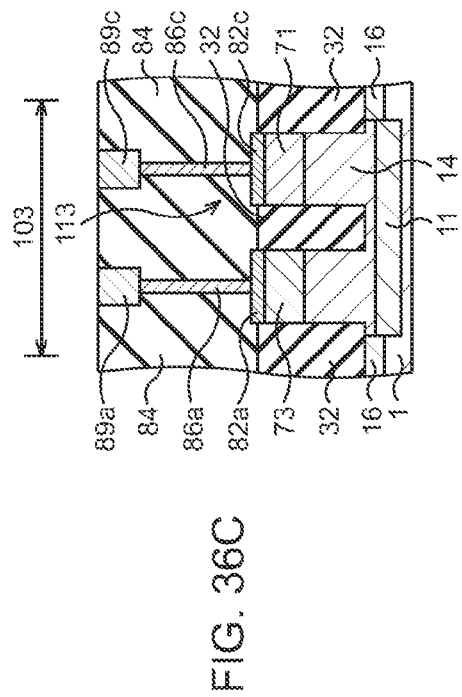
FIGS. 36A to 36D are sectional views illustrating a configuration of a semiconductor device according to a fourth embodiment.
Figure 36C:
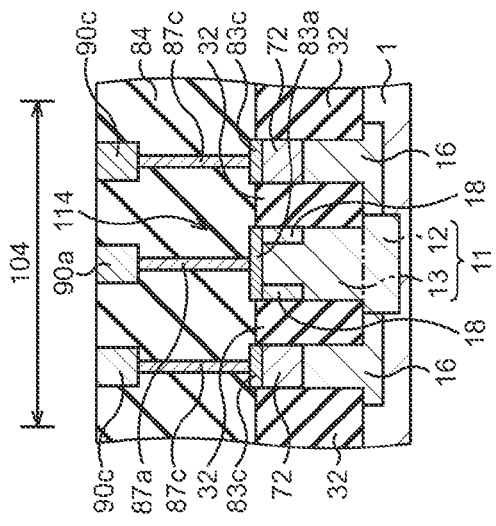
Figure 36B:
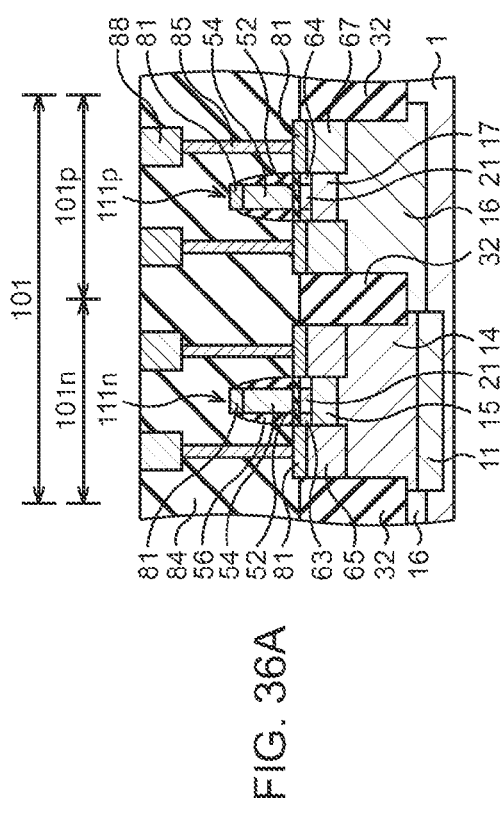
Figure 36D:
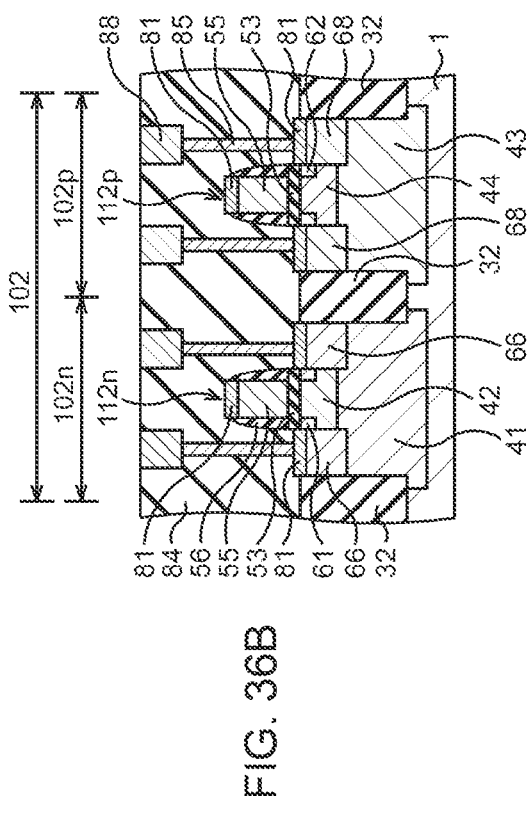
Figure 37A:
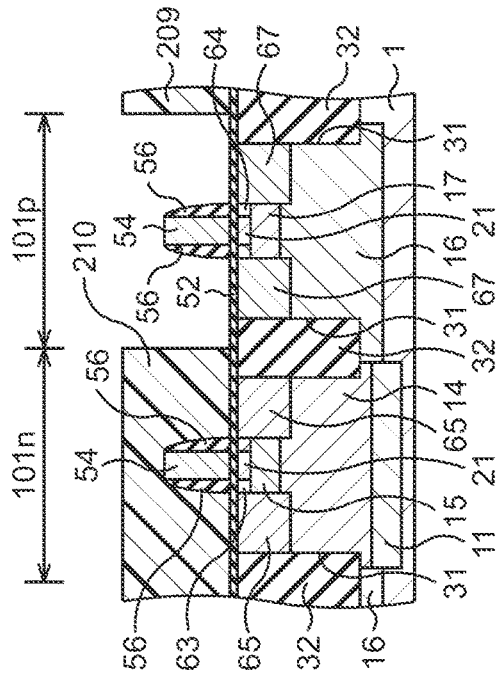
FIGS. 37A to 37D are sectional views illustrating a method of manufacturing the semiconductor device according to the fourth embodiment in process sequence.
Figure 37B:
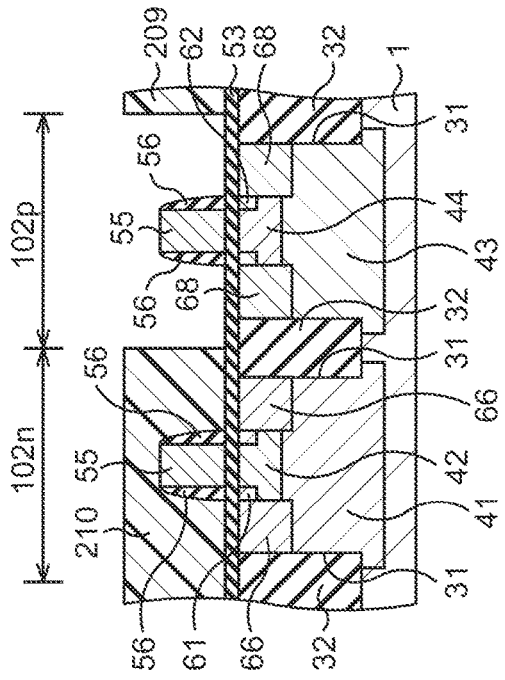
Figure 37C:
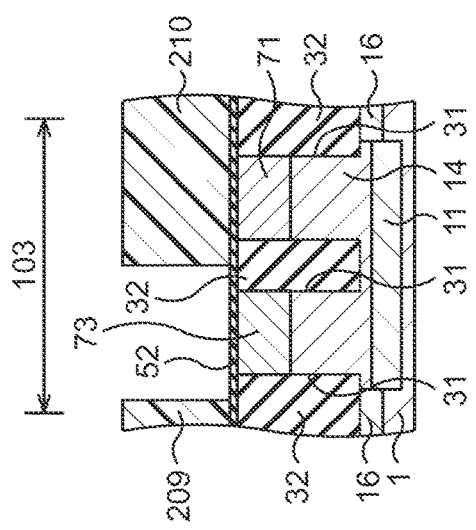
Figure 37D:
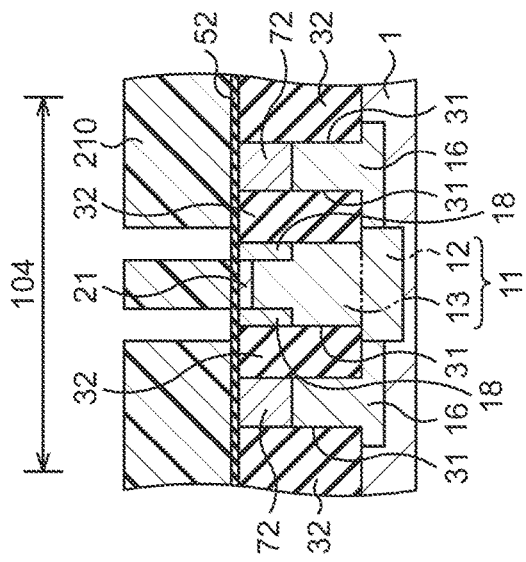
Figure 39A:
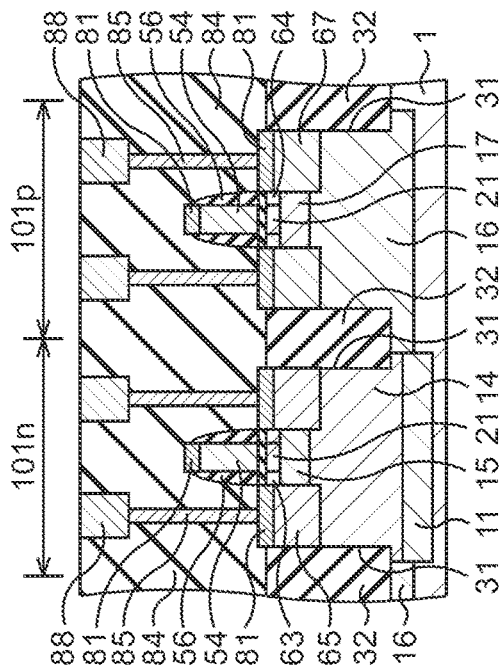
FIGS. 39A to 39D are sectional views illustrating a method of manufacturing the semiconductor device according to the fourth embodiment in process sequence.
Figure 39B:
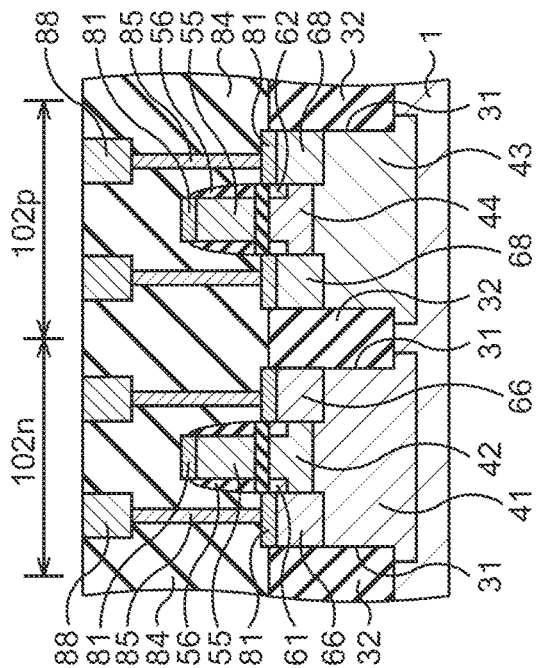
Figure 39C:
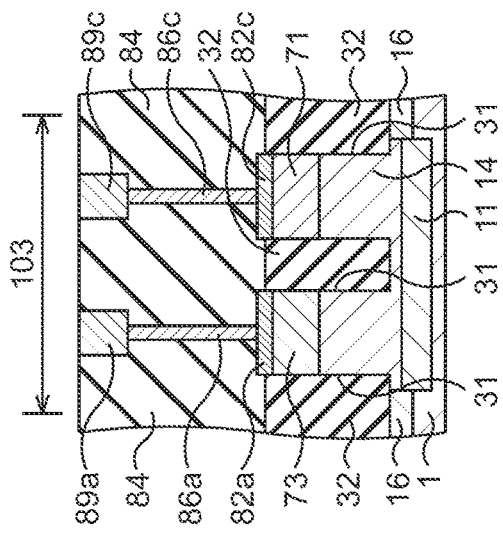
Figure 39D:
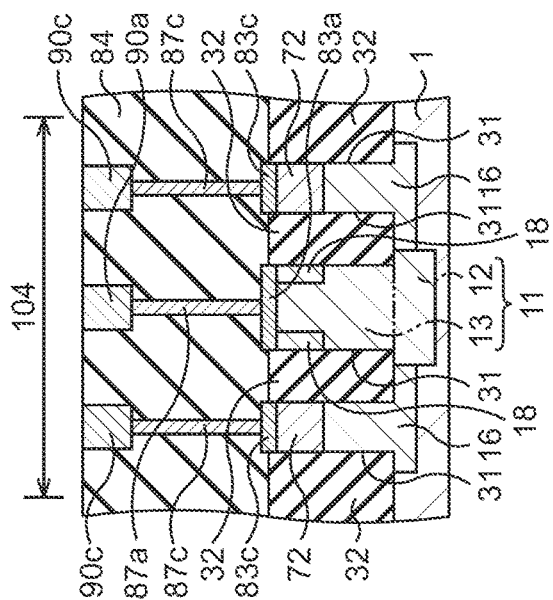

FIG. 35 is a view illustrating backward characteristics of an LRD, where a solid line in FIG. 35 represents the backward characteristics in the third embodiment, and a broken line represents the backward characteristics when the P-well 41 and the P-type impurity layer 42 are formed in the region 103 instead of the P-well 14 and the P-type impurity layer 15.

As illustrated in FIG. 35, when the P-well 41 and the P-type impurity layer 42 are formed, a voltage dependence of the backward current is very small, and the current is difficult to flow even if a very high voltage is applied. This means that when a high surge voltage is applied, it is difficult to be discharged. On the other hand, when the P-well 14 and the P-type impurity layer 15 are formed as the embodiment, the backward current largely depends on the voltage, and a breakdown voltage becomes low. This means that when the high surge voltage is applied, it can be rapidly discharged.

From these results, it is verified that in the embodiment, electric properties suitable for the PN junction diode for the surge protection element can be obtained such that the rising voltage of the forward current is low because the P-well 14 and the P-type impurity layer 15 are formed in the region 103 including the LRD 113.

Fourth Embodiment

Next, a fourth embodiment is described. The forth embodiment relates to a semiconductor device including a DDC transistor, a high-voltage transistor, an LRD and an SBD. FIGS. 36A to 36D are sectional views illustrating a configuration of the semiconductor device according to the fourth embodiment.

In the fourth embodiment, as illustrated in FIGS. 36A to 36D, a P-type impurity layer 18 whose planar shape is annular is formed at a surface of the shallow part 13 as a guard ring. Other configurations are similar to the third embodiment.

It is also possible to obtain the similar effect as the third embodiment according to the fourth embodiment. Also, it is possible to further reduce a backward current by relaxation of electric field concentration compared to the third embodiment. It is possible to suppress deterioration of a backward withstand voltage due to punch-through, though the P-type impurity layer 18 is formed and the concentration of the N-type impurity in the shallow part 13 is low.

Next, a method of manufacturing the semiconductor device according to the forth embodiment is described. FIGS. 37 to 39 are sectional views illustrating the method of manufacturing the semiconductor device according to the fourth embodiment in process sequence. FIGS. 37A to 39A each illustrate the region 101, FIGS. 37B to 39B each illustrate the region 102, FIGS. 37C to 39C each illustrate the region 103, and FIGS. 37D to 39D each illustrate the region 104.

First, processes up to the formations of the N-type impurity layer 65, the N-type impurity layer 66, the N-type impurity layer 71 and the N-type impurity layer 72 are performed as same as the third embodiment (FIG. 13 to FIG. 29). Then, as illustrated in FIGS. 37A to 37D, a photoresist film 210 exposing the region 101p, the region 102p, the region where the contact layer is to be formed in the region 103, and the region where the guard ring is to be formed in the region 104, and covering the other regions such as the region 101n and the region 102n is formed by photolithography. The alignment mark 2 is used for alignment of the photolithography. Thereafter, the P-type impurity layer 67 is formed in the region 101p, the P-type impurity layer 68 is formed in the region 102p, the P-type impurity layer 73 is formed in the region 103, and the P-type impurity layer 18 is formed in the epitaxial silicon layer 21 and the shallow part 13 in the region 104, by doping of impurities using the photoresist film 210 as a mask. When the P-type impurity layer 67, the P-type impurity layer 68, the P-type impurity layer 73, and the P-type impurity layer 18 are formed, ion-implantation of the boron ion is performed with the acceleration energy at 4 keV the dose amount at $6.0 \times 10^{15}$ $cm^{-2}$, for example. Then, the photoresist film 210 is removed by asking, for example.

Then, RTA is performed in an inert gas atmosphere at 1025° C., for example, to thereby perform the activation of the doped impurities and the diffusion of the gate electrodes 54 or the gate electrodes 55. Thereafter, as illustrated in FIGS. 38A to 38D, the metal silicide film 81, the metal silicide film 82c, the metal silicide film 82a, the metal silicide film 83c and the metal silicide film 83a are formed as same as the third embodiment.

Then, as illustrated in FIGS. 39A to 39D, the interlayer insulating film 84 is formed, the surface of the interlayer insulating film 84 is polished to be planarized, and the conductive plug 85, the conductive plug 86a, the conductive plug 86c, the conductive plug 87a, the conductive plug 87c, the wiring 88, the wiring 89a, the wiring 89c, the wiring 90a and the wiring 90c are formed as same as the third embodiment.

The semiconductor device according to the fourth embodiment can be manufactured as stated above.

In the third embodiment and the fourth embodiment, two kinds of DDC transistors are formed, but a DDC transistor whose threshold voltage is different and/or a DDC transistor whose operation voltage is different may further be formed. In this case, for example, the similar processes are repeated, or a predetermined well and an impurity layer to be a channel region are formed by adding only ion-implantation to control the threshold voltage.

According to the above-stated semiconductor devices and so on, a concentration profile of impurities in a first impurity region is proper, and therefore, it is possible to further reduce a backward current.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   an insulating film in a first region of a semiconductor substrate;
   a first impurity region of a first conductivity type and a second impurity region of the first conductivity type, each of the first impurity region and the second impurity region including a part located deeper than the insulating film, and the insulating film being sandwiched by the first impurity region and the second impurity region in planar view in the first region of the semiconductor substrate; and
   a metal silicide film on the first impurity region and in Schottky junction with the first impurity region,
   wherein
   the first impurity region contains a first impurity of the first conductivity type such that a peak of a concentration profile is deeper than a bottom of the insulating film,
   the second impurity region contains a second impurity of the first conductivity type, a concentration of the second impurity in the second impurity region being higher than a concentration of the first impurity in a part of the first impurity region shallower than the bottom of the insulating film, and
   the first impurity region and the second impurity region are in contact with each other at a position deeper than the bottom of the insulating film.

2. The semiconductor device according to claim 1, wherein a concentration of the first impurity in a part of the first impurity region deeper than the bottom of the insulating film is higher than the concentration of the second impurity in the second impurity region.

3. The semiconductor device according to claim 1, further comprising a third impurity region of a second conductivity type different from the first conductivity type, the third impurity region being locally formed between the first impurity region and the metal silicide film.

4. The semiconductor device according to claim 3, wherein the third impurity region is in contact with the insulating film.

5. The semiconductor device according to claim 1, further comprising:
   a gate electrode in a second region of the semiconductor substrate; and
   a fourth impurity region of the first conductivity type below the gate electrode,
   wherein a concentration profile of a third impurity of the first conductivity type in the fourth impurity region is substantially identical to a part of the concentration profile of the first impurity in the first impurity region.

6. The semiconductor device according to claim 1, further comprising:
   a fourth impurity region of the first conductivity type in a second region of the semiconductor substrate;
   a semiconductor layer on the fourth impurity region; and
   a gate electrode formed on the semiconductor layer in the second region.

7. A method of manufacturing a semiconductor device, comprising:
   forming a first impurity region of a first conductivity type in a first region of a semiconductor substrate;

forming a second impurity region of the first conductivity type in contact with the first impurity region in the first region of the semiconductor substrate;

forming an insulating film that separates a surface of the first impurity region and a surface of the second impurity region to be shallower than the first impurity region and the second impurity region, and such that the first impurity region and the second impurity region are in contact with each other at a position deeper than a bottom of the insulating film in the first region of the semiconductor substrate; and forming a metal silicide film on the first impurity region and in Schottky junction with the first impurity region, wherein a first impurity of the first conductivity type is doped such that a peak of a concentration profile is deeper than the bottom of the insulating film in the forming the first impurity region, and a second impurity of the first conductivity type is doped such that a concentration of the second impurity in the second impurity region is higher than a concentration of the first impurity in a part of the first impurity region shallower than the bottom of the insulating film.

8. The method according to claim 7, wherein a concentration of the first impurity in a part of the first impurity region deeper than the bottom of the insulating film is higher than the concentration of the second impurity in the second impurity region.

9. The method according to claim 7, further comprising locally forming a third impurity region of a second conductivity type different from the first conductivity type between the first impurity region and the metal silicide film.

10. The method according to claim 9, wherein the third impurity region is in contact with the insulating film.

11. The method according to claim 7, further comprising:
forming a fourth impurity region of the first conductivity type in a second region of the semiconductor substrate contemporaneously with a time period in which the first impurity region is formed; and
forming a gate electrode above the fourth impurity region of the semiconductor substrate,
wherein a concentration profile of a third impurity of the first conductivity type in the fourth impurity region is substantially identical to the concentration profile of the first impurity in the first impurity region.

12. The method according to claim 7, further comprising:
forming a fourth impurity region of the first conductivity type in a second region of the semiconductor substrate contemporaneously with a time period in which the first impurity region is formed;
forming a semiconductor layer on the semiconductor substrate after the forming the fourth impurity region and before the forming the insulating film; and
forming a gate electrode on the semiconductor layer in the second region of the semiconductor substrate.

13. The semiconductor device according to claim 1, wherein a part of the first impurity in the first impurity region and the second impurity region are in contact with each other at a position deeper than the bottom of the insulating film.

14. The semiconductor device according to claim 1, wherein a part of the first impurity in the first impurity region is located deepmost in the first impurity region.

15. The method according to claim 7, wherein a part of the first impurity in the first impurity region and the second impurity region are in contact with each other at a position deeper than the bottom of the insulating film.

16. The method according to claim 7, wherein a part of the first impurity in the first impurity region is located deepmost in the first impurity region.

* * * * *